(12) United States Patent
Lee

(10) Patent No.: US 9,093,547 B2
(45) Date of Patent: Jul. 28, 2015

(54) VERTICAL TYPE SEMICONDUCTOR DEVICES INCLUDING A METAL GATE AND METHODS OF FORMING THE SAME

(71) Applicant: Chang-Hyun Lee, Suwon-si (KR)

(72) Inventor: Chang-Hyun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/132,425

(22) Filed: Dec. 18, 2013

(65) Prior Publication Data
US 2014/0203346 A1     Jul. 24, 2014

(30) Foreign Application Priority Data

Jan. 18, 2013  (KR) .................. 10-2013-0005719

(51) Int. Cl.
| | |
|---|---|
| H01L 29/792 | (2006.01) |
| H01L 29/49 | (2006.01) |
| H01L 27/115 | (2006.01) |
| H01L 29/66 | (2006.01) |

(52) U.S. Cl.
CPC ...... *H01L 29/7926* (2013.01); *H01L 27/11565* (2013.01); *H01L 27/11582* (2013.01); *H01L 29/4958* (2013.01); *H01L 29/66833* (2013.01)

(58) Field of Classification Search
CPC .................. H01L 29/4958; H01L 29/7926
USPC ........................................... 257/324
See application file for complete search history.

(56) References Cited

U.S. PATENT DOCUMENTS

| | | | |
|---|---|---|---|
| 7,696,559 | B2 | 4/2010 | Arai et al. |
| 7,867,833 | B2 | 1/2011 | Kim |
| 8,008,114 | B2 | 8/2011 | Lung et al. |
| 2009/0173981 | A1 | 7/2009 | Nitta |
| 2012/0049288 | A1 | 3/2012 | Maruyama et al. |
| 2012/0052674 | A1 | 3/2012 | Lee et al. |

FOREIGN PATENT DOCUMENTS

KR      1020050067710       7/2005

*Primary Examiner* — David S Blum
(74) *Attorney, Agent, or Firm* — Myers Bigel Sibley & Sajovec, P.A.

(57) ABSTRACT

Vertical type semiconductor devices including a metal gate and methods of forming the vertical type semiconductor devices are provided. The vertical type semiconductor devices may include a channel pattern. The vertical type semiconductor devices may also include first and second gate patterns sequentially stacked on a sidewall of the channel pattern. The first and second gate pattern may include first and second metal elements, respectively and the second gate pattern may have a resistance lower than a resistance of the first gate pattern.

18 Claims, 43 Drawing Sheets

VERTICAL TYPE SEMICONDUCTOR DEVICES INCLUDING A METAL GATE AND METHODS OF FORMING THE SAME

CROSS-REFERENCE TO RELATED APPLICATION

This U.S. non-provisional patent application claims priority under 35 U.S.C §119 to Korean Patent Application No. 10-2013-0005719, filed on Jan. 18, 2013, in the Korean Intellectual Property Office, the disclosure of which is hereby incorporated by reference herein its entirety.

BACKGROUND

Recently, vertical type semiconductor devices including vertically arranged memory cells in three dimensions have been suggested to fabricate more highly integrated semiconductor devices. The vertical type semiconductor devices may have a stacked structure of memory cells in a vertical direction. As a number of the memory cells stacked increases, manufacturing processes for the stacked memory cells may be complicated.

SUMMARY

Some embodiments of the present inventive concept provide vertical type semiconductor devices, which may show improved performance and may be manufactured using methods that may decrease manufacturing defects.

A vertical type semiconductor device may include a channel pattern extending in a first direction that is perpendicular to an upper surface of a substrate and a tunnel insulating layer, a charge storing layer and a blocking dielectric layer sequentially stacked on a sidewall of the channel pattern. The device may also include a first gate pattern stacked on the blocking dielectric layer and a second gate pattern stacked on the first gate pattern. In various embodiments, the first gate pattern may include a first metal and having a first resistance and the second gate pattern may include a second metal and having a second resistance lower than the first resistance.

According to various embodiments, the device may further include a third gate pattern including an impurity doped polysilicon between the first and second gate patterns.

According to various embodiments, the first gate pattern may include titanium, tantalum, ruthenium or tungsten, or may include a material including at least one product obtained from a reaction of the metal element with oxygen, carbon and/or nitrogen.

In various embodiments, the second gate pattern may include tungsten, tungsten silicide, cobalt, cobalt silicide, nickel or nickel silicide.

According to various embodiments, the first gate pattern has a first line width in the first direction and the second gate pattern may have a second line width in the first direction that is greater than the first line width.

In various embodiments, the first gate pattern may be one of a plurality of first gate patterns and the second gate pattern may be one of a plurality of second gate patterns, and the device further may include a plurality of gate structures on a sidewall of the channel pattern arranged in the first direction and a plurality of insulating layer patterns between two adjacent ones of the plurality of gate structures. Ones of the plurality of gate structures may include respective ones of the plurality of first gate patterns and respective ones of the plurality of second gate patterns.

In various embodiments, the channel pattern may be one of a plurality of the channel patterns and ones of the plurality of the gate structures may have a line shape extending in a second direction perpendicular to the first direction and surrounding ones of the plurality of channel patterns.

According to various embodiments, ones of the plurality of second gate patterns may include at least two second gate patterns, and ones of which may be disposed adjacent respective edge portions of ones of the plurality of gate structures in a third direction that is perpendicular to the second direction.

According to various embodiments, ones of the plurality of first gate patterns may have a hollow shape, when viewed from a plan perspective, surrounding respective ones of the plurality of channel patterns.

In various embodiments, ones of the plurality of first gate patterns may surround at least two of the plurality of the channel patterns while filling a space between the at least two of the plurality of the channel patterns.

According to various embodiments, the tunnel insulating layer may have a first dielectric constant and the blocking dielectric layer may include a metal oxide having a second dielectric constant higher than the first dielectric constant.

In various embodiments, the first gate pattern may contact the blocking dielectric layer.

In various embodiments, a stacked structure of the channel pattern, the tunnel insulating layer and the charge storing layer may form a pillar shape.

In various embodiments, the blocking dielectric layer may extend on an upper surface, a lower surface and a sidewall of the first gate pattern.

According to various embodiments, a stacked structure of the channel pattern, the tunnel insulating layer, the charge storing layer and the blocking dielectric layer may form a pillar shape.

A vertical integrated circuit device may include a channel pattern extending in a first direction on a substrate. The device may also include a first electrode pattern enclosing the channel pattern and a second electrode pattern on and electrically connected to the first electrode pattern. In various embodiments, the first electrode pattern may include a first metal and may have a first resistance and the second electrode pattern may include a second metal and may have a second resistance lower than the first resistance.

According to various embodiments, the device may further include a third electrode pattern between the first and second electrode patterns and the third electrode pattern may include doped silicon.

In various embodiments, the channel pattern may be one of a plurality of channel patterns arranged in a second direction perpendicular to the first direction, the first electrode pattern may be one of a plurality of first electrode patterns enclosing respective ones of the plurality of channel patterns and the third electrode pattern may contact at least two of the plurality of first electrode patterns.

In various embodiments, the second electrode pattern may extend in the second direction and may overlap the at least two of the plurality of first electrode patterns.

According to various embodiments, the channel pattern may be one of a plurality of channel patterns arranged in a second direction perpendicular to the first direction and the second electrode pattern may extend in the second direction and may overlap at least two of the plurality of channel patterns.

As described above, vertical type semiconductor devices according to some embodiments of the present inventive concept may show improved performance by including metal in a gate structure. In addition, methods of forming the vertical type semiconductor devices according to some embodiments of the present inventive concept may decrease manufacturing defects that may occur in manufacturing processes.

DETAILED DESCRIPTION

Figure 1:
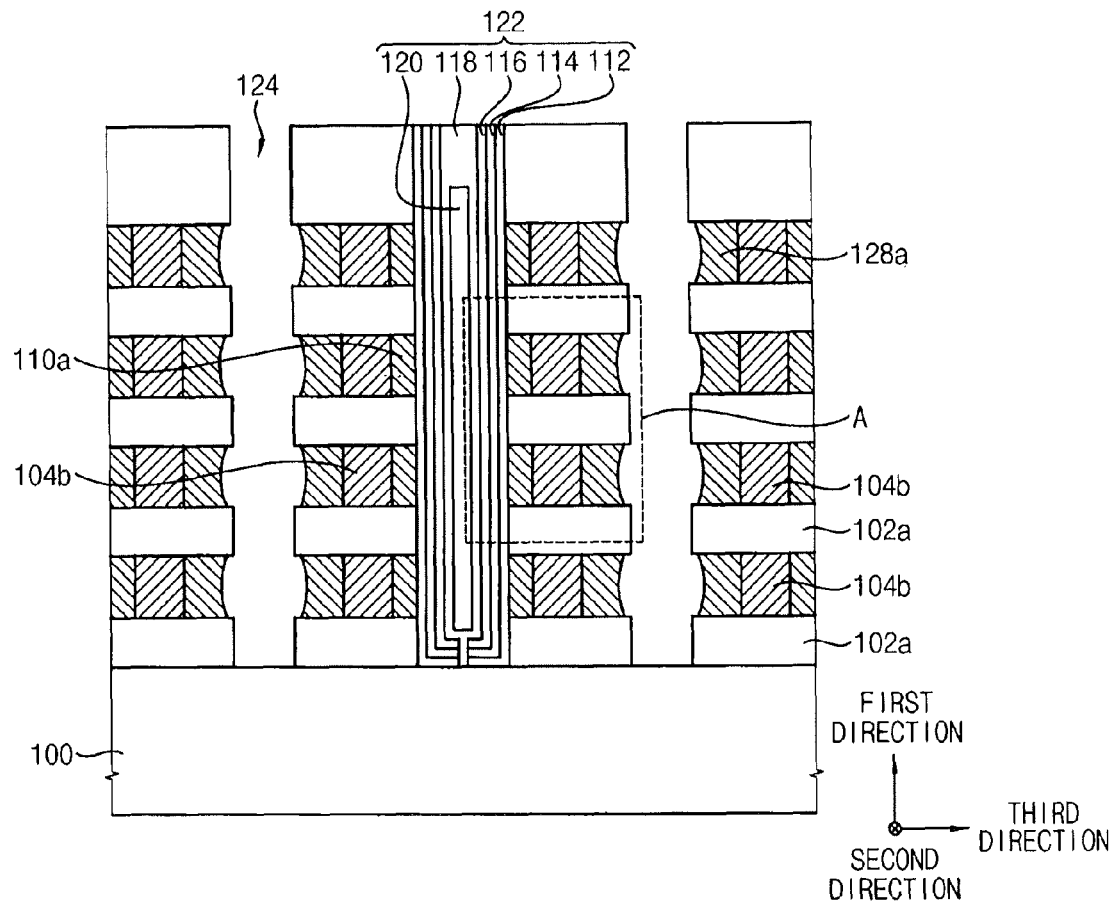
FIG. 1 is a cross-sectional view illustrating a vertical type semiconductor device according to some embodiments of the present inventive concept.

Various example embodiments will be described with reference to the accompanying drawings. Many different forms and embodiments are possible without deviating from the spirit and teachings of this disclosure and so the disclosure should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity. Like reference numbers refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

Figure 2:
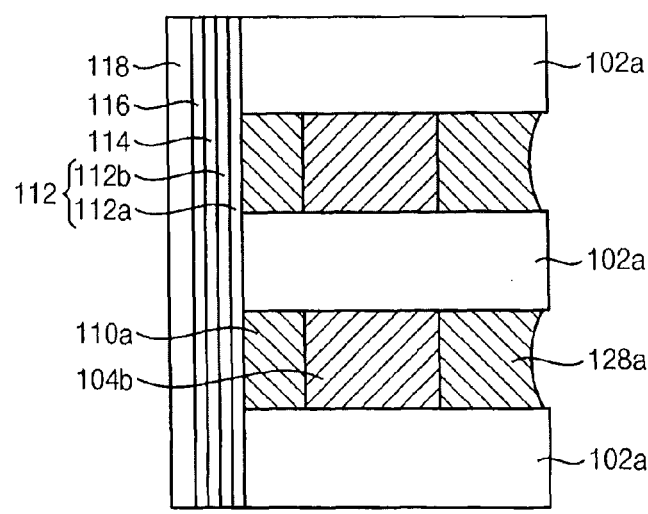
FIG. 2 is a cross-sectional view illustrating a portion A of the vertical type semiconductor device in FIG. 1.
Figure 3:
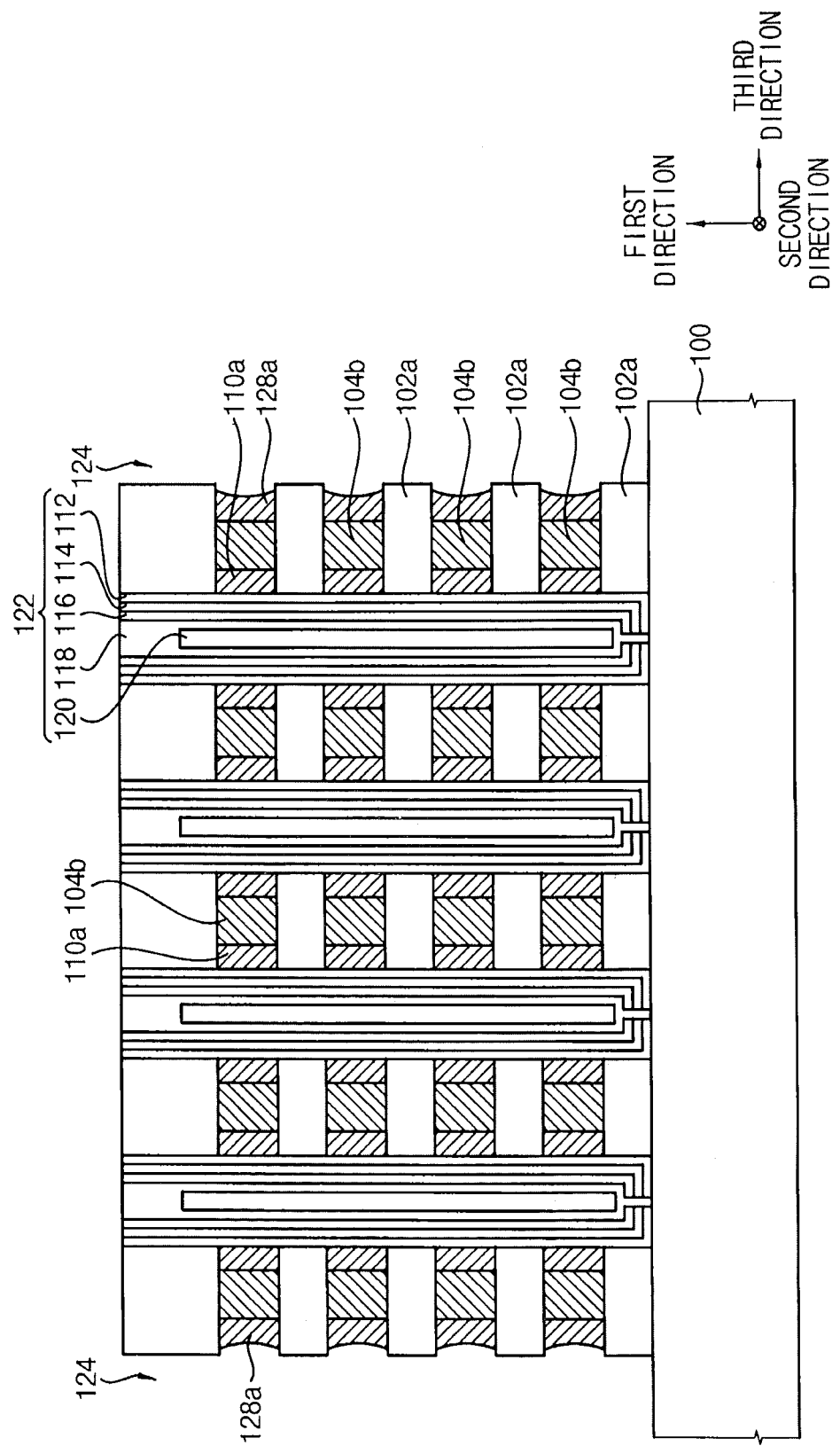
FIG. 3 is a cross-sectional view illustrating a vertical type semiconductor device according to some embodiments of the present inventive concept.
Figure 4:
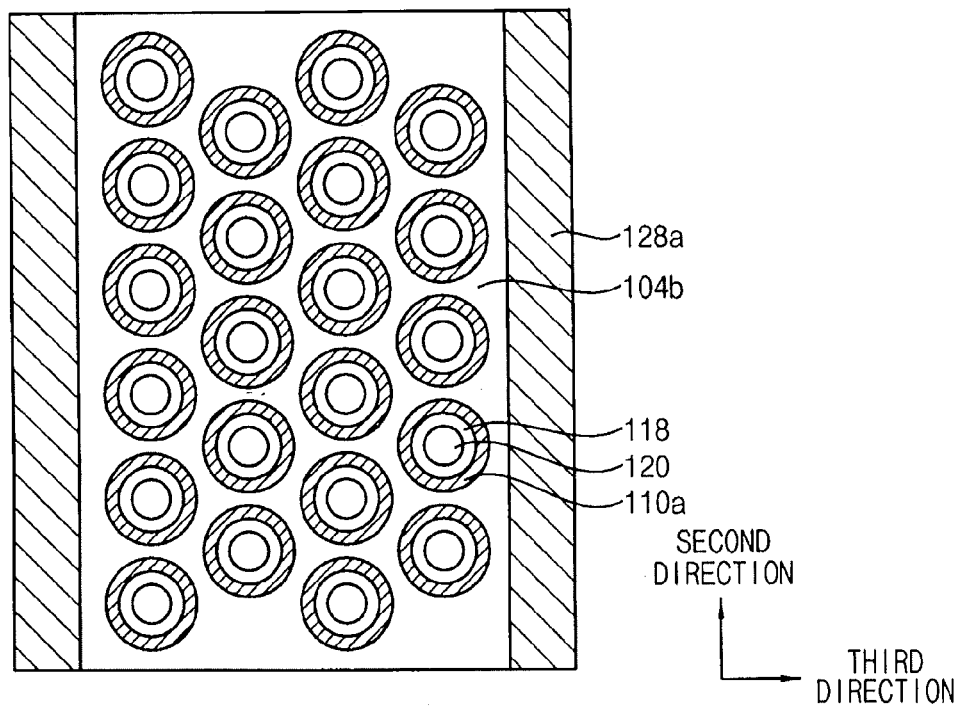
FIG. 4 is a plan view of the vertical type semiconductor device illustrated in FIG. 3.

FIG. 1 is a cross-sectional view illustrating a vertical type semiconductor device according to some embodiments of the present inventive concept. FIG. 2 is a cross-sectional view illustrating a portion A of the vertical type semiconductor device in FIG. 1. FIG. 3 is a cross-sectional view illustrating a vertical type semiconductor device according to some embodiments of the present inventive concept. FIG. 4 is a plan view of the vertical type semiconductor device illustrated in FIG. 3.

FIG. 1 illustrates a vertical type semiconductor device having a shape in which one word line structure surrounds one row of pillar structures in a third direction. FIGS. 3 and 4 illustrate a vertical type semiconductor device having a shape in which one word line structure surrounds four rows of pillar structures arranged in the third direction. The vertical type semiconductor devices illustrated in FIGS. 1 and 3 may include the cell illustrated in FIG. 2.

Hereinafter, a direction perpendicular to an upper surface of a substrate may be defined as a first direction, and two directions parallel to the upper surface of the substrate and perpendicular to each other may be defined as second and third directions. The second direction may be a direction that a word line extends. In addition, the directions designated by the arrows in the drawings and the reverse directions thereof may be considered as the same direction. The above-mentioned definition on the directions may be the same throughout the drawings.

Referring to FIGS. 1 and 2, a channel pattern 118 extending from a substrate 100 in the first direction may be provided on the substrate 100. The channel pattern 118 may include a semiconductor material provided as a channel region. The channel pattern 118 may include, for example, polysilicon, amorphous silicon, or single crystalline silicon.

The channel pattern 118 may include a cylinder type channel pattern of which inner portion may be filled up with something, or a hollow cylindrical type channel pattern (for example, a macaroni type channel pattern). When the channel pattern 118 is the macaroni type, the inner portion of the channel pattern 118 may be filled up with an insulating material 120.

The channel pattern 118 may include a first channel portion and a second channel portion. The first channel portion may be provided on the surface of the substrate, and the inside of the first channel portion may be filled up with the semiconductor material. The second channel portion may be provided on the first channel portion, and the second channel portion may have a hollow cylinder shape.

On the outer side wall of the channel pattern 118, a tunnel oxide layer 116, a charge storing layer 114, and a blocking dielectric layer 112 may be stacked one by one in a side direction parallel to the upper surface of the substrate 100. That is, the stacked structure of the tunnel oxide layer 116, the charge storing layer 114 and the blocking dielectric layer 112 may have a shape surrounding the outer side wall of the channel pattern 118. The channel pattern 118, the tunnel oxide layer 116, the charge storing layer 114 and the blocking dielectric layer 112 may become one pillar structure 122.

The tunnel oxide layer 116 may include silicon oxide. The charge storing layer 114 may include silicon nitride. The blocking dielectric layer 112 may include an insulating material having a dielectric constant higher than a dielectric constant of the tunnel oxide layer 116. The blocking dielectric layer 112 may include a metal oxide having a high dielectric constant. The blocking dielectric layer 112 may have a structure of one material or a stacked structure of two or more materials. When the blocking dielectric layer 112 has a stacked structure of two or more materials, the uppermost blocking dielectric layer 112 may be a metal oxide having a high dielectric constant. That is, a portion directly contacting a gate pattern among the blocking dielectric layer 112 may be the metal oxide having a high dielectric constant. In some embodiments, as illustrated in FIG. 2, the blocking dielectric layer 112 may have a stacked structure of a silicon oxide layer 112b and a metal oxide layer 112a.

Examples of metal oxides included in the metal oxide layer 112a that may be used for the blocking dielectric layer 112 may include aluminum oxide, hafnium oxide, lanthanum oxide, lanthanum aluminum oxide, lanthanum hafnium oxide, hafnium aluminum oxide, titanium oxide, tantalum oxide, zirconium oxide, etc. These compounds may be used alone or as a stacked structure of two or more.

The pillar structures 122 may be arranged in regular in the second and third directions. Thus, the pillar structures 122 may form an array structure.

A gate structure surrounding the pillar structures 122 while having an extended shape may be provided. A plurality of gate structures may be provided on the side of one pillar structure 122. The plurality of the gate structures may be spaced apart from each other in the first direction while having a stacked shape. Each of the plurality of gate structures may have a line shape extended in the second direction while surrounding the pillar structures 122.

Each of the plurality of gate structures may have a shape surrounding the pillar structures 122 arranged in parallel in the second direction. In addition, one of the gate structures may have a shape surrounding at least one pillar structure 122 in the third direction. In some embodiments, one gate structure may surround one pillar structure 122 in the third direction as illustrated in FIG. 1.

Between two adjacent gate structures spaced apart from each other in the first direction, first insulating layer patterns 102a may be provided. Because of the first insulating layer patterns 102a, the gate structures stacked in the first direction may be insulated from each other. The alternately stacked gate structures and insulating layer patterns 102a may be provided as one stacked structure.

The gate structure may be provided as the gate electrode of a selection transistor or the gate electrode of a cell transistor. In addition, the gate structure may be provided as a word line. The gate structure may have a stacked structure of first to third gate patterns 110a, 104b and 128a from the side of the pillar structure 122.

The first gate pattern 110a may have a shape directly contacting the surface of the blocking dielectric layer 112 formed on the outer side wall of the pillar structure 122. As illustrated in FIG. 4, the first gate pattern 110a may have a hollow shape surrounding the outer side wall of the pillar structure 122.

The blocking dielectric layer 112 directly contacting the first gate pattern 110a may include a metal oxide having a high dielectric constant. As described above, the first gate pattern 110a directly contacting the metal oxide may include a metal.

The metal used for forming the first gate pattern 110a may have a higher melting point than a metal used for forming the third gate pattern 128a. The first gate pattern 110a may include a metal element such as titanium, tantalum, ruthenium, or tungsten. In some embodiments, the first gate pattern 110a may include a material obtained through a reaction of the metal element with oxygen, carbon or nitrogen. Examples of the materials that may be used for the first gate pattern 110a may include titanium, titanium nitride, tantalum, tantalum nitride, ruthenium, ruthenium oxide, tungsten, and tungsten nitride. These materials may be used alone or as a stacked structure of two or more.

The second gate pattern 104b may include a first conductive material, and the first conductive material may include silicon or a metal material. Materials that may be used for the second gate pattern 104b may include p-type or n-type doped silicon, or carbon doped polysilicon.

The third gate pattern 128a may include a second conductive material having a lower resistance than the first conductive material in the second gate pattern 104b. The third gate pattern 128a may include a material such as metal or, metal silicide. Examples of the materials that may be used for the third gate pattern 128a may include tungsten, tungsten silicide, cobalt, cobalt silicide, nickel, and nickel silicide. These compounds may be used alone or as a stacked structure of two or more. Since the third gate pattern 128a may have a low resistance, the resistance of word lines may be low.

In some embodiments, the third gate pattern 128a may be formed by using the same material as the first conductive material. In this case, the gate structure may include the first and second gate patterns 110a and 104b.

Hereinafter, a structure in which the gate structure surrounds the plurality of the pillar structures 122 in the third direction will be explained with reference to FIGS. 3 and 4. Referring to FIGS. 3 and 4, the pillar structures 122 may be arranged in regular in the second and third directions. One gate structure may surround four pillar structures 122 in the third direction. In this case, the first gate pattern 110a may have a shape surrounding each of the pillar structures. The second gate pattern 104a may have a shape filling up a gap between the pillar structures.

The third gate patterns 128a may be positioned at both edge portions of the gate structure in the third direction. Thus, the third gate pattern 128a may have an extended shape in the second direction. That is, among the pillar structures surrounded by the gate structure, a pillar structure not including the third gate pattern 128a may be provided between the pillar structures positioned inside.

Figure 5:
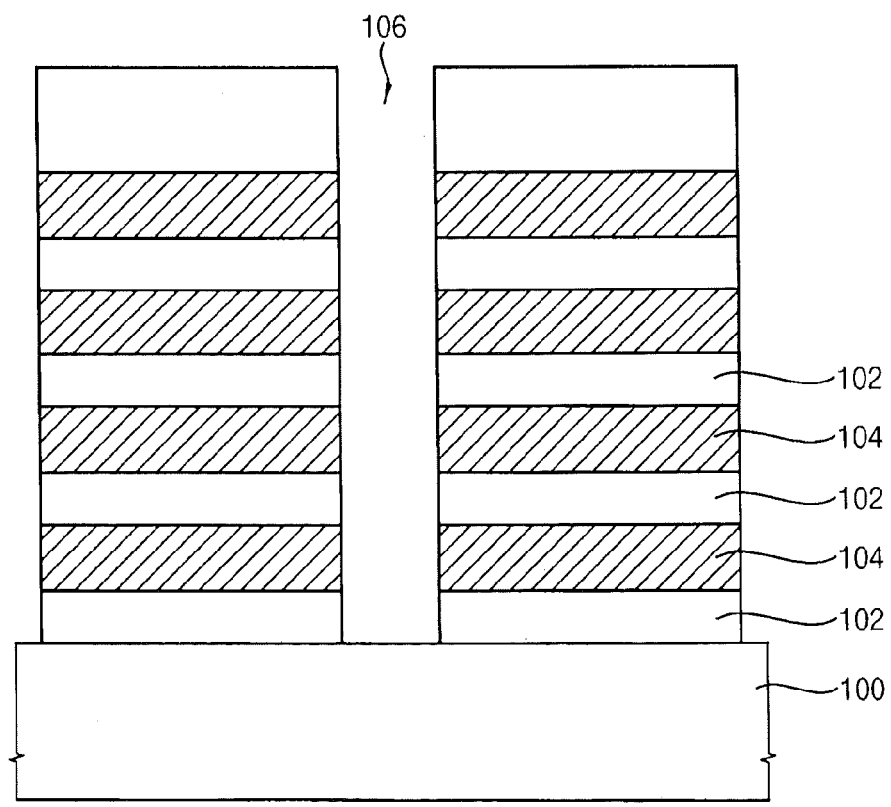
FIGS. 5 to 12 are cross-sectional views illustrating intermediate structures provided in operations of forming the vertical type semiconductor device illustrated in FIG. 1 according to some embodiments of the present inventive concept.

FIGS. 5 to 12 are cross-sectional views illustrating intermediate structures provided in operations of forming the vertical type semiconductor device illustrated in FIG. 1 according to some embodiments of the present inventive concept. Referring to FIG. 5, first insulating layers 102 and first conductive layers 104 may be alternately and repeatedly stacked on a substrate 100 to form a stacked structure. At the uppermost part of the stacked structure, the first insulating layer 102 may be formed.

The substrate 100 may include a semiconductor material such as silicon, germanium.

In some embodiments, the first insulating layers 102 and the first conductive layers 104 may be formed by a chemical vapor deposition (CVD) process, a plasma enhanced chemical vapor deposition (PECVD) process, or an atomic layer deposition (ALD) process. The first conductive layer 104 may include a material that can be easily etched by an etching process. In addition, the first conductive layer 104 may be formed by using a material having a high etching selectivity with respect to the first insulating layer 102. The first conductive layer 104 may be a layer for forming a second gate pattern included in a gate structure.

Materials that may be used as the first conductive layer 104 may include p-type or n-type doped polysilicon, or carbon doped polysilicon.

Gate structures may be formed in spaces where the first conductive layers are formed through subsequent processes. Thus, a number of the first insulating layers 102 and the first conductive layers 104 stacked may be determined according to a number of selection transistors and cell transistors.

The first insulating layers 102 and the first conductive layers 104 may be partially etched to form a plurality of holes 106 exposing the upper surface of the substrate 100 through the first insulating layers 102 and the first conductive layers 104. The plurality of the holes 106 may be arranged in regular in the second and third directions to form an array shape.

Figure 6:
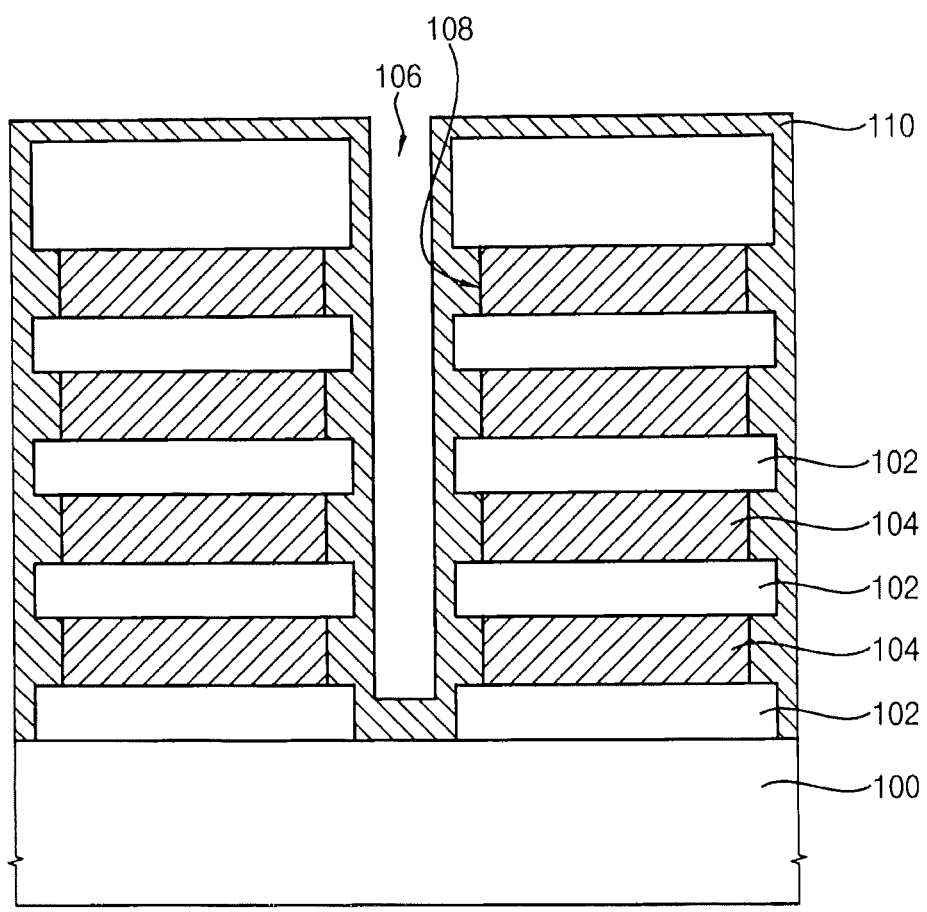

Referring to FIG. 6, the first conductive layers 104 exposed by the side wall of the holes 106 may be partially etched to form first recessed portions 108 in each the first conductive layers 104. Thus, the first recessed portions 108 may be included in the side wall of the holes 106.

Through performing subsequent processes, a first gate pattern 110a may be formed in the first recessed portion 108. Thus, the depth of the first recessed portion 108 recessed into the side direction may be the same as the height of the first gate pattern 110a to be formed in the side direction.

Then, a second conductive layer 110 may be formed along the inner portion of the first recessed portion 108, the side wall and the bottom portion of the holes 106 and the upper surface of the uppermost first insulating layer 102. The second conductive layer 110 may include a metal material. The second conductive layer 110 may be a layer for forming a first gate pattern 110a included in a gate structure.

The second conductive layer 110 may include a metal element such as titanium, tantalum, ruthenium, or tungsten. In addition, the second conductive layer 110 may include a product obtained from the reaction of the metal element with oxygen, carbon or nitrogen. Examples of the second conductive layer 110 may include titanium, titanium nitride, tantalum, tantalum nitride, ruthenium, ruthenium oxide, tungsten, or tungsten nitride. These compounds may be used alone or as a stacked structure of two or more.

Figure 7:
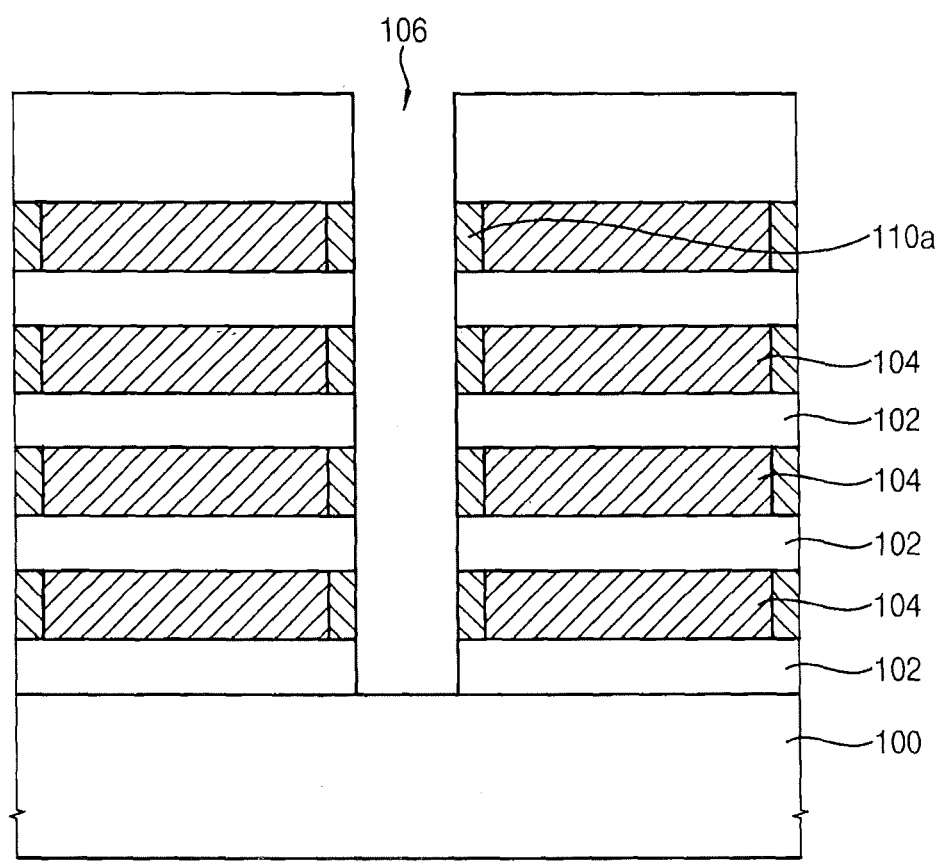

Referring to FIG. 7, the second conductive layer 110 may be partially etched to remain the second conductive layer 110 in the first recessed portion 108. By the etching process, the second conductive layer 110 formed on the side wall and the upper surface of the first insulating layer 102 and on the surface of the substrate 100 may be removed. Thus, a first gate pattern 110a may be formed in the recessed portion 108. Through performing the above-mentioned processes, the first gate pattern 110a and the first insulating layer 102 may be exposed by the side wall of the holes 106.

Figure 8:
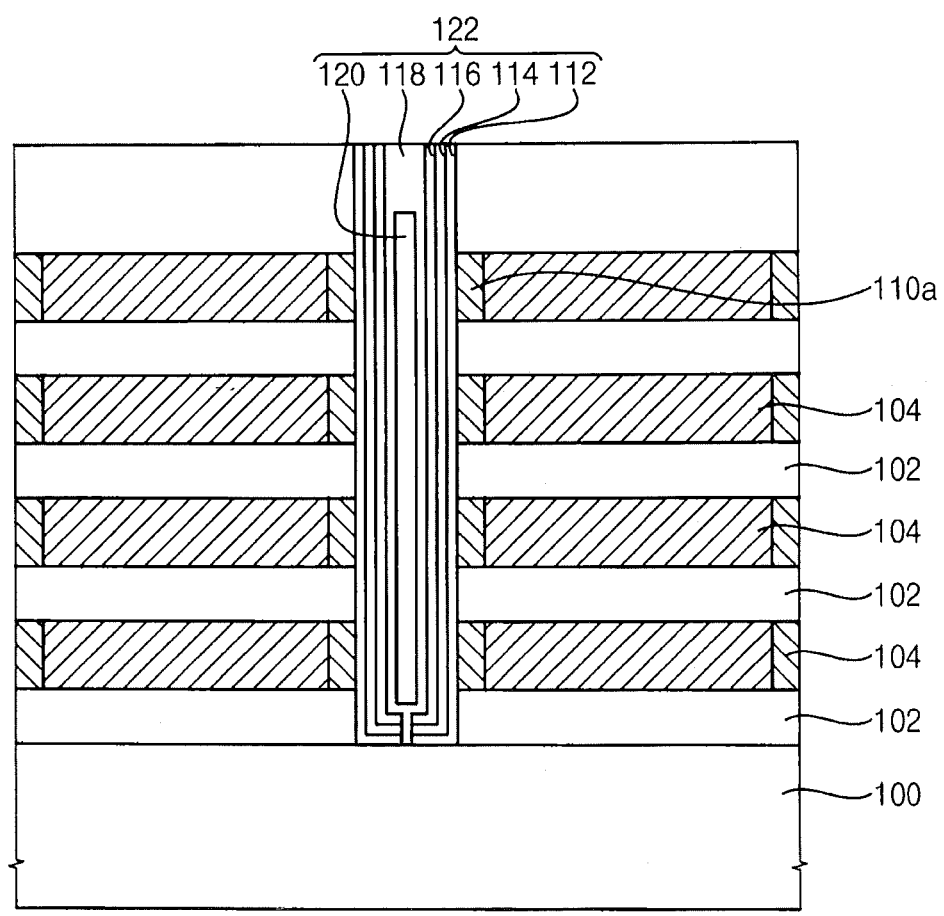

Referring to FIG. 8, a preliminary blocking dielectric layer, a preliminary charge storing layer and a preliminary tunnel oxide layer may be formed one by one on the inner side wall and the bottom surface of the holes 106.

The preliminary blocking dielectric layer may include an insulating material having a dielectric constant higher than a dielectric constant of the preliminary tunnel oxide layer. That is, the preliminary blocking dielectric layer may include metal oxide. The preliminary blocking dielectric layer may be obtained by stacking two or more materials. Particularly, the preliminary blocking dielectric layer contacting the first gate pattern may include metal oxide having a high dielectric constant.

The preliminary charge storing layer may include silicon nitride. The preliminary tunnel oxide layer may include silicon oxide.

Then, the preliminary blocking dielectric layer, the preliminary charge storing layer and the preliminary tunnel oxide layer may be anisotropically etched to exposed the upper surface of the substrate 100 and to form a blocking dielectric layer 112, a charge storing layer 114 and a tunnel oxide layer 116 having a spacer shape on the inner side wall of the holes 106, respectively. On the tunnel oxide layer 116 and the surface of the substrate 100, a channel layer may be formed.

As illustrated in the drawing, the channel layer may be conformally formed on the tunnel oxide layer 116. The channel layer may include doped or undoped polysilicon or amorphous silicon with impurities. On the channel layer, a second insulating layer completely filling up the inner portion of the holes 106 may be formed. The second insulating layer may include an insulating material such as silicon oxide or silicon nitride.

The upper portion of the second insulating layer may be partially etched to form a second insulating layer pattern 120 having a lower upper surface than an inlet portion of the holes 106. On the second insulating layer pattern, a pad pattern filling up the inlet portion of the holes may be formed. The channel layer and the pad pattern may be provided as the channel pattern 118. Through performing the above-mentioned processes, as illustrated in the drawing, the channel pattern 118 having a macaroni shape may be formed.

In some embodiments, on the tunnel oxide layer and the surface of the substrate, a channel layer completely filling up the inner portion of the holes 106 may be formed. In addition, the channel layer may be planarized to form a channel pattern 118. In this case, the channel pattern 118 having a pillar shape and having completed filled up interior may be formed.

Through performing the above-mentioned processes, a pillar structure having the channel pattern 118, the tunnel oxide layer 116, the charge storing layer 114 and the blocking dielectric layer 112 stacked sequentially may be formed in the holes 106.

Figure 9:
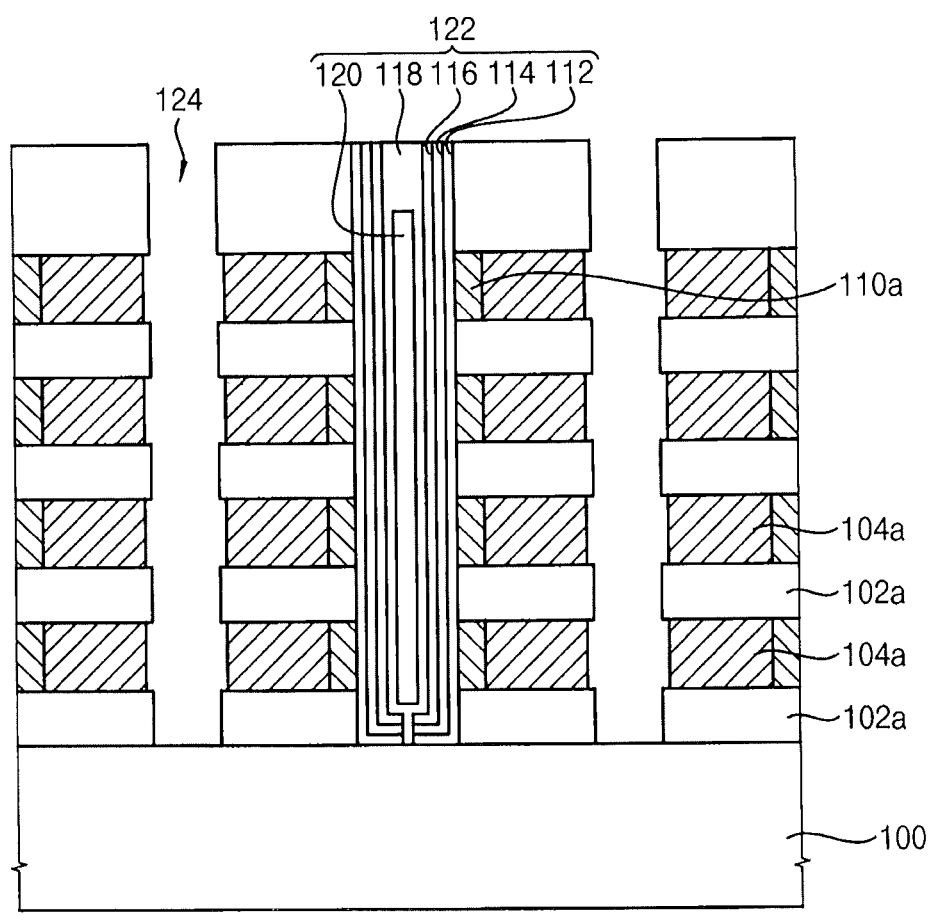

Referring to FIG. 9, a first opening portion 124 penetrating the first insulating layers 102 and the first conductive layers 104 may be formed to expose the upper surface of the substrate 100.

In some embodiments, the first opening portion 124 may have an extended shape in the second direction. In addition, a plurality of the first opening portions 124 may be arranged in parallel in the third direction. Thus, the first insulating layers 102 and the first conductive layers 104 may be transformed into first insulating layer patterns 102a and first conductive layer patterns 104a. That is, the first insulating layer patterns 102a and the first conductive layer patterns 104a may be exposed by the side wall of the first opening portion 124. The first insulating layer patterns 102a and the first conductive layer patterns 104a may have a line shape extended in the second direction. The stacked structure of the first insulating layer pattern 102a and the first conductive layer patterns 104a may have a shape surrounding the pillar structure 122.

Figure 10:
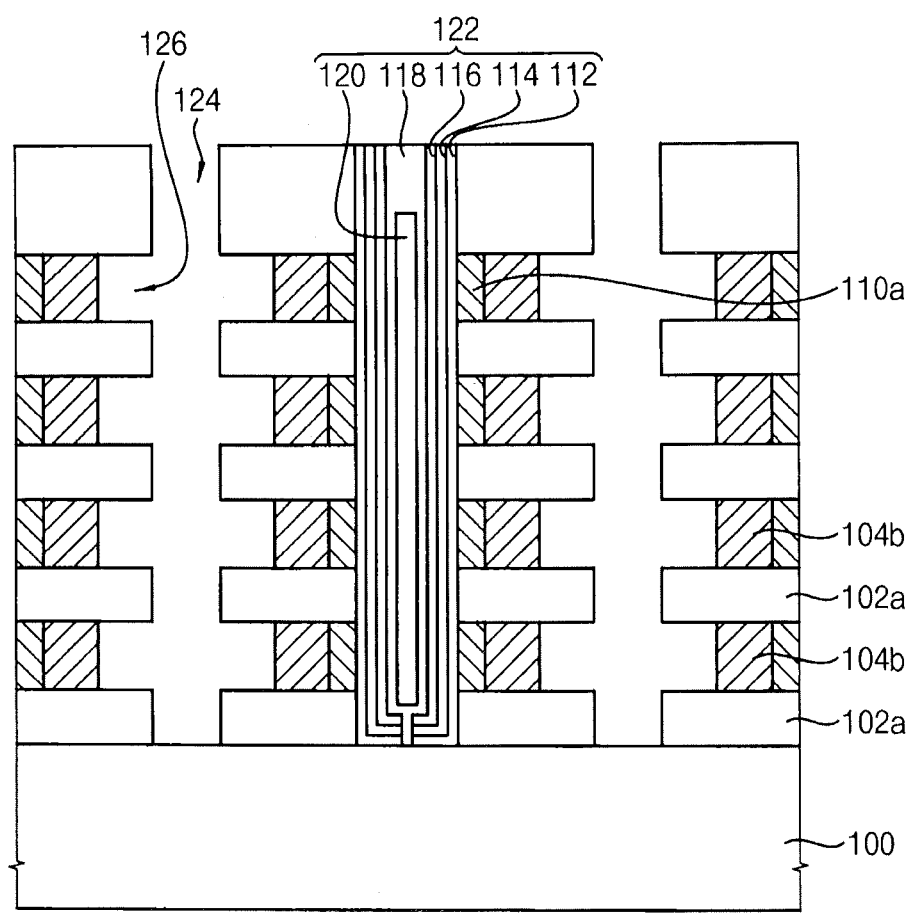

Referring to FIG. 10, the first conductive layer pattern 104a exposed to the side wall of the first opening portion 124 may be partially etched to form second recessed portions 126. Through forming the second recessed portion 126, the first conductive layer pattern 104a may be transformed into a second gate pattern 104b.

As described above, the first conductive layers 104 initially formed for using as a mold structure may be used as a part of gate structures. That is, during performing the etching process, the whole first conductive layer pattern 104a may not be removed but only a portion of the first conductive layer pattern 104a may be removed to form a second gate pattern 104b. Since an amount of the first conductive layer pattern 104a etched during performing the etching process may not be large, defects including the leaning of the mold structure having the first insulating layers and the first conductive layers may not be generated. Thus, defects due to the leaning of the mold structure may be decreased. In addition, a number of stacked layers in the mold structure may increase. Thus, a vertical type semiconductor device having higher numbers of the layers may be manufactured.

Figure 11:
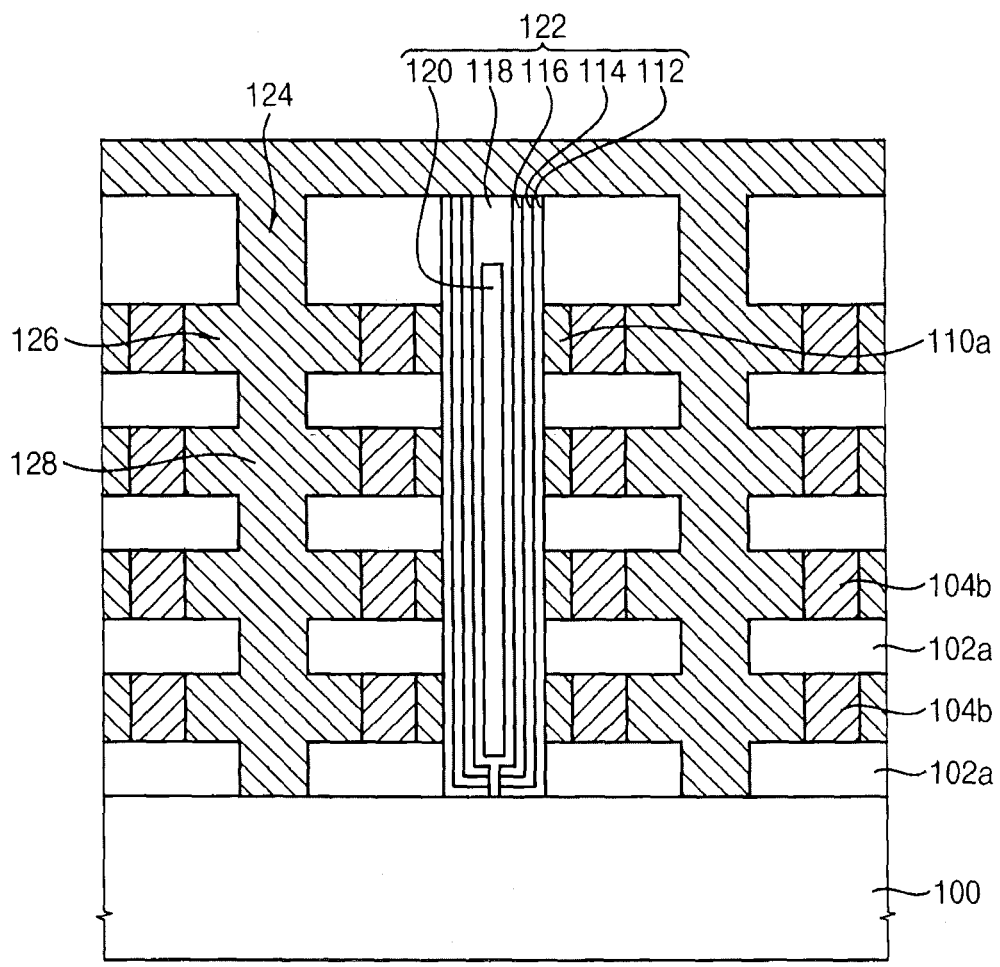

Referring to FIG. 11, a third conductive layer 128 may be formed along the inner portion of the second recessed portion 126, the side wall and the bottom portion of the opening portion 124 and the upper surface of the first insulating layer pattern 102a. The third conductive layer 128 may be formed so as to fill up the inner portion of the second recessed portion 126. The third conductive layer 128 may be a layer for forming a third gate pattern 128a included in a gate structure.

Accordingly, the third conductive layer 128 may include a second conductive material having a resistance lower than a resistance of the first conductive material that may form the second gate pattern 104b. Particularly, the third conductive layer 128 may include a material such as metal or metal silicide. Examples of the materials that may be used for the third conductive layer 128 may include tungsten, tungsten silicide, cobalt, cobalt silicide, nickel, or nickel silicide. These materials may be used alone or as a stacked structure of two or more.

Figure 12:
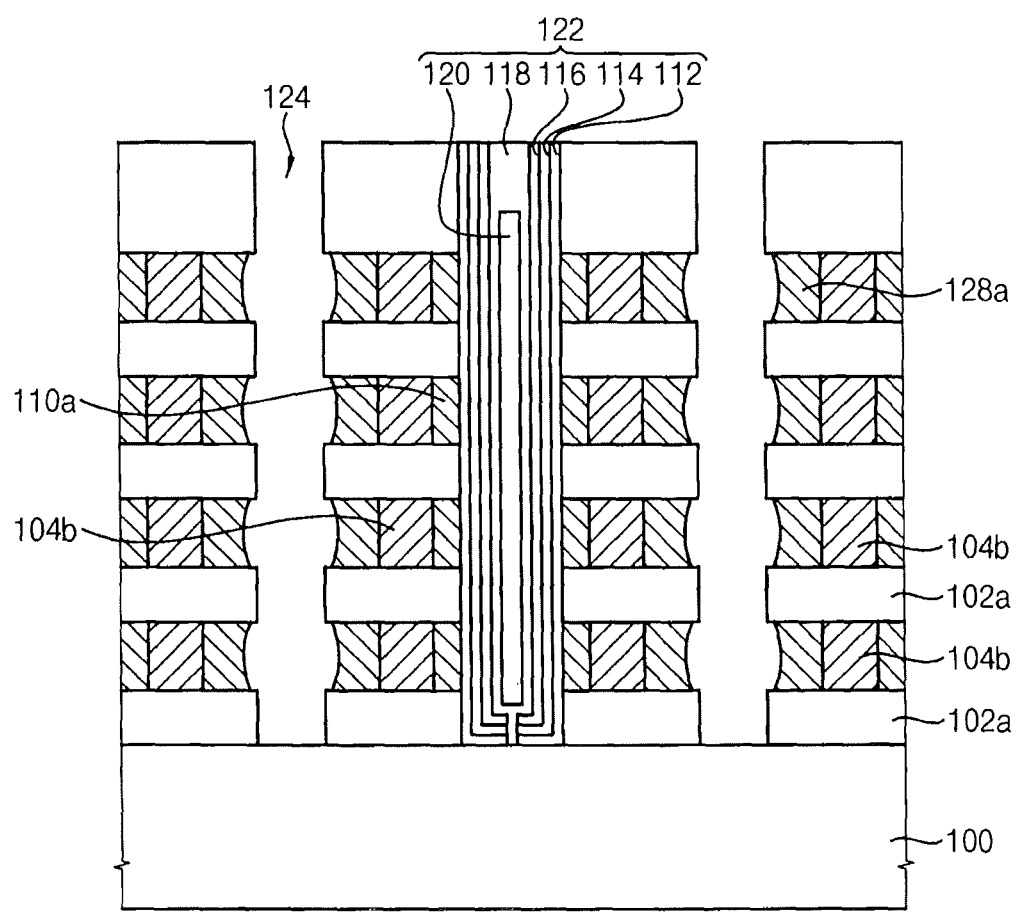

Referring to FIG. 12, the third conductive layer 128 may be partially etched to form a third gate pattern 128a in the second recessed portion 126. Through performing the removing process, the first opening portion 124 may be formed again.

A third insulating layer may be formed in the first opening portion 124 and then may be planarized to form an insulating pattern in the first opening portion 124. Through performing the above-mentioned processes, the vertical type semiconductor device illustrated in FIG. 1 may be manufactured.

In some embodiments, the processes performed referring to FIGS. 10 to 12 may be omitted. In this case, the gate structure may have a stacked structure of the first gate pattern 110a and the second gate pattern 104b.

Figure 13:
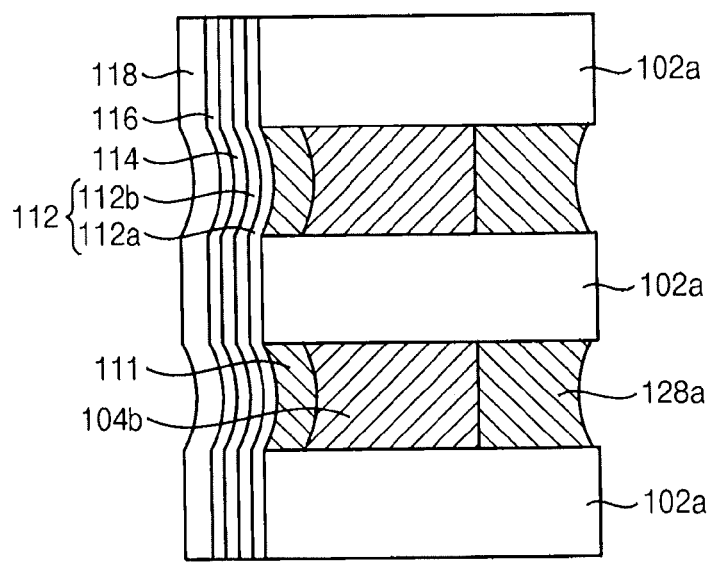
FIG. 13 is a cross-sectional view illustrating a portion of a vertical type semiconductor device according to some embodiments of the present inventive concept.

FIG. 13 is a cross-sectional view illustrating a portion of a vertical type semiconductor device according to some embodiments of the present inventive concept.

The vertical type semiconductor device illustrated in FIG. 13 may be the same as or similar to the vertical type semiconductor device illustrated in FIGS. 1 and 2 except for the shape of the patterns being included each of the cells. That is, the stacking structure of each pattern and the material of each pattern in the vertical type semiconductor device in FIG. 13 may be the same as or similar to those of the vertical type semiconductor device in FIGS. 1 and 2.

Referring to FIG. 13, a channel pattern 118 extended in the first direction may be provided on the substrate. On the outer side wall of the channel pattern 118, a tunnel oxide layer 116, a charge storing layer 114, and a blocking dielectric layer 112 may be stacked sequentially. The channel pattern 118, the tunnel oxide layer 116, the charge storing layer 114 and the blocking dielectric layer 112 may form one pillar structure.

A plurality of gate structures surrounding the pillar structure and extending in the second direction may be provided. The plurality of the gate structures may be spaced apart from each other and may have a stacked structure.

The contact portion of the gate structure and the pillar structure may be recessed into a side direction. The side direction is a direction that the gate patterns are stacked. Hereinafter, the side direction may be called as a gate stacking direction. That is, at least one of the channel pattern 118, the tunnel oxide layer 116, the charge storing layer 114 and the blocking dielectric layer 112 contacting the gate structure may be recessed to the gate stacking direction.

The gate structure may have a stacked structure of first to third gate patterns from the side portion of the pillar structure. The materials that may be used for the first to third gate patterns may be the same as or similar to materials explained with reference to FIG. 1.

The first gate pattern 111 may directly contact the blocking dielectric layer 112 provided at the outer side wall of the pillar structure. The first gate pattern 111 may have a recessed shape to the gate stacking direction along the recessed shape of the pillar structure. That is, the first surface of the first gate pattern 111 contacting the pillar structure may have a recessed shape to gate stacking direction. In addition, the second surface of the first gate pattern 111, facing the first surface of the first gate pattern 111 may have a recessed shape or a planar surface in the first direction.

Between the gate structures, first insulating layer patterns 102a may be provided. Because of the first insulating layer patterns 102a, the gate structures may be insulated from each other in the first direction. The contacting portion of the first insulating layer pattern 102a and the pillar structure may not be recessed but may have a planar surface in the first direction. Thus, the first surface of the first gate pattern 111 may have a recessed shape inwardly with respect to the side wall of the first insulating layer pattern 102a.

Figure 14:
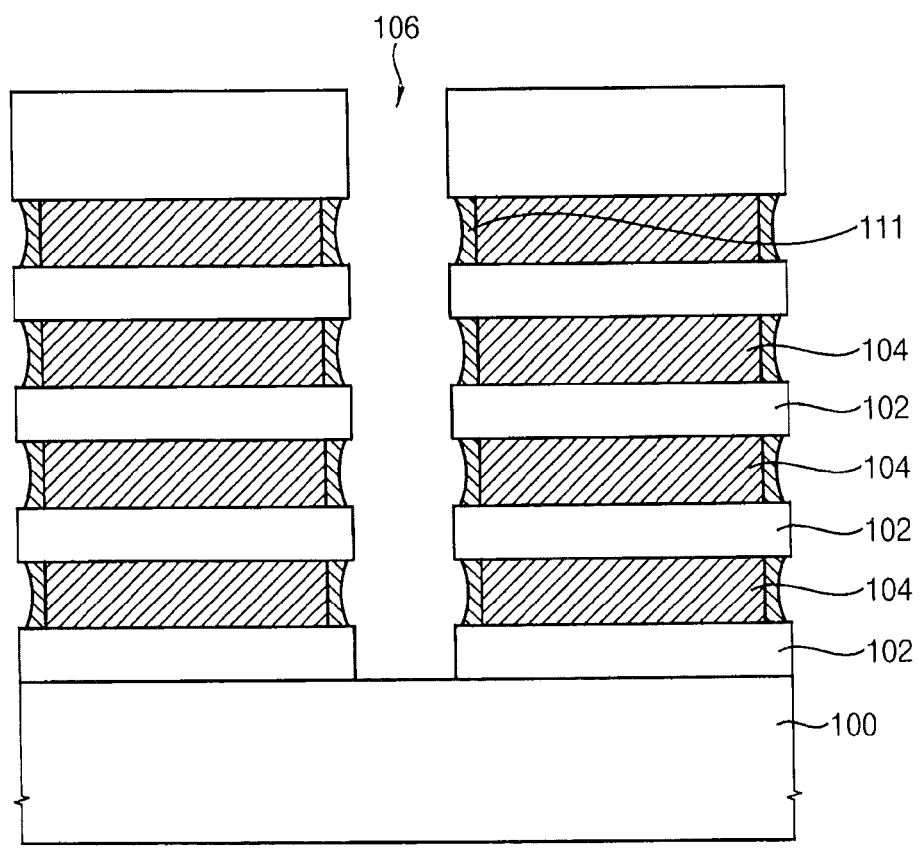
FIGS. 14 and 15 are cross-sectional views illustrating intermediate structures provided in operations of forming the vertical type semiconductor device illustrated in FIG. 13 according to some embodiments of the present inventive concept.
Figure 15:
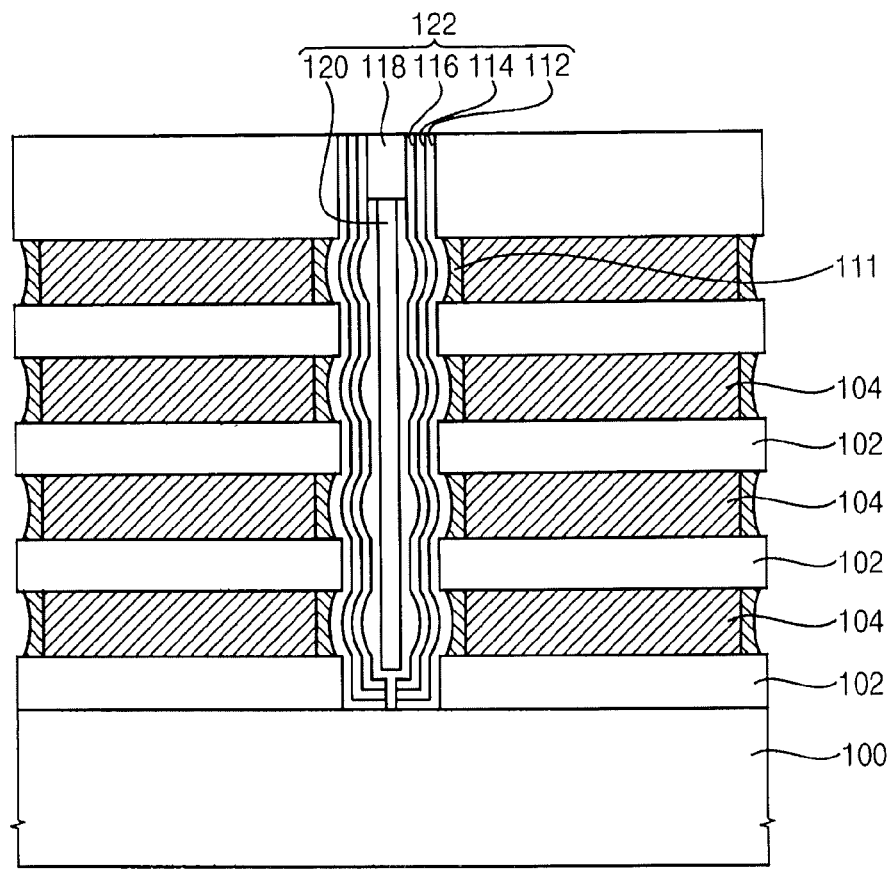

FIGS. 14 and 15 are cross-sectional views illustrating intermediate structures provided in operations of forming the vertical type semiconductor device illustrated in FIG. 13 according to some embodiments of the present inventive concept.

The vertical type semiconductor device illustrated in FIG. 13 may be manufactured by a similar method of manufacturing the vertical type semiconductor device illustrated in FIG. 1.

The same or similar processes explained with reference to FIGS. 5 and 6 may be performed to form the structure illustrated in FIG. 6.

Referring to FIG. 14, the second conductive layer may be partially etched to remain the second conductive layer only in the first recessed portion to form a first gate pattern 111.

In this case, the second conductive layer may not remain on the first insulating layers exposed by the side wall of the hole 106. The second conductive layer may be over etched such that a first surface of the first gate pattern 111 exposed by the side wall of the hole may be recessed into a gap between the first insulating layers. Thus, the first surface of the first gate pattern 111 exposed by the side wall of the hole 106 may be recessed to the side direction.

Referring to FIG. 15, a pillar structure 122 including a blocking dielectric layer 112, a charge storing layer 114, a tunnel oxide layer 116 and a channel pattern 118 may be formed on the side wall of the hole 106. The forming process of the pillar structure 122 may be the same as or similar to the processes explained with reference to FIG. 8.

The blocking dielectric layer, the charge storing layer, the tunnel oxide layer and the channel pattern may be formed along the side wall profile of the hole. Since the first gate pattern 111 exposed at the side wall of the hole may have an recessed shape to the side direction, the contacting portion of the blocking dielectric layer 112, the charge storing layer 114, the tunnel oxide layer 116 and the channel pattern 118 with the first gate pattern 111 may have an recessed shape to the stacking direction of the gate structure.

Then, the processes explained with reference to FIGS. 9 to 12 may be performed to manufacture the vertical type semiconductor device illustrated in FIG. 13.

Figure 16:
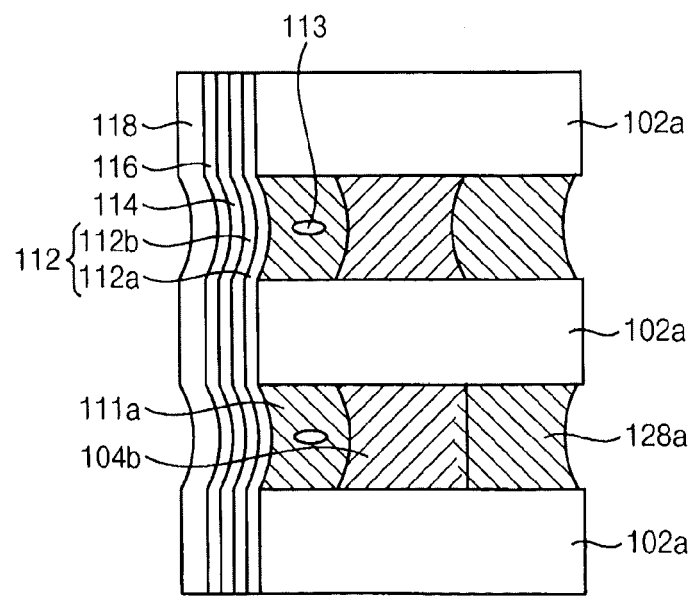
FIG. 16 is a cross-sectional view illustrating a portion of a vertical type semiconductor device according to some embodiments of the present inventive concept.

FIG. 16 is a cross-sectional view illustrating a portion of a vertical type semiconductor device according to some embodiments of the present inventive concept.

The vertical type semiconductor device illustrated in FIG. 16 may be the same as or similar to the vertical type semiconductor device illustrated in FIGS. 1 and 2 except for the shape of the patterns being included each of the cells. That is, the stacking structure of each of the patterns and the materials forming each of the patterns in the vertical type semiconductor device in FIG. 16 may be the same as or similar to those of the vertical type semiconductor device illustrated in FIGS. 1 and 2.

Referring to FIG. 16, a channel pattern 118 may be provided on a substrate. On the outer side wall of the channel pattern 118, a tunnel oxide layer 116, a charge storing layer 114, and a blocking dielectric layer 112 may be stacked sequentially. The channel pattern 118, the tunnel oxide layer 116, the charge storing layer 114 and the blocking dielectric layer 112 may form one pillar structure.

A plurality of gate structures surrounding the pillar structure and extending in the second direction may be provided. The contacting portion of the gate structure and the pillar structure may be recessed to the gate stacking direction as explained with reference to FIG. 13.

The gate structure may have a stacked structure of first to third gate patterns 111a, 104b and 128a sequentially and may be formed on the side portion of the pillar structure.

The gate pattern 111a may directly contact the blocking dielectric layer 112 provided on the outer wall of the pillar structure. The first gate pattern 111a may have a recessed shape to the side direction along the recessed shape of an underlying pillar structure. In addition, a seam or an interface 113 may be included in the first gate pattern 111a. The seam or the interface 113 may be formed when the first gate pattern 111a fills the recessed shape of the underlying pillar structure.

Between the gate structures, first insulating layer patterns 102a may be provided. Because of the first insulating layer patterns 102a, the gate structures may be insulated along a vertical direction.

Figure 17:
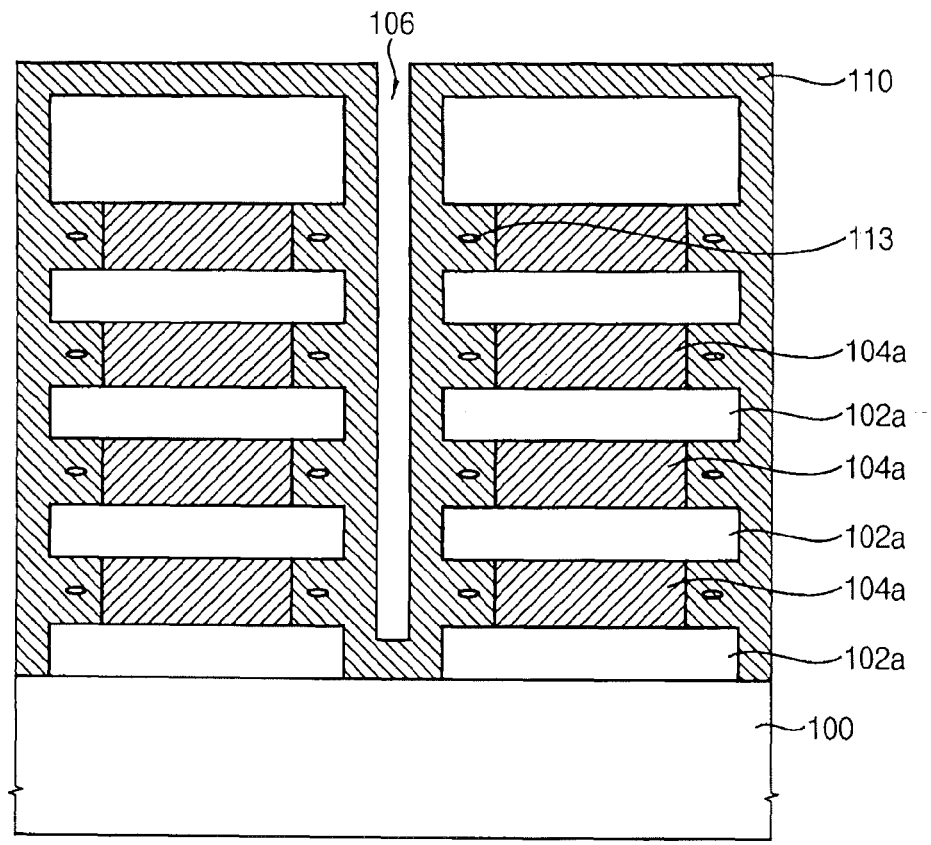
FIG. 17 is a cross-sectional view illustrating an intermediate structure provided in operations of forming the vertical type semiconductor device illustrated in FIG. 16 according to some embodiments of the present inventive concept.

FIG. 17 is a cross-sectional view illustrating an intermediate structure provided in operations of forming the vertical type semiconductor device illustrated in FIG. 16 according to some embodiments of the present inventive concept.

The vertical type semiconductor device illustrated in FIG. 16 may be formed by a similar method of manufacturing the vertical type semiconductor device illustrated in FIG. 13. The same or similar processes explained with reference to FIG. 5 may be performed to form the structure illustrated in FIG. 5.

Referring to FIG. 17, the first conductive layer exposed at the side wall of the holes 106 may be partially etched to form a first recessed portion in each layer.

A second conductive layer 110 may be formed along the inner portion of the first recessed portion, the side wall and the bottom portion of the holes and the upper surface of the uppermost first insulating layer. The second conductive layer 110 may be formed to have conformal deposition properties. Thus, in the second conductive layer 110 formed in the first recessed portion, a seam or an interface may be formed. The seam or the interface may be formed because portions of a surface of the conductive layer 110 contacts in the first recessed portion.

Then, the same or similar processes explained with reference to FIGS. 14, 15 and 9 to 12 may be performed to manufacture the vertical type semiconductor device illustrated in FIG. 16.

Figure 18:
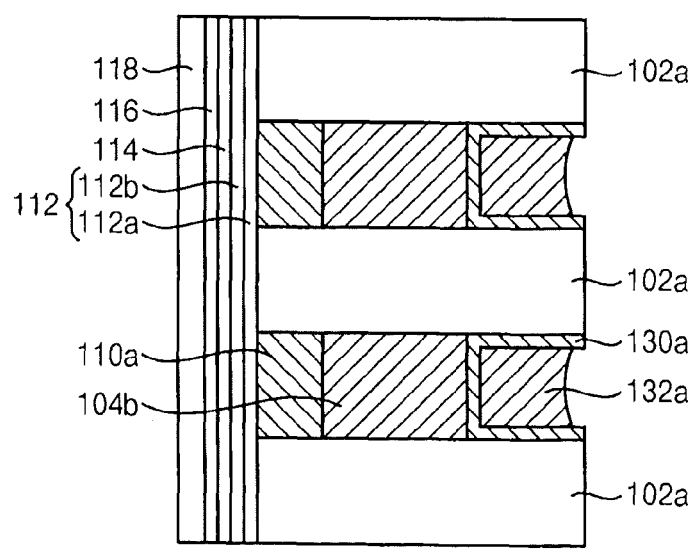
FIG. 18 is a cross-sectional view illustrating a portion of a vertical type semiconductor device according to some embodiments of the present inventive concept.
Figure 19:
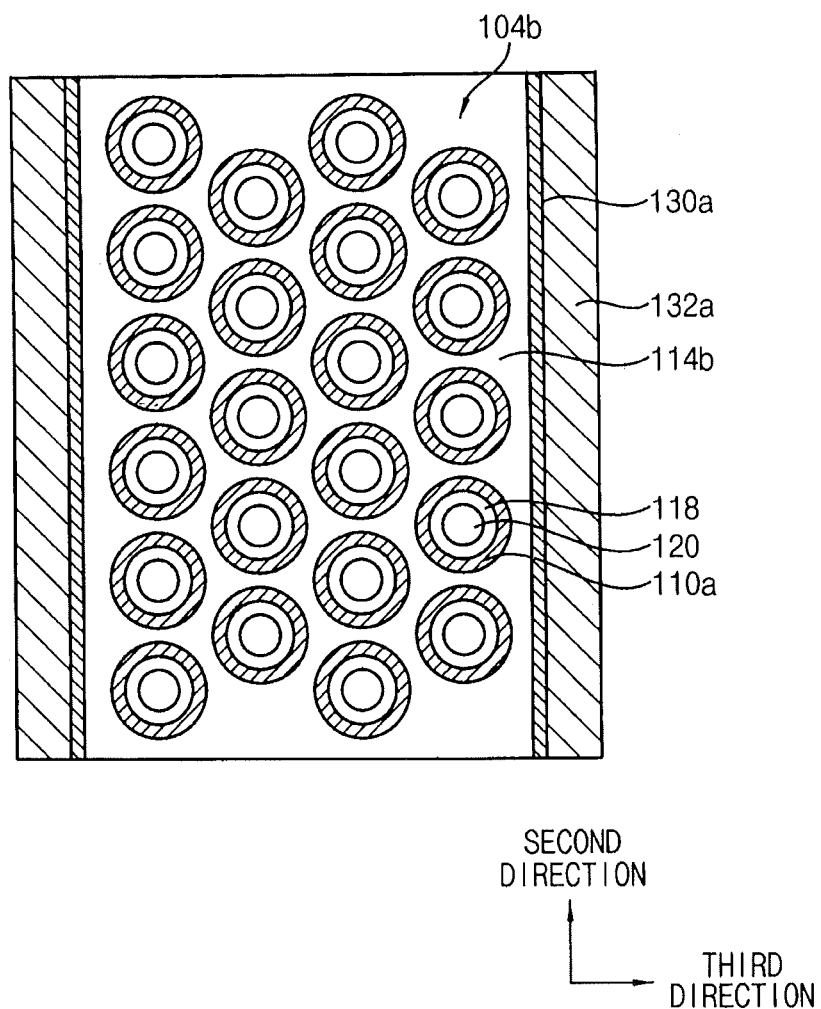
FIG. 19 is a plan view of the vertical type semiconductor device illustrated in FIG. 18.

FIG. 18 is a cross-sectional view illustrating a portion of a vertical type semiconductor device according to some embodiments of the present inventive concept. FIG. 19 is a plan view of the vertical type semiconductor device illustrated in FIG. 18. FIG. 19 is a plan view of a vertical type semiconductor device in which one gate structure may have a shape surrounding four rows of pillar structures in the third direction.

The vertical type semiconductor device in FIG. 18 may be the same as or similar to the vertical type semiconductor device illustrated in FIG. 1 except for the shape and the stacking structure of a gate structure.

Referring to FIGS. 18 and 19, a channel pattern 118 may be provided on a substrate. On the outer side wall of the channel pattern 118, a tunnel oxide layer 116, a charge storing layer 114, and a blocking dielectric layer 112 may be stacked one by one. The channel pattern 118, the tunnel oxide layer 116, the charge storing layer 114 and the blocking dielectric layer 112 may form one pillar structure.

A gate structure surrounding the pillar structure and having an extended shape may be provided. A plurality of gate structures may be provided on the side of the pillar structure.

The gate structure may have a stacked structure of first to third gate patterns 110a, 104b, 130a and 132a on the side of the pillar structure.

Between the gate structures, first insulating layer patterns 102a may be provided. Because of the first insulating layer patterns 102a, the gate structures may be insulated from each other in the vertical direction.

The gate structures may have a shape surrounding the pillar structures arranged in the second direction and having an extended shape. In addition, the gate structures may have a shape surrounding at least one pillar structure in the third direction. In FIG. 19, four rows of the pillar structures may be surrounded by one gate structure in the third direction, but the shape of the gate structure may not be limited to this.

The first and second gate patterns 110a and 104b may be the same as or similar to the first and second gate patterns explained with reference to FIG. 1. That is, the first and second gate patterns 110a and 104b may include the same or similar material explained with reference to FIG. 1 and may have the same or similar stacked structure.

The third gate patterns 130a and 132a may have a stacked structure of a barrier metal layer pattern 130a and a metal layer pattern 132a in the side direction. The third gate patterns 130a and 132a may be positioned at both edge portions of the gate structure in the third direction.

Examples of a metal that may be used as the barrier metal layer pattern 130a may include titanium, titanium nitride, tantalum, tantalum nitride, and tungsten nitride. These materials may be used alone or as a stacked structure of two or more.

The metal layer pattern 132a may include tungsten. The barrier metal layer pattern 130a may be conformally formed along the surface of the first insulating layer pattern 102a and the surface of the second gate pattern 104b. That is, the barrier metal layer pattern 130a may be formed along a surface of a recessed portion while not filling up the recessed portion. The recessed portion may be formed adjacent a side of the second gate pattern and between the first insulating layer patterns 102a.

The metal layer pattern 132a may be provided on the barrier metal layer pattern 130a and may have a shape filling up the recessed portion.

The first to third gate patterns 110a, 104, 130a and 132a may have the same or similar width in the first direction.

Figure 20:
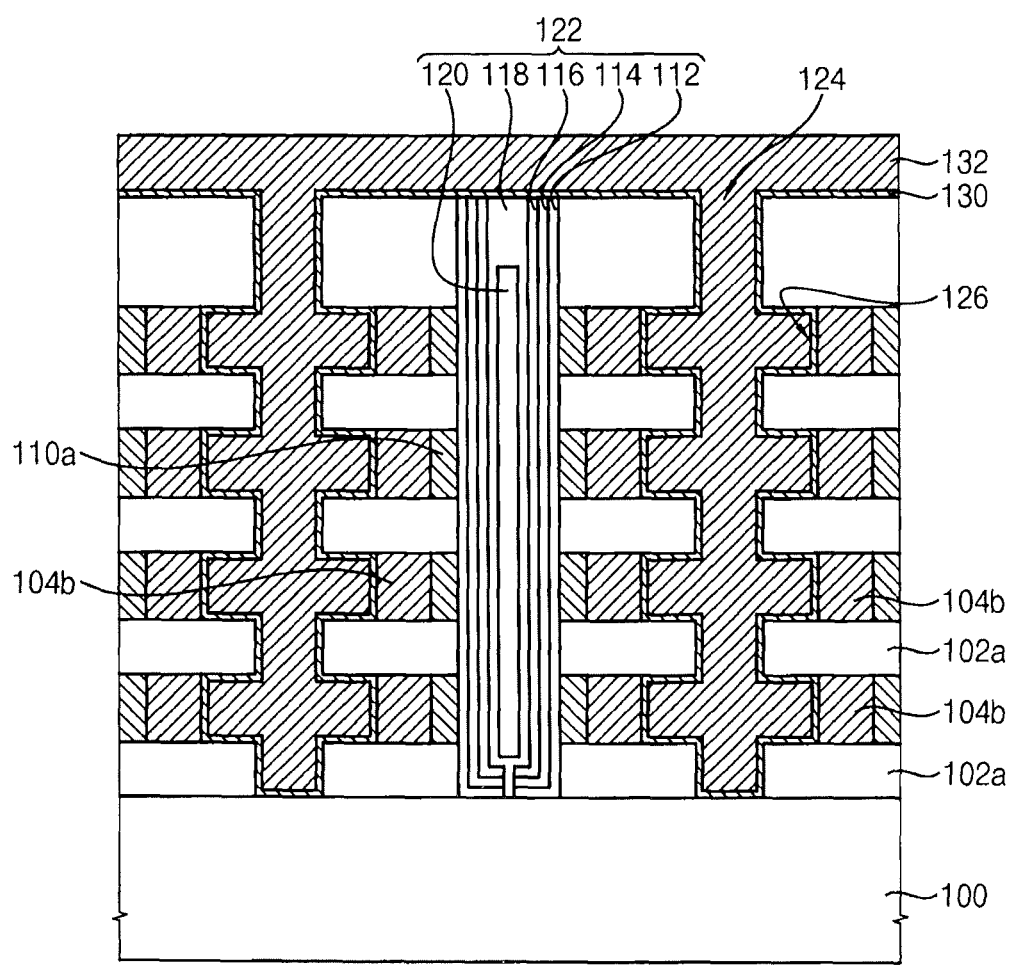
FIGS. 20 and 21 are cross-sectional views illustrating intermediate structures provided in operations of forming the vertical type semiconductor device illustrated in FIG. 18 according to some embodiments of the present inventive concept.
Figure 21:
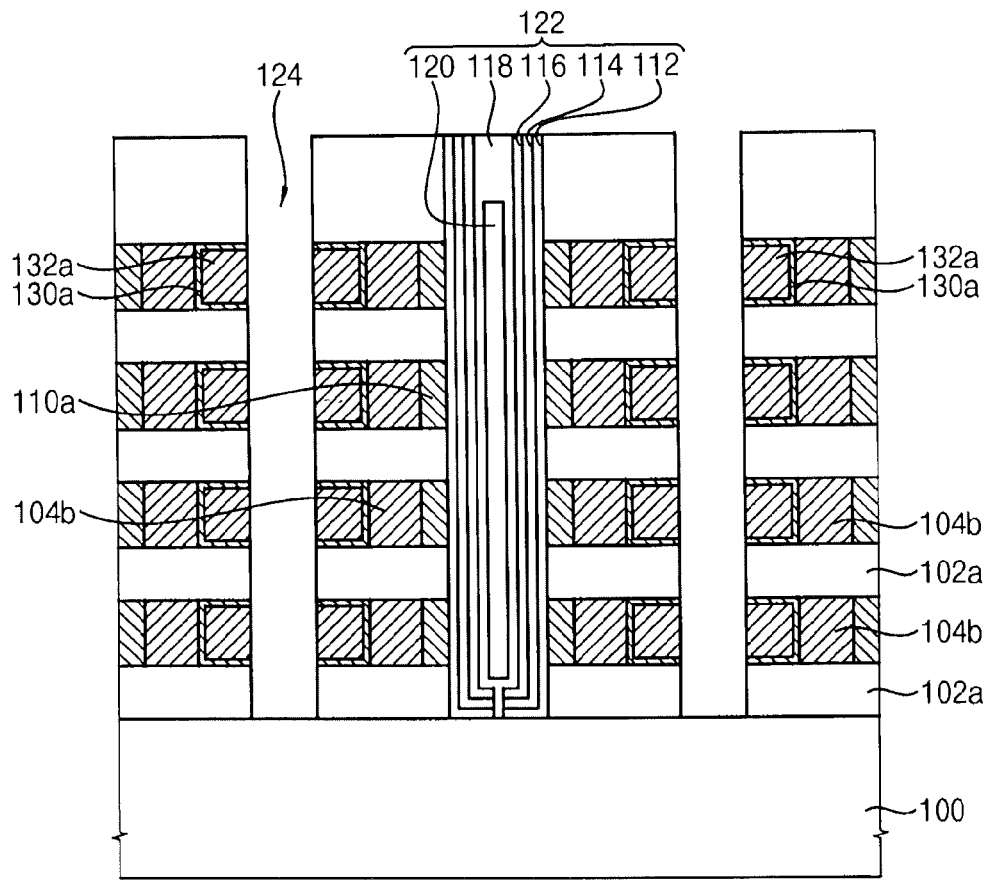

FIGS. 20 and 21 are cross-sectional views illustrating intermediate structures provided in operations of forming the vertical type semiconductor device illustrated in FIG. 18 according to some embodiments of the present inventive concept.

The vertical type semiconductor device illustrated in FIG. 18 may be formed by a similar method of manufacturing the vertical type semiconductor device illustrated in FIG. 1.

The same or similar processes as explained with reference to FIGS. 5 to 10 may be performed to form the structure illustrated in FIG. 10.

Referring to FIG. 20, a barrier metal layer 130 may be formed along the surface of the second recessed portion 126, the side wall and the bottom portion of the first opening portion 124 and the surface of the first insulating layer pattern 102a. The barrier metal layer 130 may be formed along the surface profile of the second recessed portion 126 while not filling up the inner portion of the second recessed portion 126.

A metal layer 132 may be formed on the barrier metal layer 130. The metal layer 132 may be formed so as to fill up at least the inner portion of the second recessed portion 126.

Thus, in the second recessed portion 126, a third conductive layer including the barrier metal layer 130 and the metal layer 132 may be formed. Examples of metal materials that may be used for the barrier metal layer 130 may include titanium, titanium nitride, tantalum, tantalum nitride, and tungsten nitride. These may be used alone or as a stacked structure of two or more. The metal layer 132 may include tungsten.

Referring to FIG. 21, the third conductive layer may be partially removed to form a barrier metal layer pattern 130a and a metal layer pattern 132a in the second recessed portion 126. The barrier metal layer pattern 130a and the metal layer pattern 132a may be provided as a third gate pattern.

A third insulating layer may be formed in the first opening portion 124 and then may be planarized to form an insulating pattern in the first opening portion 124.

Through performing the above-explained processes, the vertical type semiconductor device illustrated in FIG. 18 may be manufactured.

Figure 22:
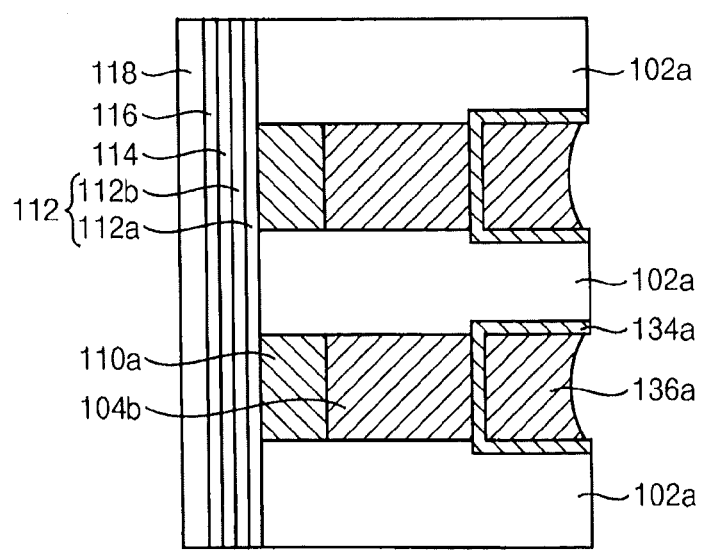
FIG. 22 is a cross-sectional view illustrating a portion of a vertical type semiconductor device according to some embodiments of the present inventive concept.

FIG. 22 is a cross-sectional view illustrating a portion of a vertical type semiconductor device according to some embodiments of the present inventive concept. The vertical type semiconductor device in FIG. 22 may be the same as or similar to the vertical type semiconductor device illustrated in FIG. 18 except for the shape of a gate structure.

Referring to FIG. 22, a channel pattern 118 may be provided on a substrate. On the outer side wall of the channel pattern 118, a tunnel oxide layer 116, a charge storing layer 114, and a blocking dielectric layer 112 may be stacked one by one. The channel pattern 118, the tunnel oxide layer 116, the charge storing layer 114 and the blocking dielectric layer 112 may form one pillar structure 122.

A plurality of gate structures surrounding the pillar structure 122 and extending in the second direction may be provided. The gate structure may have a stacked structure of first to third gate patterns 110a, 104b, 134a and 136a sequentially on the side of the pillar structure 122. Between the gate structures, first insulating layer patterns 102a may be provided. Because of the first insulating layer patterns 102a, the gate structures may be insulated from each other in a vertical direction.

The first and second gate patterns 110a and 104b may have the same or similar structure as the first and second gate patterns explained with reference to FIG. 1. The first and second gate patterns 110a and 104b may have the same or similar width in the first direction. That is, each of the first and second gate patterns 110a and 104b may have a first width.

The third gate patterns 134a and 136a may have a greater width in the first direction than the first and second gate patterns 110a and 104b. That is, the third gate patterns 134a and 136a may have a second width greater than the first width.

Thus, the first insulating layer pattern 102a contacting the third gate patterns 134a and 136a may have a shape having a relatively decreasing width in the first direction. That is, in the first insulating layer pattern 102a, a contacting portion with the first and second gate patterns 110a and 104b may have a third width in the first direction, and a contacting portion with the third gate pattern may have a fourth width in the first direction smaller than the third width.

As illustrated in the drawing, the third gate patterns 134a and 136a may have a stacked structure of a barrier metal pattern 134a and a metal pattern 136a. That is, the third gate pattern may have the same or similar stacked structure as illustrated in FIG. 18.

In some embodiments, the third gate pattern may have the same or similar structure as illustrated in FIG. 1. That is, the third gate pattern may include a conductive material having a resistance lower than a resistance of the second gate pattern 104b.

As described above, the third gate patterns 134a and 136a may have a width greater than those of the first and second gate patterns 110a and 104b in the first direction. Since the third gate patterns 134a and 136a may have a low resistance, the gate structure including the third gate patterns 134a and 136a may have a low resistance.

Figure 23:
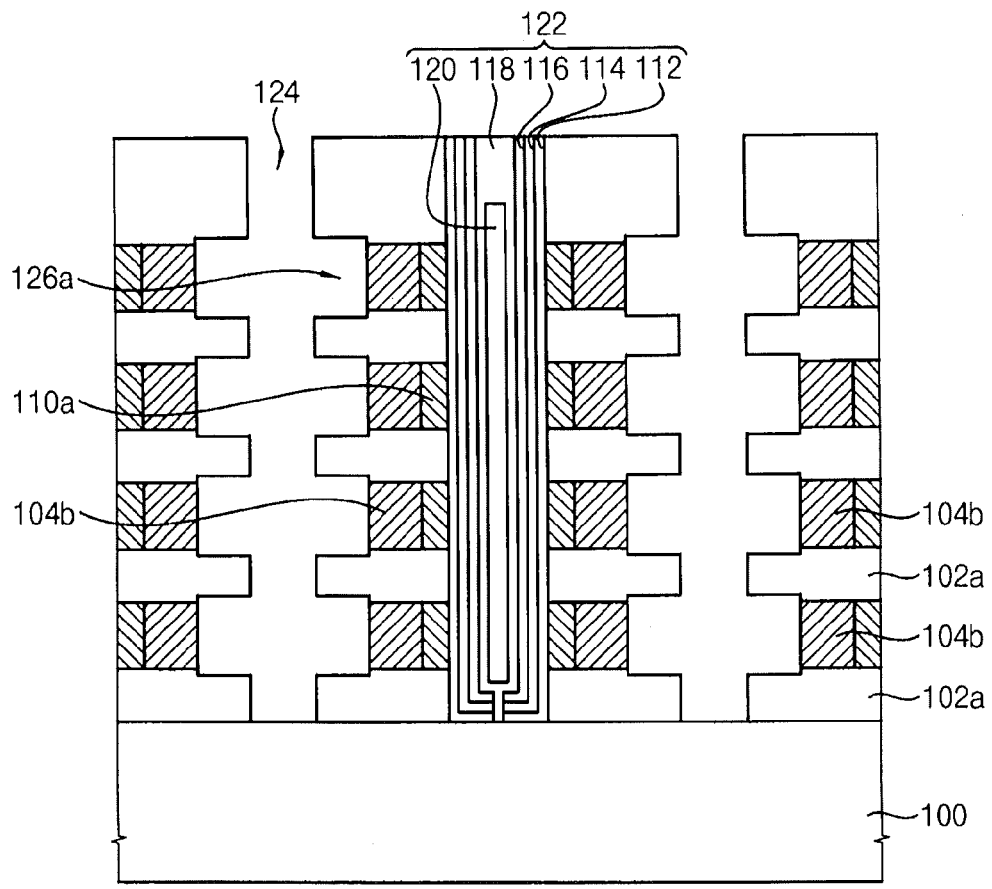
FIG. 23 is a cross-sectional view illustrating an intermediate structure provided in operations of forming the vertical type semiconductor device illustrated in FIG. 22 according to some embodiments of the present inventive concept.

FIG. 23 is a cross-sectional view illustrating an intermediate structure provided in operations of forming the vertical type semiconductor device illustrated in FIG. 22 according to some embodiments of the present inventive concept. The vertical type semiconductor device illustrated in FIG. 22 may be manufactured by a similar method of manufacturing the vertical type semiconductor device illustrated in FIG. 1.

The same or similar processes as explained with reference to FIGS. 5 to 9 may be performed to form the structure illustrated in FIG. 9.

Referring to FIG. 23, a first conductive layer pattern exposed by the side wall of the first opening portion 124 and a first insulating interlayer adjacent to the first conductive layer pattern may be partially etched to form a second recessed portion 126a. Through forming the second recessed portion 126a, the first conductive layer pattern may be transformed to a second gate pattern 104b.

During performing the etching process, the first insulating interlayer adjacent to the first conductive layer pattern may be partially etched. Thus, the width of the second recessed portion 126a in the first direction may become larger than the width of the second gate pattern 104b in the first direction. Accordingly, the width of the first insulating layer pattern 102a corresponding to the side wall of the second recessed portion 126a in the first direction may be decreased.

Then, the same or similar processes explained with reference to FIGS. 20 and 21 may be performed to manufacture the semiconductor device illustrated in FIG. 22. That is, third gate patterns 134a and 136a may be formed in the second recessed portion 126a. As described above, as the width of the second recessed portion 126a may be enlarged, the width of the third gate patterns 134a and 136a formed by subsequent processes may be increased.

In some embodiments, after forming the structure illustrated in FIG. 23, the semiconductor device may be manufactured by performing the same or similar processes explained with reference to FIGS. 11 and 12. In this case, a third gate pattern including a metal material having a resistance lower than a resistance of the second gate pattern may be formed.

Figure 24:
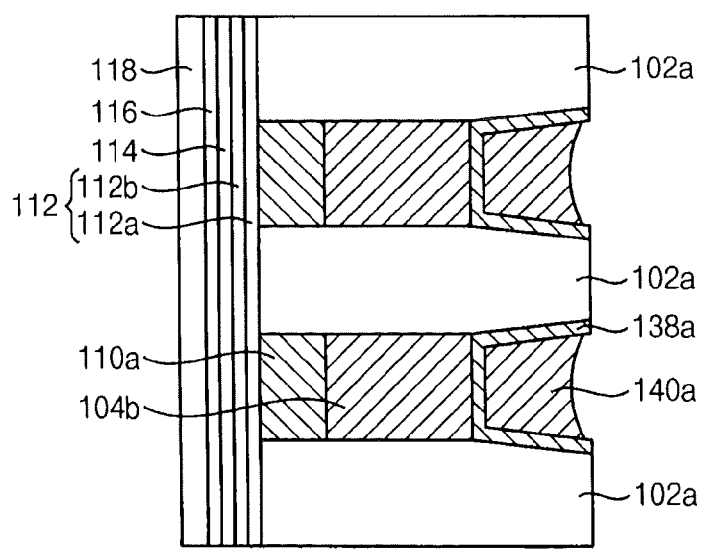
FIG. 24 is a cross-sectional view illustrating a portion of a vertical type semiconductor device according to some embodiments of the present inventive concept.

FIG. 24 is a cross-sectional view illustrating a portion of a vertical type semiconductor device according to some embodiments of the present inventive concept. The vertical type semiconductor device in FIG. 24 may be the same as or similar to the vertical type semiconductor device illustrated in FIG. 18 except for the shape of a gate structure. That is, the stacking structure of gate patterns included in the gate structure and the material of each gate pattern may be the same as or similar to those of the vertical type semiconductor device in FIG. 18.

Referring to FIG. 24, a pillar structure may be formed on a substrate. A plurality of gate structures surrounding the pillar structure and extending in the second direction may be provided. The gate structure may have a stacked structure of first to third gate patterns 110a, 104b, 138a and 140a sequentially formed on the side of the pillar structure. Between the gate structures, first insulating layer patterns 102a may be provided.

The first and second gate patterns 110a and 104b may be the same as or similar to the first and second gate patterns explained with reference to FIG. 1. The first and second gate patterns 110a and 104b may have the same or similar width in the first direction. That is, the first and second gate patterns 110a and 104b may have a first width.

The width of the third gate patterns 138a and 140a in the first direction may be the same as or may be greater than that of the first and second gate patterns 110a and 104b. In addition, the width of the third gate patterns 138a and 140a in the first direction may not be constant but may be varied. The width in the first direction may increase in the third direction. The third gate patterns 138a and 140a may have a reverse trapezoid shape as shown in the cross-sectional view.

A portion of the first insulating layer pattern 102a contacting the third gate patterns 138a and 140a may have a gradually decreasing width in the third direction.

As illustrated in the drawing, the third gate patterns 138a and 140a may have a stacked structure of a barrier metal pattern 138a and a metal pattern 140a. Alternatively, the third gate patterns 138a and 140a may have the same or similar stacked structure as illustrated in FIG. 1. That is, the third gate patterns 138a and 140a may include a conductive material having a lower resistance than the second gate pattern 104b.

As described above, the third gate patterns 138a and 140a may have a gradually increasing width in the third direction. Thus, the third gate patterns 138a and 140a may have a low resistance. Further, the gate structure including the third gate patterns 138a and 140a may have a low resistance.

Figure 25:
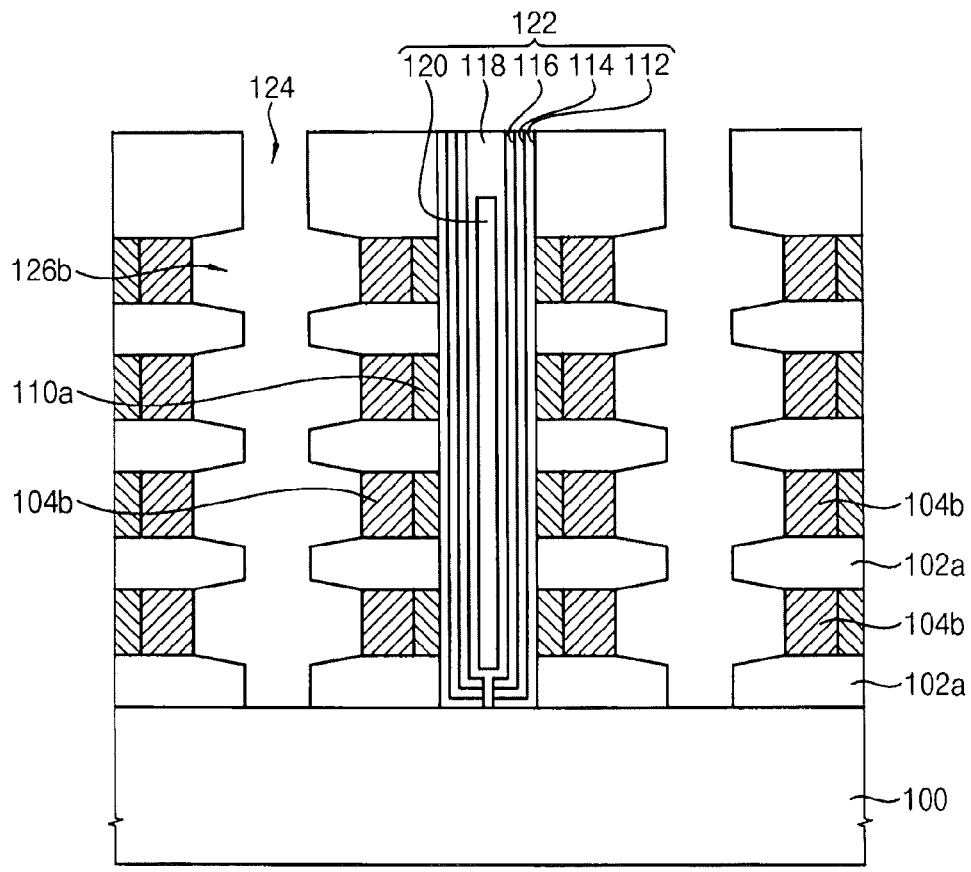
FIG. 25 is a cross-sectional view illustrating an intermediate structure provided in operations of forming the vertical type semiconductor device illustrated in FIG. 24 according to some embodiments of the present inventive concept.

FIG. 25 is a cross-sectional view illustrating an intermediate structure provided in operations of forming the vertical type semiconductor device illustrated in FIG. 24 according to some embodiments of the present inventive concept.

The vertical type semiconductor device illustrated in FIG. 25 may be formed by a similar method of manufacturing the vertical type semiconductor device illustrated in FIG. 18. The same or similar processes explained with reference to FIGS. 5 to 9 may be performed to form the structure illustrated in FIG. 9.

Referring to FIG. 25, the first conductive layer pattern exposed by the side wall of the first opening portion 124 and the first insulating layer pattern 102a adjacent to the first conductive layer pattern may be partially etched to form a second recessed portion 126b. Through forming the second recessed portion 126b, the first conductive layer pattern may be transformed into a second gate pattern 104b.

In the etching process, the first insulating layer pattern 102a may be partially etched so that the inner width of the second recessed portion 126b may be decreased toward the second gate pattern 104b. Thus, the inner width of the second recessed portion 126b in the first direction may be gradually increased as the distance from the second gate pattern 104b increases.

In the second recessed portion 126b, third gate patterns 138a and 140a may be formed by performing subsequent processes. According to the increase of the width of the second recessed portion 126b, the width of the third gate patterns 138a and 140a formed according to the following processes may also be increased.

Then, the same or similar processes may be performed as explained with reference to FIGS. 20 and 21 to manufacture the semiconductor device illustrated in FIG. 24.

In some embodiments, the same or similar processes explained with reference to FIGS. 11 and 12 may be performed after forming the structure illustrated in FIG. 25. In this case, a semiconductor device including a third gate pattern formed by using a metal material of a low resistance may be manufactured.

Figure 26:
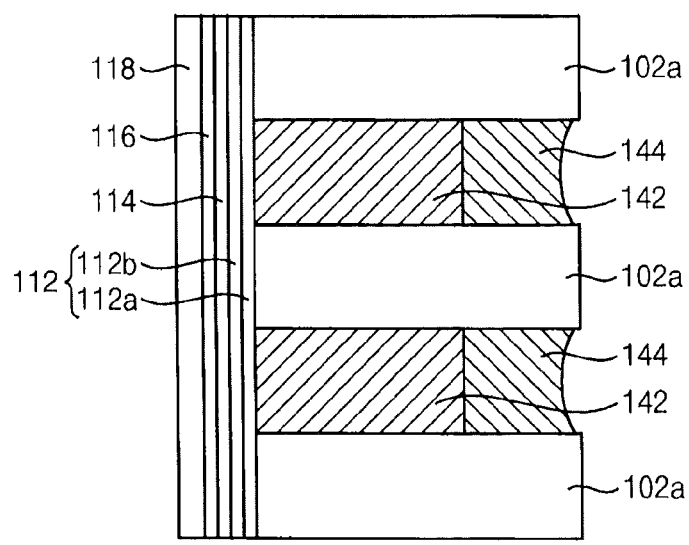
FIG. 26 is a cross-sectional view illustrating a portion of a vertical type semiconductor device according to some embodiments of the present inventive concept.

FIG. 26 is a cross-sectional view illustrating a portion of a vertical type semiconductor device according to some embodiments of the present inventive concept. The vertical type semiconductor device in FIG. 26 may be the same as or similar to the vertical type semiconductor device illustrated in FIG. 1 except for the shape of a gate structure and the stacked structure of gate patterns.

Referring to FIG. 26, a channel pattern 118 may be provided on a substrate. On the outer side wall of the channel pattern 118, a tunnel oxide layer 116, a charge storing layer 114, and a blocking dielectric layer 112 may be stacked sequentially. The channel pattern 118, the tunnel oxide layer 116, the charge storing layer 114 and the blocking dielectric layer 112 may form one pillar structure.

A gate structure surrounding the pillar structures and having an extended shape may be provided. A plurality of gate structures may be provided at the side portion of one pillar structure. The gate structure may have a stacked structure of first and second gate patterns 142a and 144a on the side of the pillar structure. Between the gate structures, first insulating layer patterns 102a may be provided.

The first gate pattern 142a may include the same material as the first gate pattern explained with reference to FIG. 1. The first gate pattern 142a may include a metal material. The first gate pattern 142a may include a metal element such as titanium, tantalum, ruthenium, or tungsten. In addition, the first gate pattern 142a may include a product obtained from a reaction of the metal element with oxygen, carbon or nitrogen. Examples of the materials that may be used for the first gate pattern 142a may include titanium, titanium nitride, tantalum, tantalum nitride, ruthenium, ruthenium oxide, tungsten, and tungsten nitride. These materials may be used alone or as a stacked structure of two or more.

The second gate pattern 144a may include a conductive material having a resistance lower than a resistance of the first gate pattern 142a. The second gate pattern 144a may include a material such as metal or metal silicide. Examples of the materials that may be used for the second gate pattern 144a may include tungsten, tungsten silicide, cobalt, cobalt silicide, nickel, and nickel silicide. These materials may be used alone or as a stacked structure of two or more. Since the second gate pattern 144a may have a low resistance, the resistance of word lines may be low.

FIGS. 27 to 30 are cross-sectional views illustrating intermediate structures provided in operations of forming the vertical type semiconductor device illustrated in FIG. 26 according to some embodiments of the present inventive concept.

Figure 27:
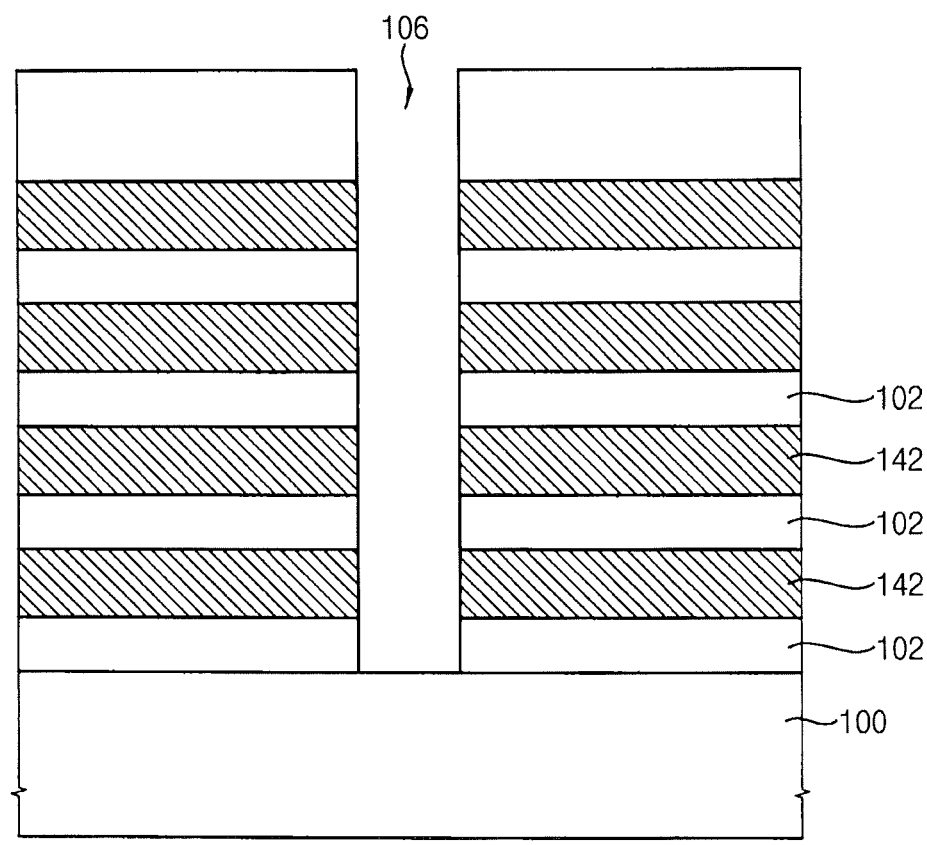
FIGS. 27 to 30 are cross-sectional views illustrating intermediate structures provided in operations of forming the vertical type semiconductor device illustrated in FIG. 26 according to some embodiments of the present inventive concept.

Referring to FIG. 27, first insulating layers 102 and first conductive layers 142 may be alternately and repeatedly stacked on a substrate to form a stacked structure. The first insulating layer 102 may be formed as an uppermost layer of the stacked structure. The first conductive layer 142 may be a layer for forming a first gate pattern 142a included in a gate structure.

In some embodiments, the first conductive layer 142 may include a metal element such as titanium, tantalum, ruthenium, or tungsten. In addition, the first conductive layer 142 may include a product obtained through the reaction of the metal element with oxygen, carbon or nitrogen. Examples of the materials that may be used for the first conductive layer 142 may include titanium, titanium nitride, tantalum, tantalum nitride, ruthenium, ruthenium oxide, tungsten, and tungsten nitride. These materials may be used alone or as a stacked structure of two or more.

Then, the first insulating layers 102 and the first conductive layers 142 may be partially etched to form a plurality of holes 106 penetrating the first insulating layers 102 and the first conductive layers 142 and exposing the upper surface of the substrate 100.

The plurality of the holes 106 may have an array shape regularly arranged in the second and third directions.

Figure 28:
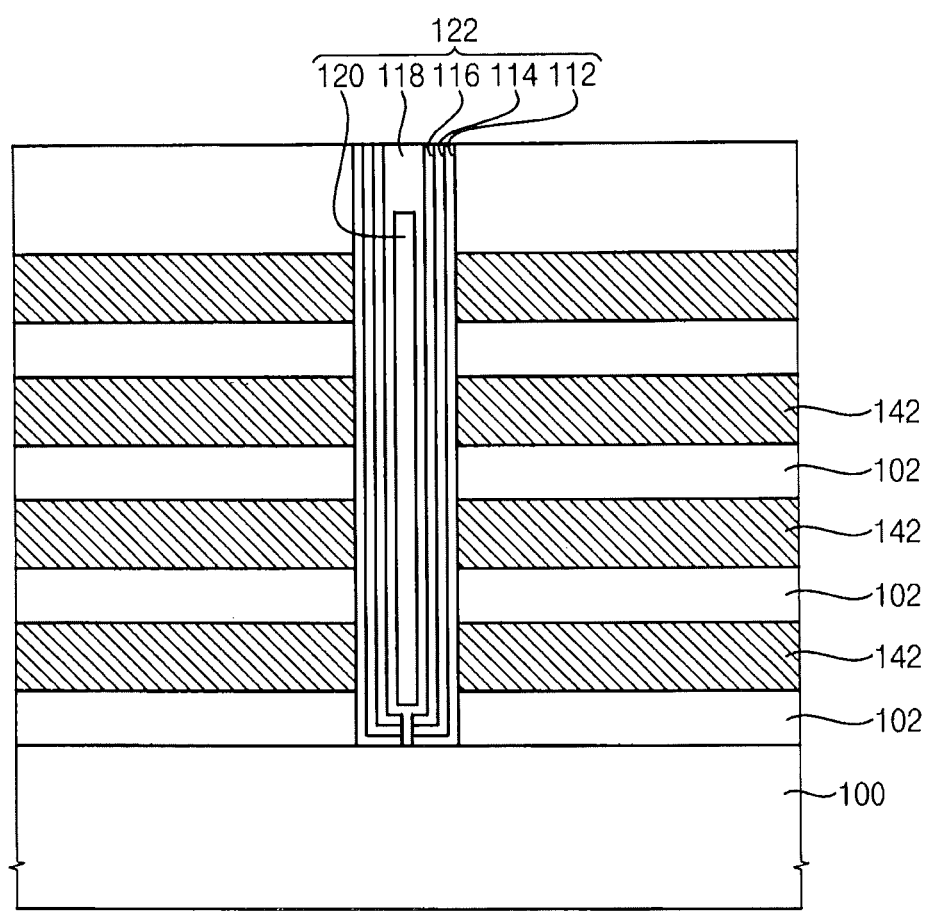

Referring to FIG. 28, a blocking dielectric layer 112, a charge storing layer 114 and a tunnel oxide layer 116 may be formed on the side wall of the holes 106. In addition, the channel pattern 118 may be formed on the tunnel oxide layer 116. Through performing the above-mentioned processes, a pillar structure may be formed in the hole 106. The processes for forming the pillar structure may be the same as or similar to those explained with reference to FIG. 8.

Figure 29:
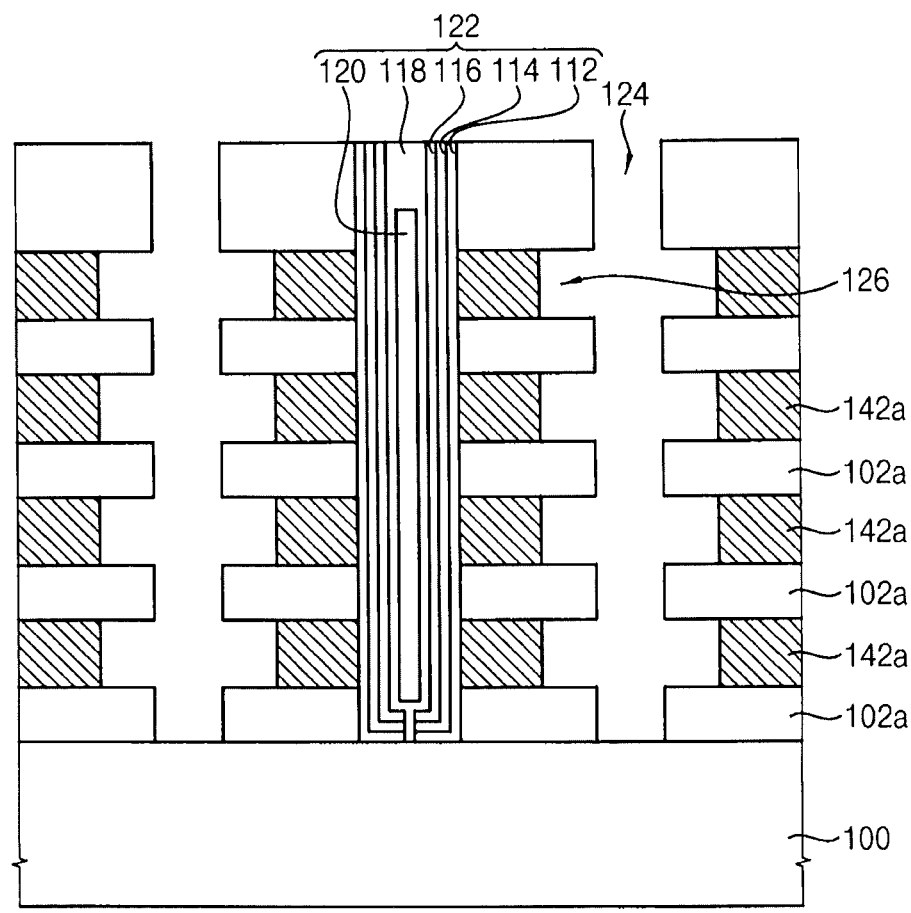

Referring to FIG. 29, the first opening portion 124 penetrating the first insulating layers 102 and the first conductive layers 142 may be formed to expose the upper surface of the substrate 100. The first opening portion 124 may be formed to be extended in the second direction. In addition, a plurality of the first opening portions 124 may be arranged in parallel along the third direction.

The first conductive layer 142 exposed by the side wall of the first opening portion 124 may be partially etched to form a recessed portion 126. Through forming the recessed portion 126, the first conductive layer 142 may be transformed into the first gate pattern 142a. In the recessed portion 126, the second gate pattern 144a may be formed through performing subsequent processes. As described above, the first conductive layer 142 formed as a part of the mold structure may be used as a part of the gate structure.

Figure 30:
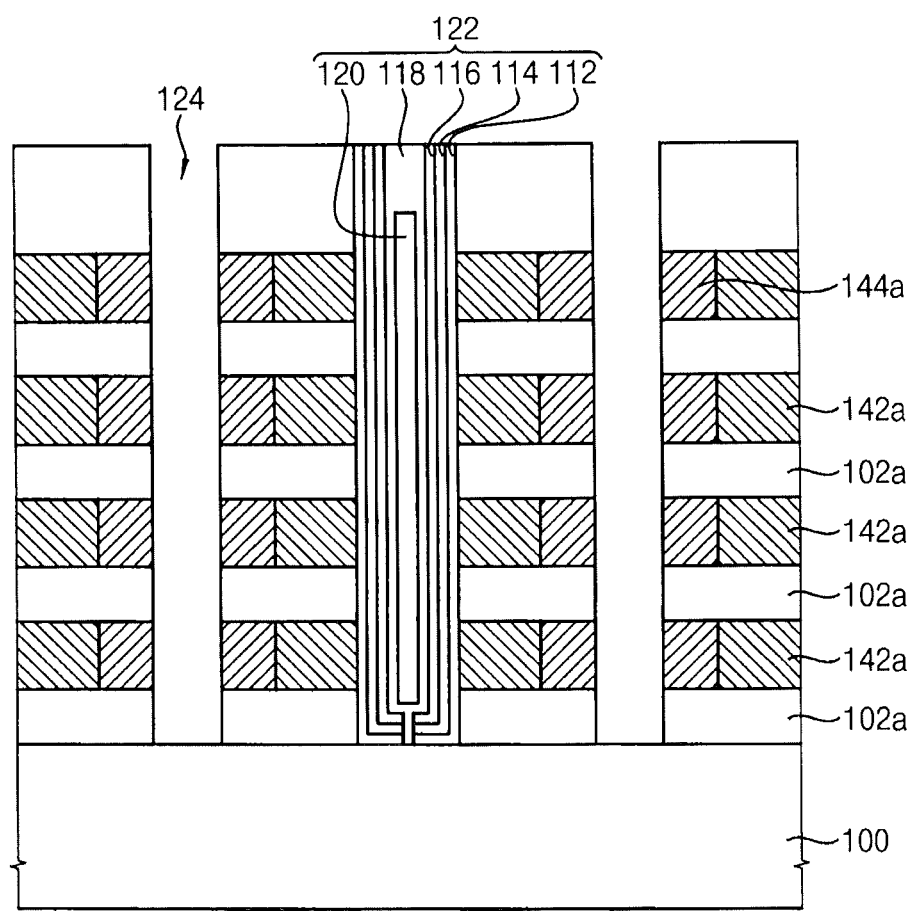

Referring to FIG. 30, a second conductive layer may be formed along the side wall and the bottom portion of the first opening portion 124 including the recessed portion 126 and the surface of the first insulating layer pattern 102a. The second conductive layer may be formed so as to fill up at least the recessed portion 126. The second conductive layer may be a layer for forming the second gate pattern 144a included in the gate structure.

The second conductive layer may include a material having a resistance lower than a resistance of a material forming the first gate pattern 142a. Particularly, the second conductive layer may include a material such as metal or metal silicide. Examples of the materials that may be used for the second conductive layer may include tungsten, tungsten silicide, cobalt, cobalt silicide, nickel, and nickel silicide. These materials may be used alone or as a stacked structure of two or more.

Then, the second conductive layer may be partially removed to form the second gate pattern 144a in the recessed portion 126. In addition, a third insulating layer may be formed in the first opening portion 124 and then may be planarized to form an insulating pattern in the first opening portion.

Through performing the above-described processes, the vertical type semiconductor device illustrated in FIG. 26 may be formed.

Figure 31:
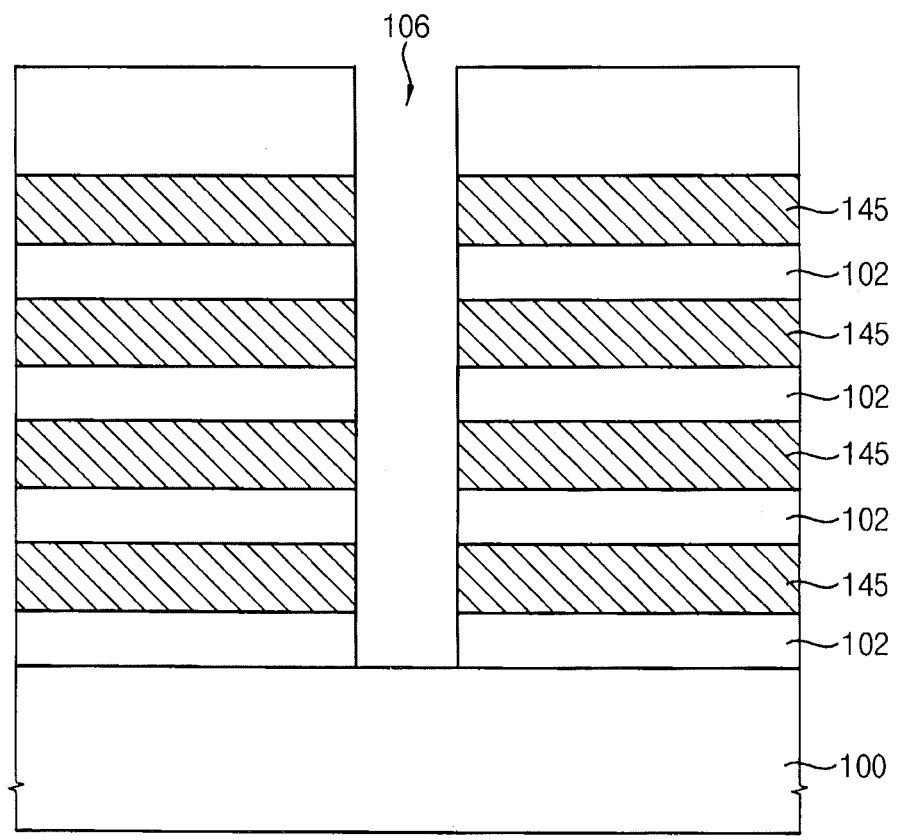
FIGS. 31 and 32 are cross-sectional views illustrating intermediate structures provided in operations of forming the vertical type semiconductor device illustrated in FIG. 26 according to some embodiments of the present inventive concept.
Figure 32:
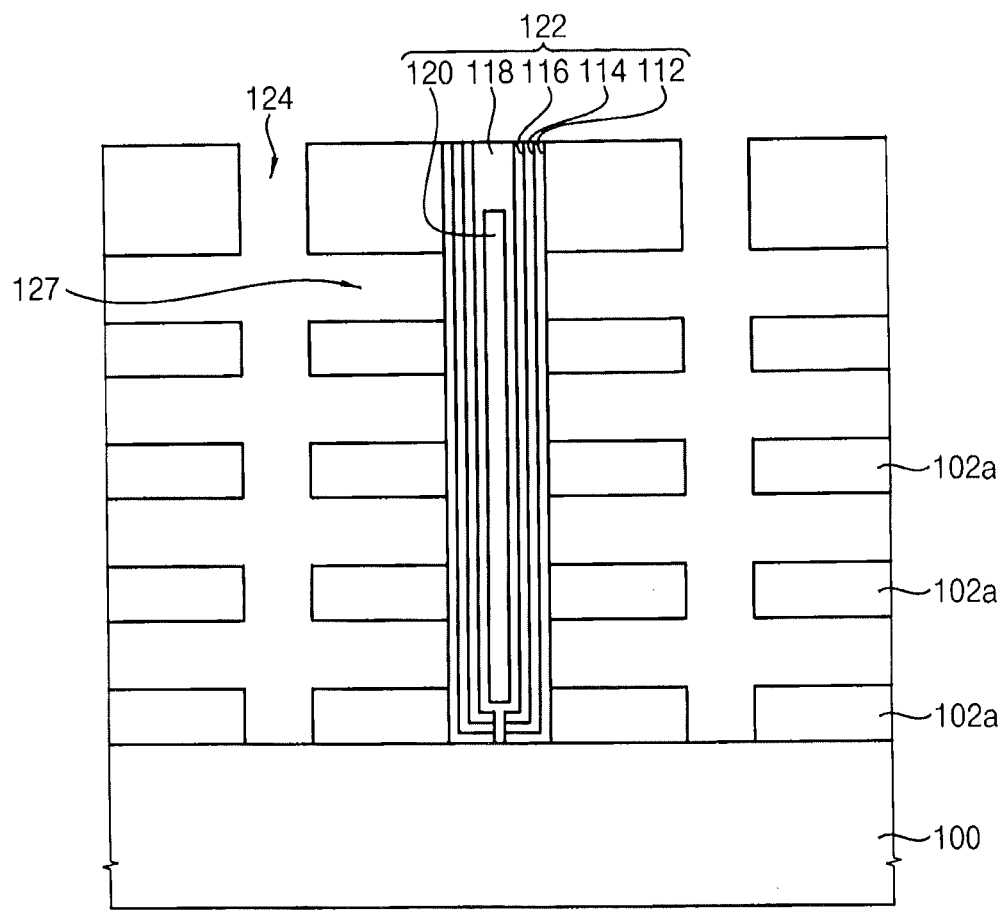

FIGS. 31 and 32 are cross-sectional views illustrating intermediate structures provided in operations of forming the vertical type semiconductor device illustrated in FIG. 26 according to some embodiments of the present inventive concept.

Referring to FIG. 31, first insulating layers 102 and sacrificial layers 145 may be alternately and repeatedly stacked on a substrate 100 to form a stacked structure. The first insulating layer 102 may be formed as an uppermost layer of the stacked structure. The sacrificial layer 145 may be formed by using a material having a high etching selectivity with respect to the first insulating layer 102. In some embodiments, the first insulating layer 102 may be formed by using silicon oxide, and the sacrificial layer 145 may be formed by using silicon nitride.

Then, the first insulating layers 102 and the sacrificial layers 145 may be partially etched to form a plurality of holes 106 exposing the upper surface of the substrate 100 through the first insulating layers 102 and the sacrificial layers 145.

Referring to FIG. 32, a blocking dielectric layer 112, a charge storing layer 114, and a tunnel oxide layer 116 may be formed on the side wall of the holes 106. In addition, a channel pattern 118 may be formed on the tunnel oxide layer 116. Through performing the above-described processes, a pillar structure may be formed in the hole 106. The processes for forming the pillar structure may be the same as or similar to the explanation with reference to FIG. 8.

A first opening portion 124 penetrating the first insulating layers 102 and the sacrificial layers 145 may be formed to expose the upper surface of the substrate 100. The first opening portion 124 may be formed to be extended in the second direction. In addition, a plurality of the opening portions 124 may be formed in parallel in the third direction. Through the above-mentioned processes, first insulating layer patterns 102a and sacrificial layer patterns may be formed.

Through removing the sacrificial layers exposed by the side wall of the first opening portion 124, a first recessed portion 127 exposing the side wall of the pillar structure may be formed.

Then, a first conductive layer filling up the inner portion of the first recessed portion 127 may be formed. Then, the first conductive layer may be partially etched to form a first gate pattern 142a. Through performing the above-mentioned process, the structure as illustrated in FIG. 29 may be formed. That is, the first gate pattern 142a may be disposed in the first recessed portion 127.

Then, the same or similar processes explained with reference to FIG. 30 may be performed to manufacture the vertical type semiconductor device illustrated in FIG. 26.

Figure 33:
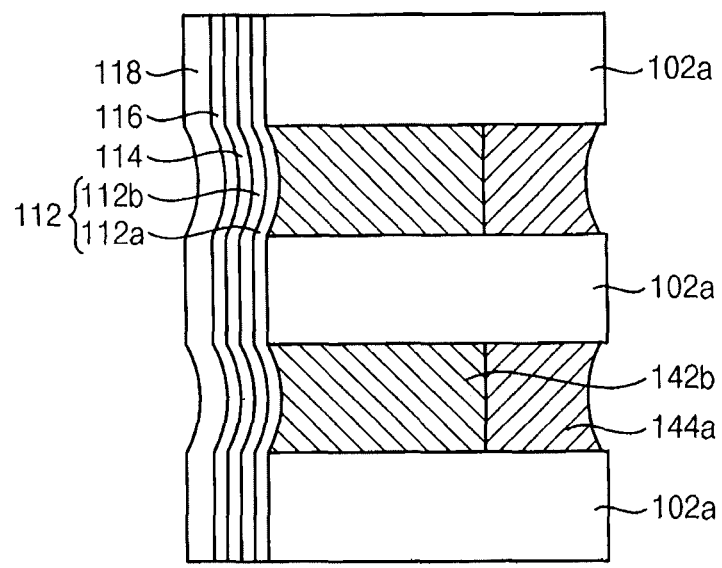
FIGS. 33 and 34 are cross-sectional views illustrating a portion of a vertical type semiconductor device according to some embodiments of the present inventive concept.

FIG. 33 is a cross-sectional view illustrating a portion of a vertical type semiconductor device according to some embodiments of the present inventive concept. The vertical type semiconductor device illustrated in FIG. 33 may have the same or similar stacked structure as the vertical type semiconductor device in FIG. 26. That is, the vertical type semiconductor device illustrated in FIG. 33 may have the same as or similar stacked structure of the vertical type semiconductor device in FIG. 26 except for the shape of the patterns forming the stacked structure.

Referring to FIG. 33, a channel pattern 118 may be provided on the substrate.

On the outer side wall of the channel pattern 118, a tunnel oxide layer 116, a charge storing layer 114, and a blocking dielectric layer 112 may be stacked one by one. The channel pattern 118, the tunnel oxide layer 116, the charge storing layer 114 and the blocking dielectric layer 112 may form one pillar structure. A plurality of gate structures surrounding the pillar structure may be provided.

A contacting portion of the gate structure and the pillar structure may be recessed toward the gate stacking direction. At least one layer of the channel pattern 118, the tunnel oxide layer 116, the charge storing layer 114, and the blocking dielectric layer 112 at the contacting portion with the gate structure may be recessed to the gate stacking direction and may not have a planar surface in the first direction.

The gate structure may have a stacked structure of first and second gate patterns 142b and 144a on the side of the pillar structure. The materials for forming the first and second gate patterns 142b and 144a may be the same as those explained with reference to FIG. 26.

The first gate pattern 142b may have a shape directly contacting the blocking dielectric layer 112 provided at the outer side wall of the pillar structure. The first interface where the first gate pattern 142b and the blocking dielectric layer 112 may make a contact may have an recessed structure toward the side direction along the recessed shape of a pillar structure.

Between the gate structures in the first direction, first insulating layer patterns 102a may be provided. The contacting portion of the first insulating layer pattern 102a with the pillar structure may not be recessed toward the side direction but may have a planar surface in the vertical direction. The first surface of the first gate pattern 142b may have a shape recessed with respect to the side wall of the first insulating layer pattern 102a.

The vertical type semiconductor device illustrated in FIG. 33 may be manufactured by a similar method as that explained with reference to FIGS. 27 to 30. That is, the same or similar processes explained with reference to FIG. 27 may be performed. However, in the forming process of the plurality of the holes 106 in FIG. 27, the first conductive layer 142 may be over etched. Thus, the surface of the first conductive layer 142 exposed by the side wall of the hole may have a shape recessed with respect to the side wall of the first insulating layer pattern 102a.

Then, the same or similar processes explained with reference to FIGS. 28 to 30 may be performed to manufacture the vertical type semiconductor device illustrated in FIG. 33.

FIG. 33 is a cross-sectional view illustrating a portion of a vertical type semiconductor device according to some embodiments of the present inventive concept. The vertical type semiconductor device in FIG. 34 may have the same or similar stacked structure of the vertical type semiconductor device illustrated in FIG. 26. That is, the vertical type semiconductor device illustrated in FIG. 34 may be the same or similar the vertical type semiconductor device illustrated in FIG. 26 except for the shape of the patterns forming the stacked structure.

Figure 34:
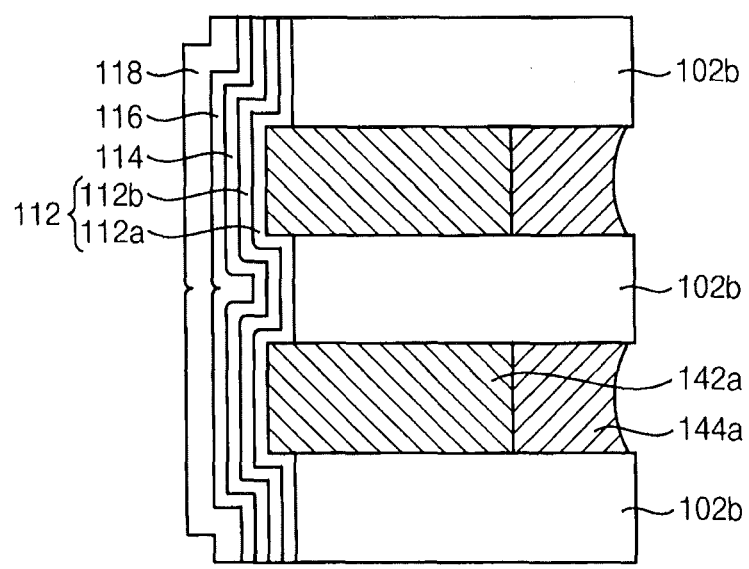

Referring to FIG. 34, a channel pattern 118 may be formed on a substrate. On the outer side wall of the channel pattern 118, a tunnel oxide layer 116, a charge storing layer 114, and a blocking dielectric layer 112 may be stacked one by one. The channel pattern 118, the tunnel oxide layer 116, the charge storing layer 114 and the blocking dielectric layer 112 may form one pillar structure.

In the pillar structure, a contacting portion with the first gate pattern 142a may have a first diameter and a contacting portion with the first insulating layer pattern 102b may have a second diameter greater than the first diameter. Thus, the pillar structure may have a protruded shape toward the side direction at the contacting portion with the first insulating layer pattern 102b.

The gate structure may have a stacked structure of first and second gate patterns 142a and 144a one by one from the side portion of the pillar structure. The materials forming the first and second gate patterns 142a and 144a may be the same as those explained with reference to FIG. 26. Between the gate structures in the first direction, the first insulating layer pattern 102b may be provided.

The first gate pattern 142a may have a shape directly contacting the blocking dielectric layer 112 provided at the outer wide wall of the pillar structure. The first gate pattern 142a may have a protruded shape toward the interior of the pillar structure. That is, the first gate pattern 142a may have a protruded shape toward the pillar structure with respect to the first insulating layer pattern 102b contacting at the upper and lower portions of the first gate pattern 142a. On a surface of the protruded portion of the first gate pattern 142a to the pillar structure, the blocking dielectric layer 112 may be formed.

Figure 35:
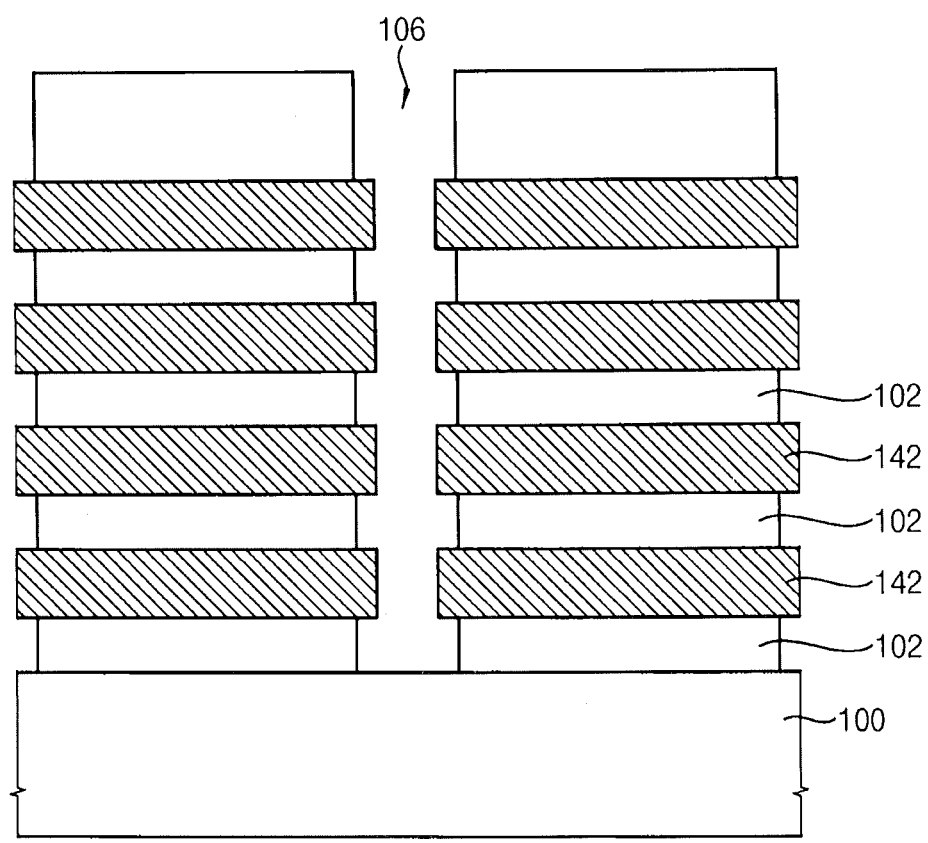
FIG. 35 is a cross-sectional view illustrating an intermediate structure provided in operations of forming the vertical type semiconductor device illustrated in FIG. 34 according to some embodiments of the present inventive concept.

FIG. 35 is a cross-sectional view illustrating an intermediate structure provided in operations of forming the vertical type semiconductor device illustrated in FIG. 34 according to some embodiments of the present inventive concept. The same or similar processes explained with reference to FIG. 27 may be performed to manufacture the structure illustrated in FIG. 27.

Referring to FIG. 35, the first insulating layer 102 exposed by the side wall of the hole 106 may be partially etched so that the first conductive layer 142 may have an protruded shape. Thus, the first conductive layer 142 may be protruded with respect to the first insulating layer 102 in the hole 106.

Then, the same or similar processes explained with reference to FIGS. 28 to 30 may be performed to manufacture the vertical type semiconductor device illustrated in FIG. 35.

Figure 36:
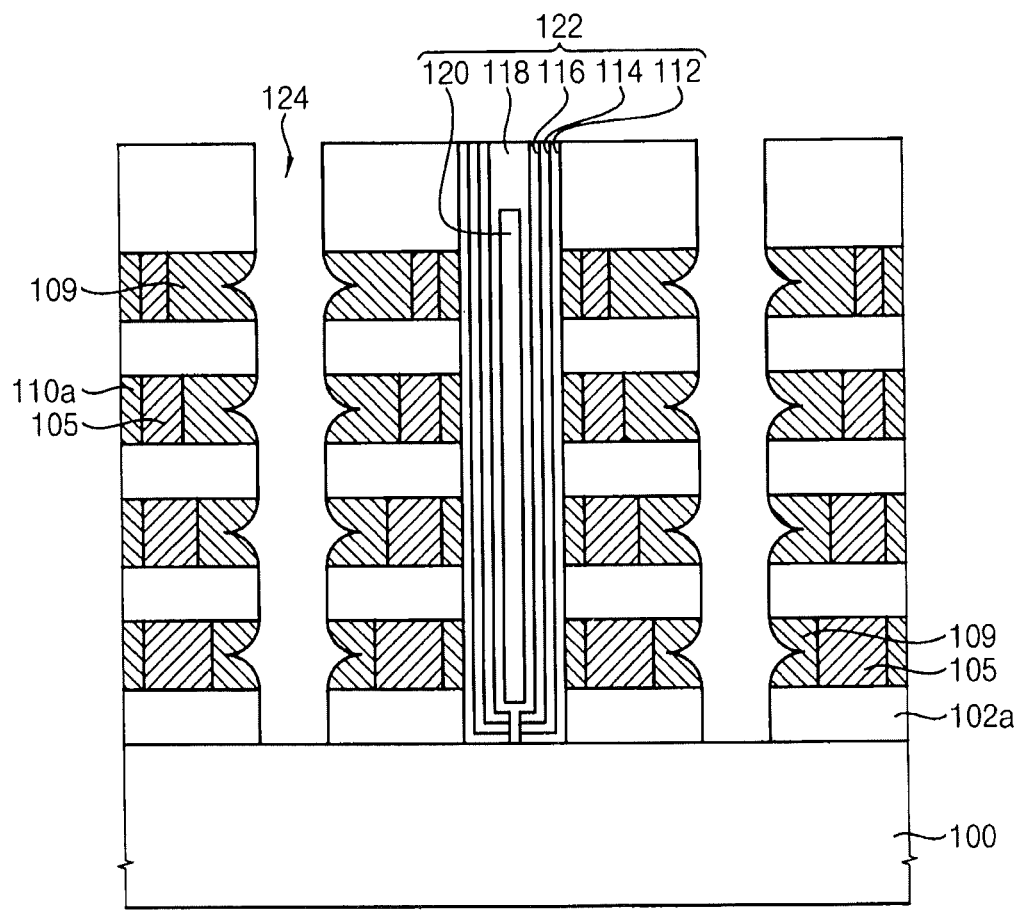
FIG. 36 is a cross-sectional view illustrating a vertical type semiconductor device according to some embodiments of the present inventive concept.

FIG. 36 is a cross-sectional view illustrating a vertical type semiconductor device according to some embodiments of the present inventive concept. In FIG. 36, the same or similar stacked structure of the vertical type semiconductor device illustrated in FIG. 1 may be illustrated. That is, the vertical type semiconductor device illustrated in FIG. 36 may be the same or similar the vertical type semiconductor device illustrated in FIG. 1 except for the shape of patterns forming the stacked structure.

Referring to FIG. 36, a channel pattern 118 may be formed on a substrate. On the outer side wall of the channel pattern 118, a tunnel oxide layer 116, a charge storing layer 114, and a blocking dielectric layer 112 may be stacked one by one. The channel pattern 118, the tunnel oxide layer 116, the charge storing layer 114 and the blocking dielectric layer 112 may form one pillar structure.

A plurality of gate structures on the side of the pillar structure may be provided. The plurality of the gate structures may be spaced apart from each other in a vertical direction and may have a stacked shape. Each of the gate structures may have a line shape surrounding the pillar structure while extending in the second direction.

The gate structures stacked from the substrate 100 in the first direction may be as first to n-th gate structures, wherein n is a natural number greater than 1. In FIG. 36, first to fourth gate structures may be illustrated. Hereinafter, a structure including the first to fourth gate structures will be explained. Each of the gate structures may have a stacked shape of the first to third gate patterns 110a, 105 and 109 in the side direction.

Each of the first gate pattern 110a included in the first to fourth gate structures may have the same or similar length in the third direction.

Each of the second gate patterns 105 included in the first to fourth gate structures may not have the same length in the third direction. A length of each of the second gate patterns 105 may be decreased from the substrate to the upper portion. That is, the length of the second gate pattern 105 included in the first gate structure may be the greatest, and the length of the second gate pattern 105 included in the fourth gate structure may be the smallest.

In FIG. 36, the uppermost forth gate structure may include the second gate pattern 105. In some embodiments, at least one gate structure in the upper portion may not include the second gate pattern 105.

In addition, each of the third gate patterns 109 included in the first to fourth gate structures may not have the same length in the third direction. A length of each of the third gate patterns 109 may be increased from the substrate to the upper portion. That is, the length of the third gate pattern 109 included in the first gate structure may be the smallest, and the length of the third gate pattern 109 included in the fourth gate structure may be the greatest.

However, each of the first to fourth gate structures including a stack of the first to third gate patterns 110a, 105, and 109 may have the same length in the third direction.

As described above, at least one gate structure in the upper portion may not include the second gate pattern 105. In this case, the third gate pattern 109 may be stacked on the first gate pattern 110a in at least one gate structure in the upper portion.

Figure 37:
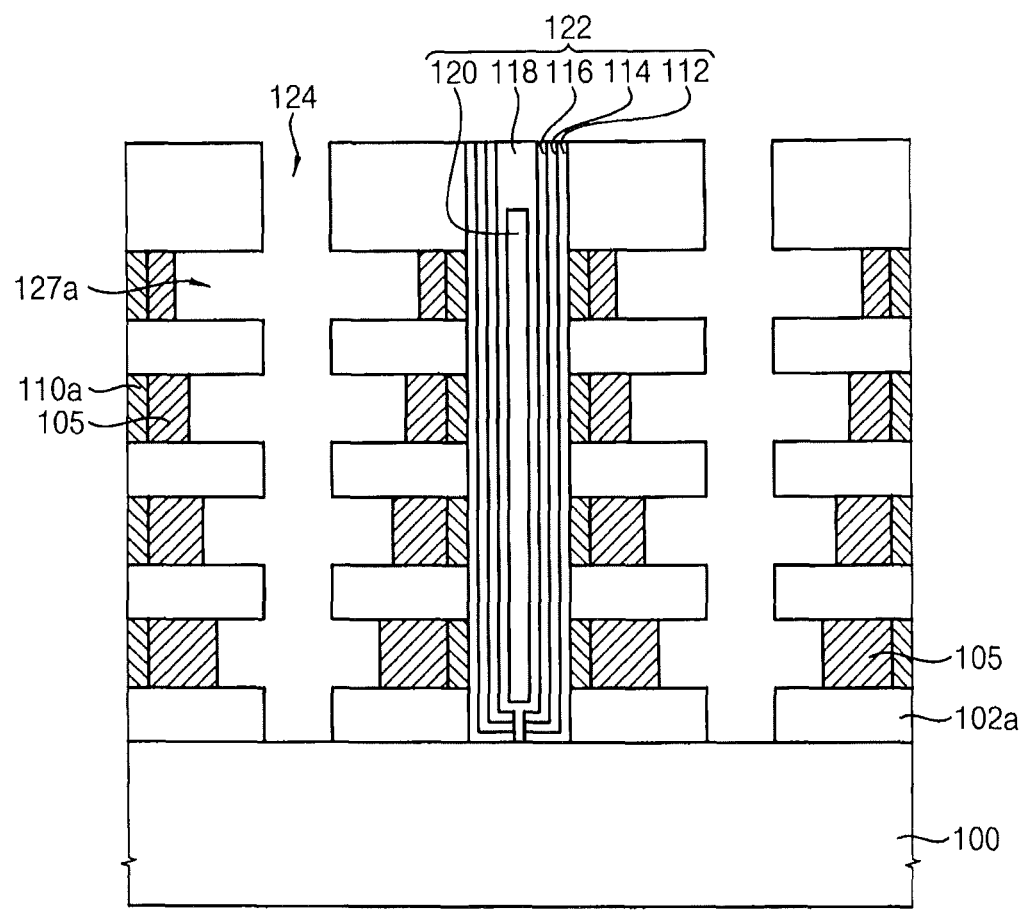
FIG. 37 is a cross-sectional view illustrating an intermediate structure provided in operations of forming the vertical type semiconductor device illustrated in FIG. 36 according to some embodiments of the present inventive concept.

FIG. 37 is a cross-sectional view illustrating an intermediate structure provided in operations of forming the vertical type semiconductor device illustrated in FIG. 36 according to some embodiments of the present inventive concept. The vertical type semiconductor device illustrated in FIG. 36 may be formed by a similar method of manufacturing the vertical type semiconductor device illustrated in FIG. 1.

The same or similar processes explained with reference to FIGS. 5 to 9 may be performed to form the structure illustrated in FIG. 9.

Referring to FIG. 37, the first conductive layer exposed by the side wall of the hole 124 may be partially etched to form a second gate pattern 105. Through the etching process, a first recessed portion 127a connected to the first opening portion 124 may be formed.

While performing the removing process of the first conductive layer, the first conductive layer positioned at the upper portion in the first direction may be etched further than the first conductive layer positioned at the lower portion. Thus, The second gate pattern 105 positioned in the upper portion in the first direction may have a length shorter than a length of the second gate pattern 105 positioned in the lower portion. That is, lengths of each of the second gate patterns 105 in the third direction may increase from the upper portion to the lower portion.

In some embodiments, the first conductive layer positioned in the upper portion may be completely removed. In this case, the gate structure in the upper portion may not include the second gate pattern 105 and only some of the gate structures in the lower portion may include the second gate pattern 105.

Referring to FIG. 36 again, a third conductive layer filling up the first recessed portion 127a may be formed on the second gate pattern 105. The third conductive layer may be formed by using a material having a resistance lower than a resistance of the second conductive layer.

Then, the third conductive layer may be partially removed so that the third conductive layer may remain only in the first recessed portion 127a. Through the above-described processes, the third gate pattern 109 may be formed on the second gate pattern 105.

The third gate pattern 109 positioned in the upper portion in the first direction may have a length in the third direction longer than a length of the third gate pattern 109 positioned in the lower portion. That is, lengths of each of the third gate patterns 109 may decrease from the upper portion to the lower portion.

Through performing the above-described processes, the vertical type semiconductor device illustrated in FIG. 36 may be manufactured.

Figure 38:
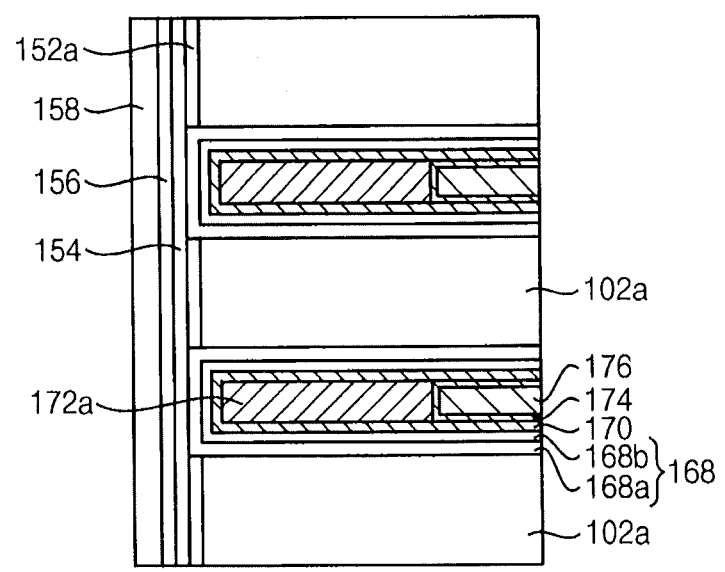
FIG. 38 is a cross-sectional view illustrating a portion of a vertical type semiconductor device according to some embodiments of the present inventive concept.

FIG. 38 is a cross-sectional view illustrating a portion of a vertical type semiconductor device according to some embodiments of the present inventive concept. Referring to FIG. 38, a channel pattern 158 may be formed on a substrate. On the outer side wall of the channel pattern 158, a tunnel oxide layer 156, and a charge storing layer 154 may be stacked one by one. The channel pattern 158, the tunnel oxide layer 156, and the charge storing layer 154 may form one pillar structure.

A plurality of gate structures on the side of the pillar structure may be provided. The gate structure may have a stacked structure of the blocking dielectric layer 168, and the first to fourth gate patterns 170, 172a, 174 and 176 stacked one by one.

Between the gate structures, first insulating layer patterns 102a and a buffer insulating layer pattern 152a may be provided. The gate structures may be insulated from each other by the first insulating layer patterns 102a and the buffer insulating layer pattern 152a.

The blocking dielectric layer 168 may be provided along surfaces of two adjacent the first insulating layer patterns 102a facing to each other, the surface of the buffer insulating layer pattern 152a and the surface of the charge storing layer 154 of the pillar structure. Thus, the blocking dielectric layer 168 may be conformally formed along the surface of a gap portion between the two adjacent first insulating layer pattern 102a. The blocking dielectric layer 168 may include a metal oxide having a high dielectric constant. Particularly, the blocking dielectric layer 168 may have a stacked shape of a silicon oxide layer 168a and a metal oxide layer 168b.

The first gate pattern 170 may be conformally formed on and contact the blocking dielectric layer 168. The first gate pattern 170 may include a metal element such as titanium, tantalum, ruthenium, or tungsten. In some embodiments, the first gate pattern 170 may include a product obtained by the reaction of the metal element with oxygen, carbon or nitrogen.

The second gate pattern 172a may be provided on the first gate pattern 170 and may have a shape filling up a portion of the gap portion between the first insulating layer patterns 102a. The second gate pattern 172a may include conductive silicon or metal material. The second gate pattern 172a may include p-type or n-type doped polysilicon, carbon doped, or polysilicon.

That is, the first and second gate patterns 170 and 172a may include the same conductive material as the first and second gate patterns explained with reference to FIG. 1.

The third gate pattern 174 may be conformally formed along the surface of the first gate pattern 170 and the second gate pattern 172a. The third gate pattern 174 may include a barrier metal material. Examples of the metal materials that may be used for the third gate pattern 174 may include titanium, titanium nitride, tantalum, tantalum nitride, and tungsten nitride. These compounds may be used alone or as a stacked structure of two or more.

The fourth gate pattern 176 may be provided on the third gate pattern 176, and may have a shape filling up the gap portion between the first insulating layer patterns 102a.

The forth gate pattern 176 may include a metal material having a resistance lower than a resistance of the second gate pattern 172a. Examples of the materials that may be used for the fourth gate pattern 176 may include tungsten, cobalt, and nickel. These materials may be used alone or as a stacked structure of two or more.

The width of the stacked structure of the third and fourth gate patterns 174 and 176 in the first direction may be the same as or similar to the width of the second gate pattern 172a in the first direction.

Figure 39:
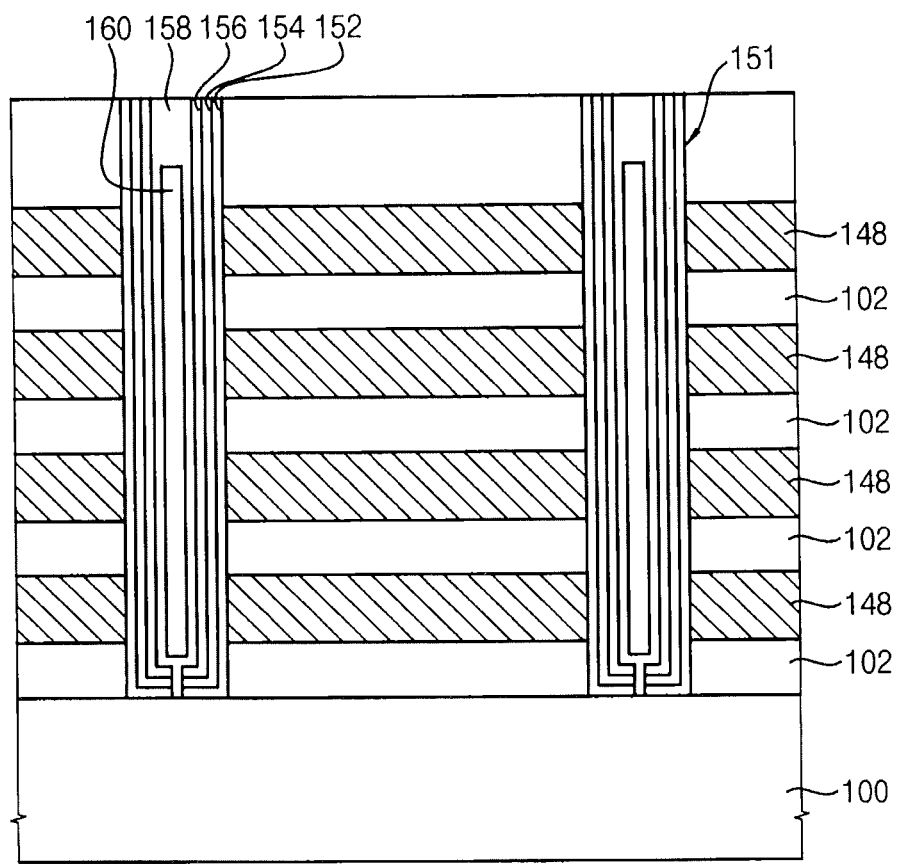
FIGS. 39 to 42 are cross-sectional views illustrating intermediate structures provided in operations of forming the vertical type semiconductor device illustrated in FIG. 38 according to some embodiments of the present inventive concept.

FIGS. 39 to 42 are cross-sectional views illustrating intermediate structures provided in operations of forming the vertical type semiconductor device illustrated in FIG. 38 according to some embodiments of the present inventive concept. Referring to FIG. 39, first insulating layers 102 and sacrificial layers 148 may be alternately and repeatedly stacked on a substrate 100 to form a stacked structure. At the uppermost portion of the stacked structure, the first insulating layer 102 may be formed. In some embodiments, the first insulating layers 102 may include silicon oxide, and the sacrificial layers 148 may include silicon nitride.

The first insulating layers 102 and the sacrificial layers 148 may be partially etched to form a plurality of holes 151 exposing the upper surface of the substrate 100 through the first insulating layers 102 and the sacrificial layers 148.

On the side wall of the holes 151, a buffer insulating layer 152, a charge storing layer 154 and a tunnel oxide layer 156 may be formed one by one. In addition, a channel pattern 158 may be formed on the surface of the tunnel oxide layer 156 and the substrate 100. On the channel pattern 158, an insulating pattern 160 filling up the inner portion of the hole 151 may be formed. Thus, a pillar structure having a stacked structure of the channel pattern 158, the tunnel oxide layer 156 and the charge storing layer 154 one by one may be formed in the hole.

Figure 40:
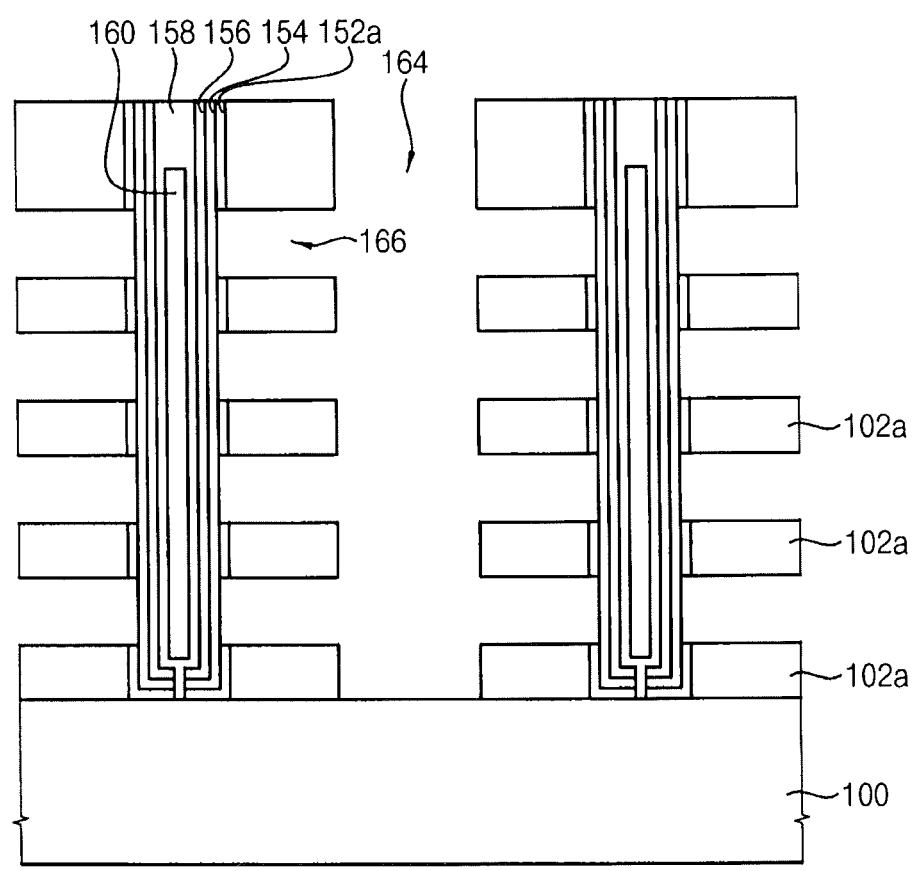

Referring to FIG. 40, a first opening portion 164 penetrating the first insulating layers 102 and the sacrificial layers 148 may be formed to expose the upper surface of the substrate 100. The first opening portion 164 may be formed to be extended in the second direction. In addition, a plurality of the opening portions 164 may be arranged in parallel in the third direction.

Then, the sacrificial layers 148 exposed by the side wall of the first opening portion 164 may be etched to form a first recessed portion 166. In addition, the buffer insulating layer 152 exposed by the first recessed portion 166 may be removed. Thus, as illustrated in the drawings, a buffer insulating layer pattern 152a and a first insulating layer pattern 102a may be formed on the side wall of the pillar structure. In addition, the first recessed portion 166 may be formed between the first insulating layer patterns 102a. The charge storing layer 154 of the pillar structure may be exposed by the first recessed portion 166.

Figure 41:
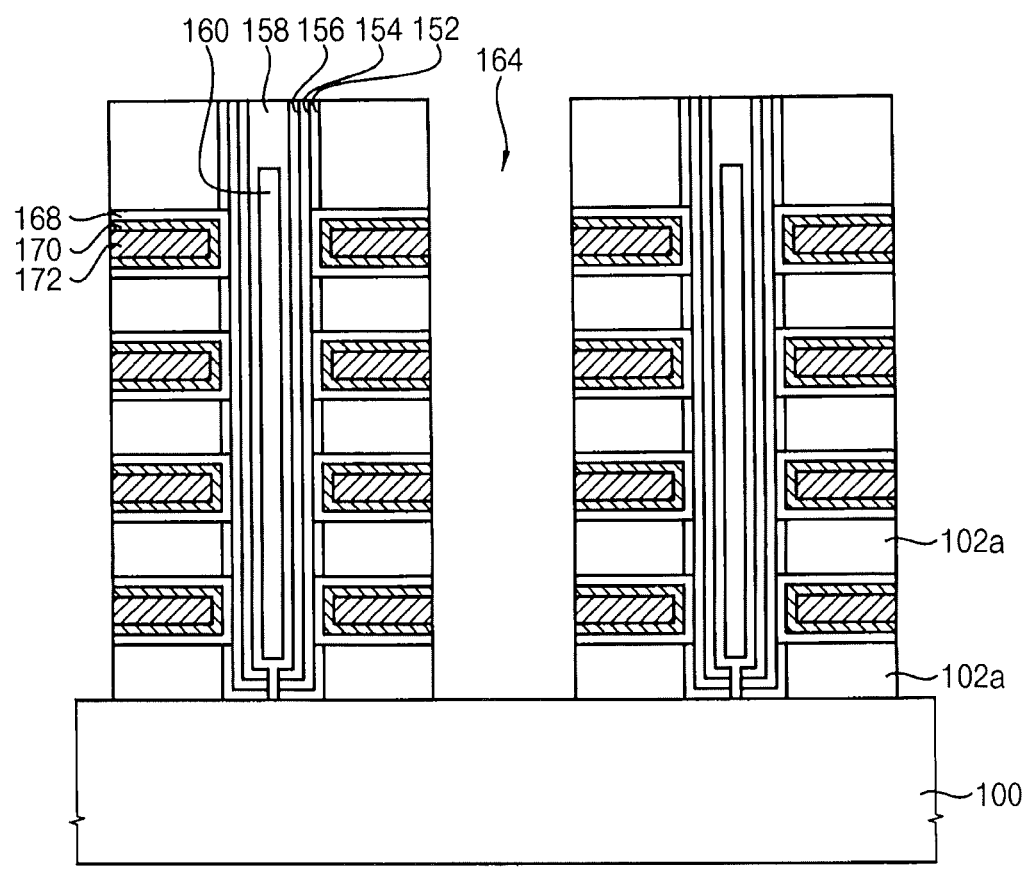

Referring to FIG. 41, a blocking dielectric layer 168 and a first conductive layer may be conformally formed along the inner surface of the first recessed portion 166 and the side wall of the first opening portion. Then, a second conductive layer filling up the first recessed portion may be formed on the first conductive layer.

The first and second conductive layers formed in the first opening portion 164 may be etched so as to leave the first and second conductive layers only in the first recessed portion 166. Through performing the above-described processes, the blocking dielectric layer 168, and the first and second conductive layer patterns 170 and 172 may be formed in the first recessed portion 166. The first conductive layer pattern may be provided as a first gate pattern 170.

Figure 42:
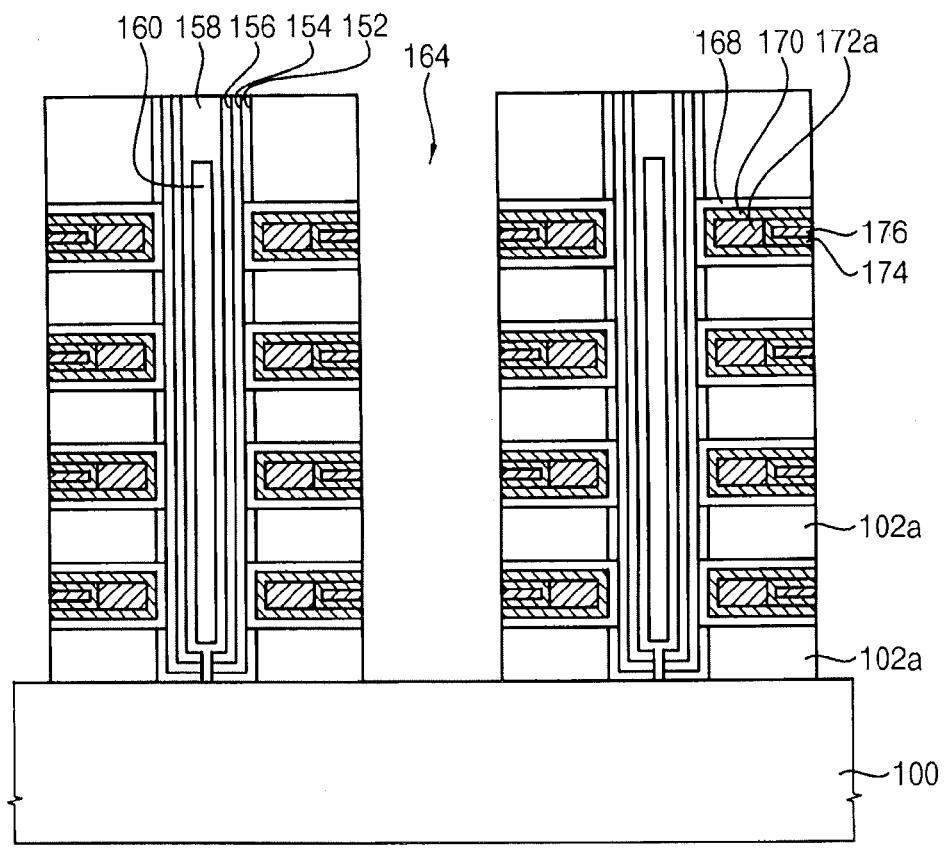

Referring to FIG. 42, the side wall portion of the second conductive layer pattern 172 may be etched to form a second gate pattern 172a partially filling up the inner portion of the first recessed portion 166. Through forming the second gate pattern 172a, a second recessed portion may be formed at the side portion of the second gate pattern 172a.

Then, a third conductive layer may be conformally formed along the surface of the first and second gate patterns 170 and 172a. On the third conductive layer, a fourth conductive layer filling up the inner portion of the second recessed portion may be formed.

Then, the third and fourth conductive layers formed in the first opening portion 164 may be etched so as to leave the third and fourth conductive layers only in the second recessed portion. Through performing the processes, third and fourth gate patterns 174 and 176 may be formed only in the second recessed portion.

Through performing the above-described processes, the vertical type semiconductor device illustrated in FIG. 38 may be formed.

Figure 43:
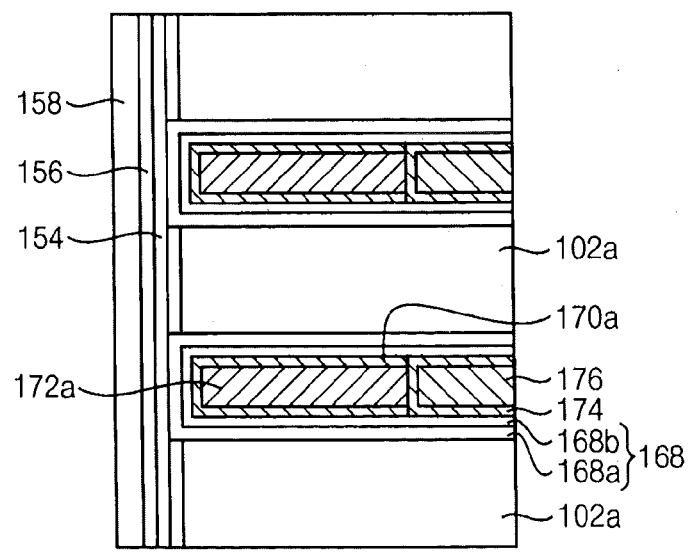
FIGS. 43, 44 and 45 are cross-sectional views illustrating a portion of a vertical type semiconductor device according to some embodiments of the present inventive concept.

FIG. 43 is a cross-sectional illustrating a portion of a vertical type semiconductor device according to some embodiments of the present inventive concept. The vertical type semiconductor device in FIG. 43 may be the same or similar the vertical type semiconductor device illustrated in FIG. 38 except for the shape of a gate pattern included in a gate structure.

Referring to FIG. 43, a plurality of gate structures protruded to the side portion of the pillar structure may be provided. The gate structure may have a stacked structure of a blocking dielectric layer 168, and first to fourth gate patterns 170a, 172a, 174 and 176 one by one on the side of the pillar structure. Each of the first to fourth gate patterns 170a, 172a, 174 and 176 may be formed by using the same material as the first to fourth gate patterns 170a, 172a, 174 and 176 as explained with reference to FIG. 38.

The blocking dielectric layer 168 may have the same or similar shape as explained with reference to FIG. 38.

The first gate pattern 170a may be conformally formed along the surface of a portion of the blocking dielectric layer 168. The second gate pattern 172a may be provided on the first gate pattern 170a and may have a shape partially filling up a gap portion between the first insulating layer patterns 102a. As illustrated in the drawing, the stacked structure of the first and second gate patterns 170a and 172a may have a shape partially filling up a gap portion between the first insulating layer patterns 102a. The third gate pattern 174 may be conformally formed along the surface of the blocking dielectric layer 168, and the first and second gate patterns 170a and 172a. The fourth gate pattern 176 may be provided on the third gate pattern 174 and may have a shape filling up a gap portion between the first insulating layer patterns 102a.

The width of the stacked structure of the third and fourth gate patterns 174 and 176 in the first direction may be the same as or similar to the width of the stacked structure of the first and second gate patterns 170a and 172a in the first direction.

The vertical type semiconductor device illustrated in FIG. 43 may be manufactured by a similar method as that explained with reference to FIGS. 39 to 42.

Through performing the same or similar processes explained with reference to FIGS. 39 to 41, the structure illustrated in FIG. 41 may be formed.

Then, side wall portions of the first and second conductive layer patterns 170 and 172 may be etched to form first and second gate patterns 170a and 172a partially filling up the inner portion of the first recessed portion. Through forming the first and second gate patterns 170a and 172a, a second recessed portion may be formed at the side portion of the second gate pattern 172a. The surface of the blocking dielectric layer 168 may be exposed by the second recessed portion.

Then, the third and fourth gate patterns 174 and 176 may be formed on the blocking dielectric layer 168, and the first and second gate patterns 170a and 172a. Through performing the above-described processes, the vertical type semiconductor device illustrated in FIG. 43 may be manufactured.

Figure 44:
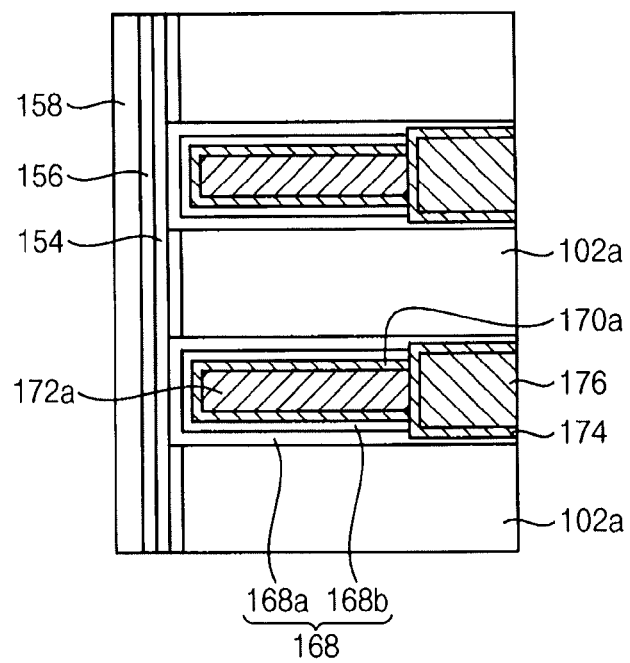

FIG. 44 is a cross-sectional illustrating a portion of a vertical type semiconductor device according to some embodiments of the present inventive concept. The vertical type semiconductor device in FIG. 44 may be the same or similar vertical type semiconductor device illustrated in FIG. 38 except for the shape of a gate pattern included in a gate structure.

Referring to FIG. 44, a plurality of gate structures protruded to the side portion of the pillar structure may be provided. The gate structure may have a stacked structure of a blocking dielectric layer 168, and first to fourth gate patterns 170a, 172a, 174 and 176 one by one on the side of the pillar structure. Each of the first to fourth gate patterns 170a, 172a, 174 and 176 may be formed by using the same material as each of the first to fourth gate patterns explained with reference to FIG. 38.

The blocking dielectric layer 168 may be provided along the surface of a portion of the first insulating layer patterns 102a and the surface of the charge storing layer 154 of the pillar structure. Thus, the blocking dielectric layer 168 may be conformally formed along the surface of a gap portion between the first insulating layer patterns 102a.

The first and second gate patterns 170a and 172a may have the same or similar shape as explained with reference to FIG. 43. That is, the stacked structure of the blocking dielectric layer 168, and the first and second gate patterns 170a and 172a may have a shape partially filling up a gap portion between the first insulating layer patterns. The third gate pattern 174 may be conformally formed along the surface of a portion of the blocking dielectric layer 168 and the surface of the first and second gate patterns 170a and 172a. The fourth gate pattern 176 may be provided on the third gate pattern 174 and may have a shape filling up a gap portion between the first insulating layer patterns.

A second width of the stacked structure of the third and fourth gate patterns 174 and 176 in the first direction may be greater than a first width of the stacked structure of the first and second gate patterns 170a and 172a in the first direction.

The vertical type semiconductor device illustrated in FIG. 44 may be manufactured by a similar method as that explained with reference to FIGS. 39 to 42.

That is, the same or similar processes explained with reference to FIGS. 39 to 41 may be performed to form the structure illustrated in FIG. 41.

Then, side wall portions of the first and second conductive layer patterns 170 and 172 and the blocking dielectric layer 168 may be partially etched to form first and second gate patterns 170a and 172a partially filling up the inner portion of the first recessed portion. Through forming the first and second gate patterns 170a and 172a, a second recessed portion may be formed at the side portion of the second gate pattern 172a. A width of the second recessed portion in the first direction may be greater than a width of the stacked structure of the first and second gate patterns 170a and 172a in the first direction.

Then, third and fourth gate patterns 174 and 176 may be formed on the first and second gate patterns 170a and 172a.

Through performing the above-described processes, the vertical type semiconductor device illustrated in FIG. 44 may be manufactured.

Figure 45:
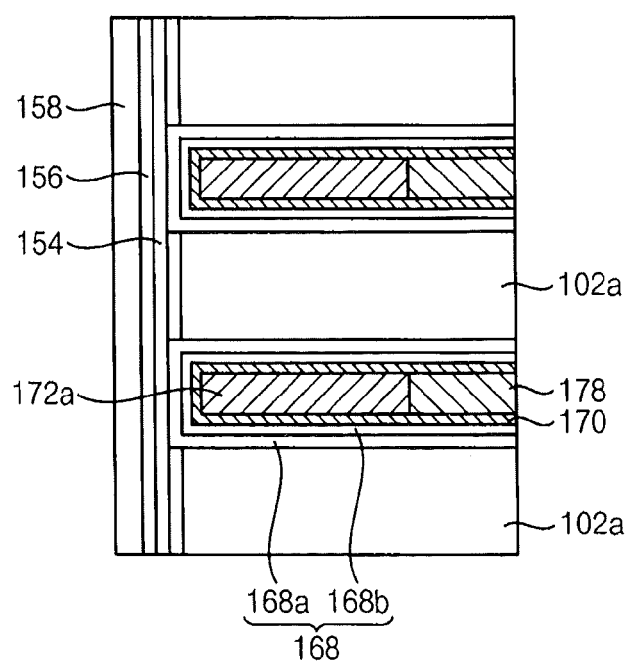
Figure 46:
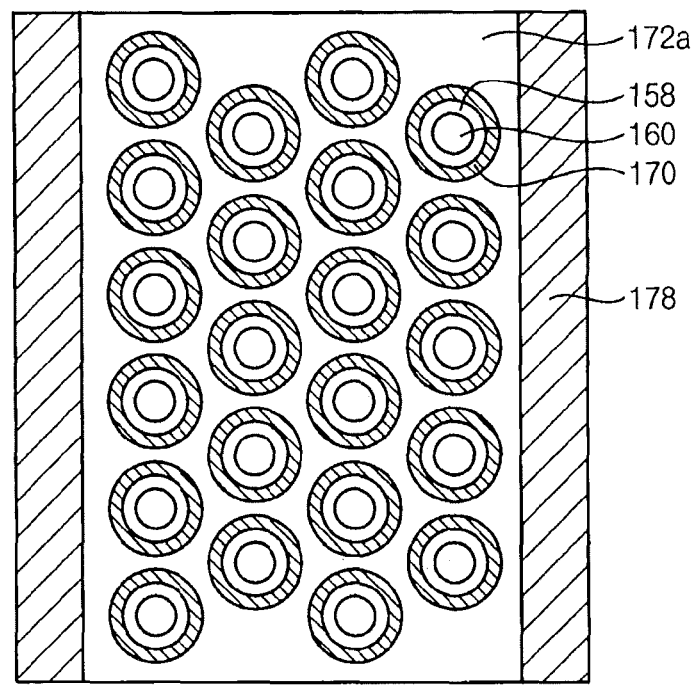
FIG. 46 is a plan view of the vertical type semiconductor device illustrated in FIG. 45.

FIG. 45 is a cross-sectional illustrating a portion of a vertical type semiconductor device according to some embodiments of the present inventive concept. FIG. 46 is a plan view of the vertical type semiconductor device illustrated in FIG. 45. Referring to FIG. 45, a plurality of gate structures on the side portion of the pillar structure may be provided. The gate structure may have a stacked structure of a blocking dielectric layer 168, and first to third gate patterns 170, 172a and 178 one by one on the side of the pillar structure.

The blocking dielectric layer 168 may have the same or similar shape as that explained with reference to FIG. 38. The first gate pattern 170 may be conformally formed along the surface of the blocking dielectric layer 168. The first gate pattern 170 may include a metal element such as titanium, tantalum, ruthenium, or tungsten. In some embodiments, the first gate pattern 170 may include a product obtained through the reaction of the metal element with oxygen, carbon or nitrogen.

The second gate pattern 172a may be provided on the first gate pattern 170 and may have a shape partially filling up a gap portion between the first insulating layer patterns 102a. The second gate pattern 172a may include conductive silicon or metal material. The second gate pattern 172a may include p-type or n-type doped polysilicon or carbon doped polysilicon.

As illustrated in the drawings, the first and second gate patterns 170 and 172a may have the same or similar shape as that explained with reference to FIG. 38.

The third gate pattern 178 may be provided on the first and second gate patterns 170 and 172a and may have a shape filling up a gap portion between the first insulating layer patterns 102a. The third gate pattern 178 may include a metal silicide material. Examples of the metal silicide materials that may be used for the third gate pattern 178 may include nickel silicide, cobalt silicide, and tungsten silicide.

The second and third gate patterns 172a and 178 may have the same or similar width in the first direction.

As illustrated in FIG. 46, one gate structure including the first, second and third gate patterns 170, 172a and 178 may have a shape surrounding four rows of the pillar structures arranged in the third direction.

As illustrated in the drawings, the first gate pattern 170 may have a shape surrounding one of the pillar structures. The second gate pattern 172a may have a shape filling up a space between the four rows of the pillar structures.

In addition, the third gate pattern 178 may be positioned at both edge portions of one gate structure in the third direction. The third gate pattern 178 may be arranged with a distance from the pillar structures. Thus, the third gate pattern 178 may have an extended shape in the second direction.

The vertical type semiconductor device illustrated in FIG. 45 may be manufactured by a similar method as that explained with reference to FIGS. 39 to 42. Through performing the same or similar processes explained with reference to FIGS. 39 to 41, the structure illustrated in FIG. 41 may be formed.

Then, a metal material may be formed on the surface of the second conductive layer pattern 172, and a silicidation process may be performed to form a metal silicide pattern on the second conductive layer pattern 172. Through the silicidation reaction, the second conductive layer pattern 172 may be reacted to form the second gate pattern 172a and a third gate pattern 178 including a metal silicide. Thus, the vertical type semiconductor device illustrated in FIG. 45 may be manufactured.

Figure 47:
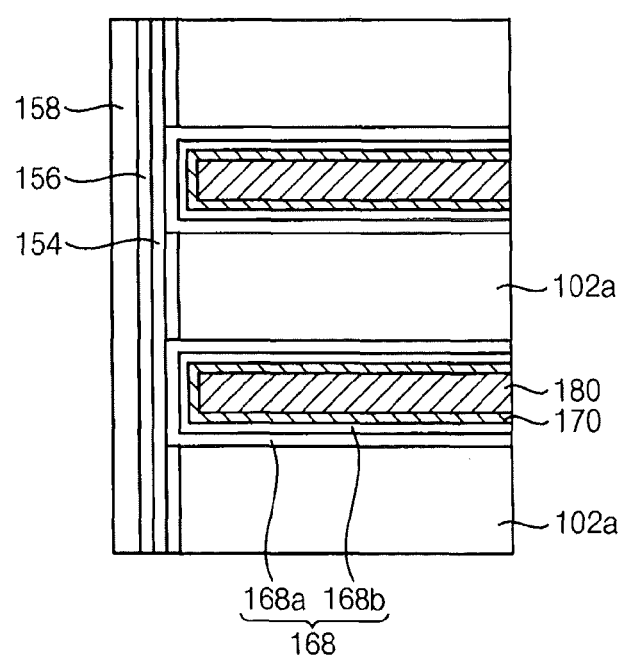
FIG. 47 is a cross-sectional view illustrating a portion of a vertical type semiconductor device according to some embodiments of the present inventive concept.
Figure 48:
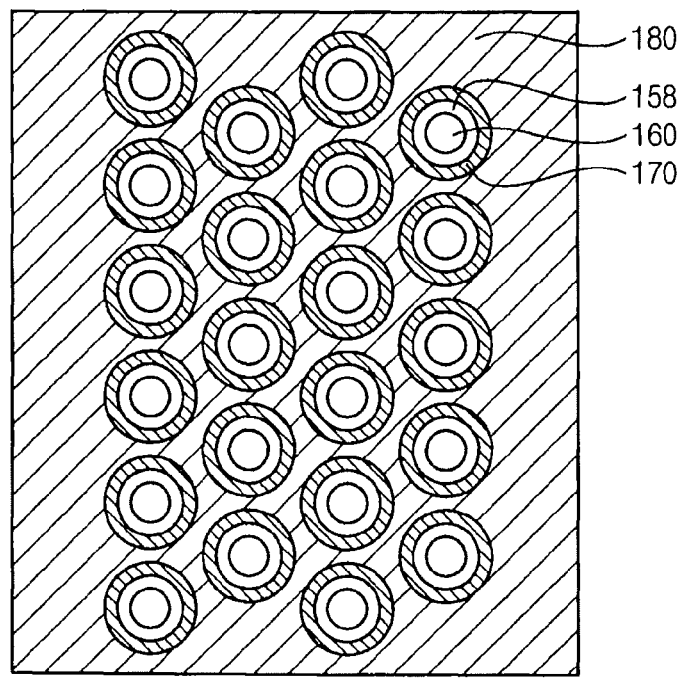
FIG. 48 is a plan view of the vertical type semiconductor device illustrated in FIG. 47.

FIG. 47 is a cross-sectional view illustrating a portion of a vertical type semiconductor device according to some embodiments of the present inventive concept. FIG. 48 is a plan view of the vertical type semiconductor device illustrated in FIG. 47. The vertical type semiconductor device in FIG. 47 may be the same or similar vertical type semiconductor device illustrated in FIG. 45 except for the shape and the stacked structure of a gate structure.

Referring to FIG. 47, a plurality of gate structures on the side portion of the pillar structure may be provided. The gate structure may have a stacked structure of a blocking dielectric layer 168, and first and second gate patterns 170 and 180 one by one on the side of the pillar structure.

The blocking dielectric layer 168 may have the same or similar shape as that explained with reference to FIG. 38.

The first gate pattern 170 may be conformally formed along the surface of the blocking dielectric layer 168. The first gate pattern 170 may include a metal element such as titanium, tantalum, ruthenium, or tungsten. The first gate pattern 170 may include a product obtained through the reaction of the metal element with oxygen, carbon or nitrogen.

The second gate pattern 180 may be provided on the first gate pattern 170 and may have a shape completely filling up a gap portion between the first insulating layer patterns 102a. The second gate pattern 180 may include a metal silicide material. Examples of the metal silicides that may be used for the second gate pattern 180 may include nickel silicide, cobalt silicide, and tungsten silicide.

As illustrated in FIG. 48, one gate structure including the first and second gate patterns 170 and 180 may have a shape surrounding four rows of the pillar structures arranged in the third direction.

As illustrated in the drawing, the first gate pattern 170 may have a shape surrounding one of the pillar structures. The second gate pattern 180 may have an extended line shape while filling up a space between four rows of the pillar structures.

The vertical type semiconductor device illustrated in FIG. 47 may be manufactured by a similar method as that explained with reference to FIGS. 39 to 42. That is, the same or similar processes as explained with reference to FIGS. 39 to 41 may be performed to form the structure illustrated in FIG. 41.

Then, a metal material may be formed on the surface of the second conductive layer pattern 172, and a silicidation process may be performed to silicide the entire second conductive layer pattern 172. Through the silicidation reaction, a second gate pattern 180 including the metal silicide may be formed on the first gate pattern 170. Thus, the vertical type semiconductor device illustrated in FIG. 47 may be manufactured.

Figure 49:
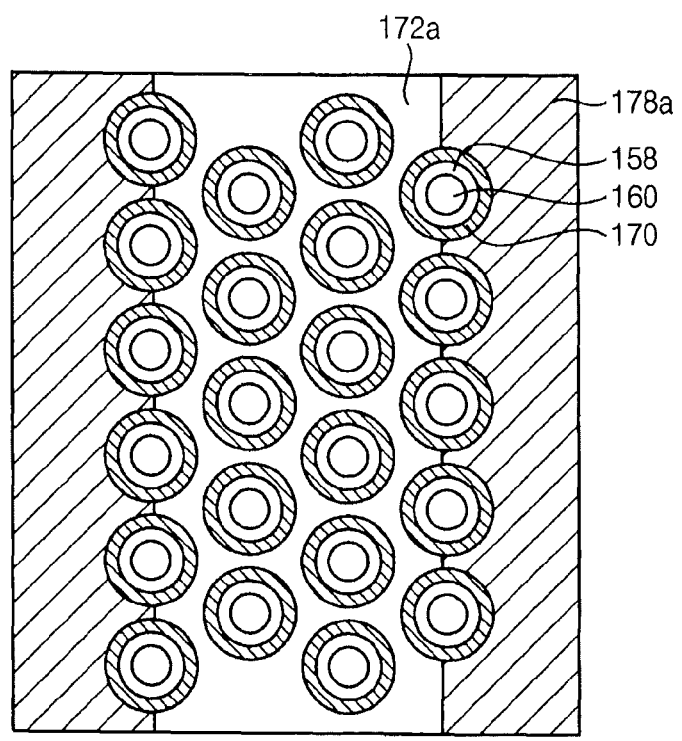
FIGS. 49 and 50 are plan views of a vertical type semiconductor according to some embodiments of the present inventive concept.
Figure 50:
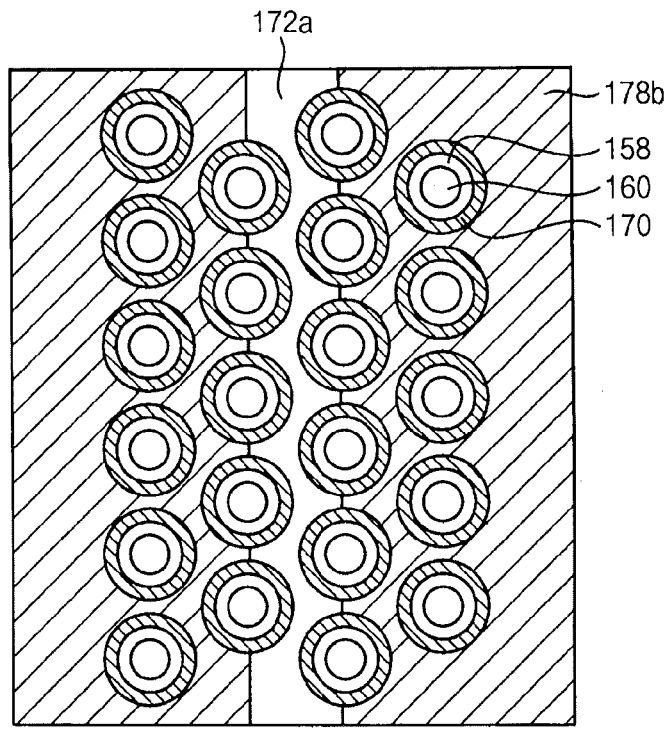

FIGS. 49 and 50 are plan views of a vertical type semiconductor according to some embodiments of the present inventive concept. Each of the vertical type semiconductor devices illustrated in FIGS. 49 and 50 may be the same or similar vertical type semiconductor device illustrated in FIGS. 45 and 46 except for the position of a third gate pattern of a gate structure.

Referring to FIGS. 49 and 50, a plurality of gate structures on the side of a pillar structure may be provided. The gate structure may have a stacked structure of a blocking dielectric layer, and first to third gate patterns 170, 172a and 178a one by one on the side of the pillar structure. The blocking dielectric layer, the first to third gate patterns 170, 172a and 178a may include the same material as that explained with reference to FIG. 45.

As illustrated in the drawings, one gate structure including the first to third gate patterns 170, 172a and 178a may have a shape surrounding a plurality of rows of the pillar structures arranged in the third direction. Particularly, one gate structure may have a shape surrounding four rows of the pillar structures arranged in the third direction.

The blocking dielectric layer 168 may have the same or similar shape as that explained with reference to FIG. 38.

The first gate pattern 170 may have a shape surrounding one of the pillar structures. That is, the first gate pattern 170 may have a hollow shape. The second gate pattern 172a may have a shape filling up a space between the four rows of the pillar structures. The third gate pattern 178a may be positioned at both edge portions of the gate structure in the third direction. In this case, the third gate pattern 178a may be arranged adjacent to at least one pillar structure positioned at both edge portions in the third direction.

In some embodiments, as illustrated in FIG. 49, the third gate pattern 178a may be disposed adjacent to one row of pillar structures positioned at both edge portions in the third direction. Thus, the third gate pattern 178a may have a shape surrounding at least a portion of one row of the pillar structures positioned at both edge portions.

Alternatively, as illustrated in FIG. 50, the third gate pattern 178b may be disposed adjacent to at least two rows of the pillar structures positioned at both edge portions in the third direction. Thus, the third gate pattern may have a shape surrounding at least two rows of the pillar structures positioned at both edge portions.

The vertical type semiconductor devices illustrated in FIGS. 49 and 50 may be manufactured by a similar method as that explained with reference to FIGS. 39 to 42.

That is, the same or similar processes explained with reference to FIGS. 39 to 41 may be performed to form the structure illustrated in FIG. 41.

Then, a metal material may be formed on the surface of the second conductive layer pattern 172, and a silicidation reaction may be performed to form a third conductive layer pattern including a metal silicide. The remaining second conductive layer pattern after performing the silicidation process may become a second gate pattern 172a, and the formed third conductive layer pattern may become third gate patterns 178a and 178b.

In this case, through controlling silicidation process conditions, the third gate pattern 178a may be disposed adjacent to a row of the pillar structures positioned at both edge portions in the third direction to manufacture the vertical type semiconductor device illustrated in FIG. 49. In some embodiments, when the silicidation amount of the second conductive layer pattern 172 increases, the length of the second gate pattern 172a in the third direction may be decreased and the length of the third gate pattern 178b in the third direction may be increased. Thus, the vertical type semiconductor device illustrated in FIG. 50 may be manufactured.

Figure 51:
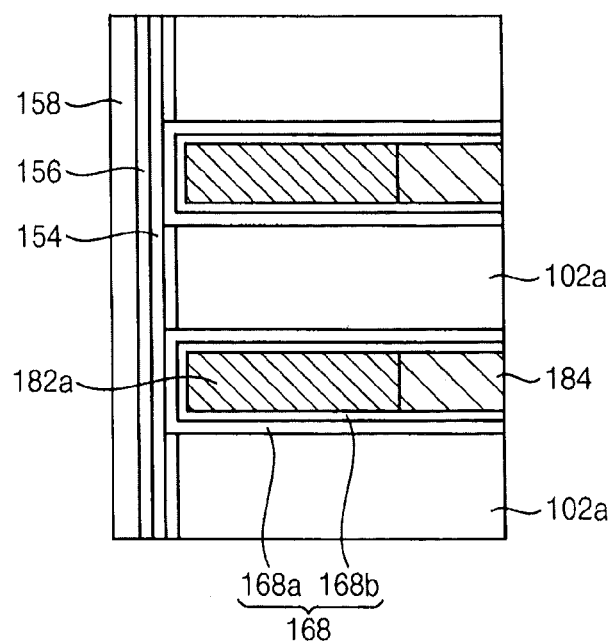
FIG. 51 is a cross-sectional view illustrating a portion of a vertical type semiconductor device according to some embodiments of the present inventive concept.
Figure 52:
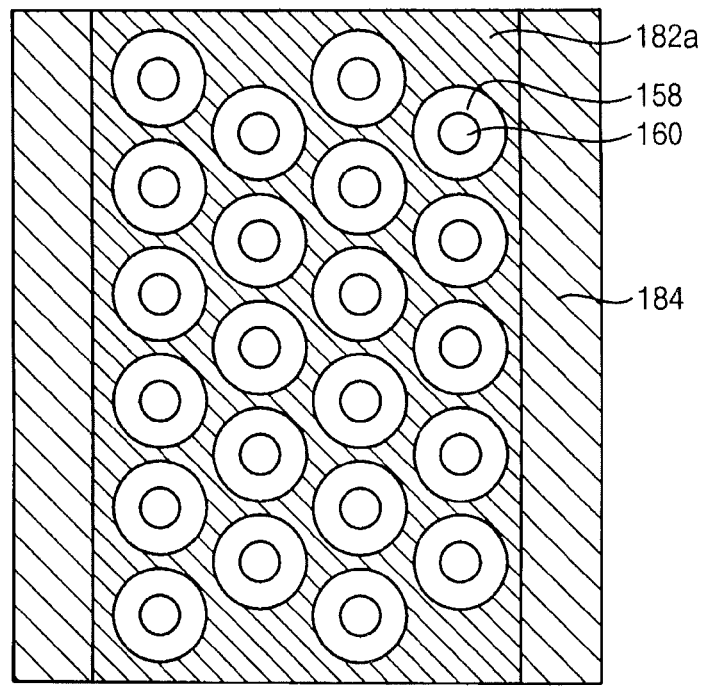
FIG. 52 is a plan view of the vertical type semiconductor device illustrated in FIG. 51.

FIG. 51 is a cross-sectional view illustrating a portion of a vertical type semiconductor device according to some embodiments of the present inventive concept. FIG. 52 is a plan view of the vertical type semiconductor device illustrated in FIG. 51. The vertical type semiconductor device illustrated in FIG. 51 may be the same or similar vertical type semiconductor device illustrated in FIGS. 45 and 46 except for the shape and the stacked structure of a gate structure.

Referring to FIGS. 51 and 52, a plurality of gate structures on the side of a pillar structure may be provided. The gate structure may have a stacked structure of a blocking dielectric layer 168, and first and second gate patterns 182a and 184 one by one on the side of the pillar structure. The material forming the blocking dielectric layer 168 and the first gate pattern 184 may be the same as those explained with reference to FIG. 45.

As illustrated in the drawings, one gate structure including the first and second gate patterns 182a and 184 may have a shape surrounding a plurality of rows of the pillar structures in the third direction. Particularly, one gate structure may have a shape surrounding four rows of the pillar structures arranged in the third direction.

The blocking dielectric layer 168 may have the same or similar shape as that explained with reference to FIG. 38.

The first gate pattern 182a may have a shape filling up a space between the four rows of the pillar structures. The second gate pattern 184 may be positioned at both edge portions of one gate structure. As illustrated in FIG. 52, the second gate pattern 184 may be disposed with a distance from at least one pillar structure positioned at both edge portions in the third direction. The second gate pattern 184 may have an extended line shape in the second direction.

The second gate pattern 184 may include a metal material or a metal silicide material having a resistance lower than that of the first gate pattern 182a. Examples of the materials that may be used for the second gate pattern 184 may include tungsten, tungsten silicide, cobalt, cobalt silicide, nickel, and nickel silicide. These compounds may be used alone or as a stacked structure of two or more. Since the second gate pattern 184 may have a low resistance, the resistance of word lines may be decreased.

The vertical type semiconductor device illustrated in FIGS. 51 and 52 may be manufactured by the following method.

The same or similar processes may be performed as explained with reference to FIGS. 39 and 40 to form the structure illustrated in FIG. 40. Then, a blocking dielectric layer 168 may be formed along the surface of the first recessed portion 166. A first conductive layer completely filling up the inner portion of the first recessed portion 166 may be formed. The first conductive layer may be partially etched to form a first gate pattern 182a partially filling up the inner portion of the first recessed portion 166. Thus, a second recessed portion may be formed at the side portion of the first gate pattern 182a.

Then, a second conductive layer filling up the second recessed portion may be formed on the first gate pattern 182a. The second conductive layer formed in the first opening portion may be etched so as to leave the second conductive layer only in the second recessed portion. Thus, a second gate pattern 184 may be formed at the side portion of the first gate pattern 182a.

Through performing the above-described processes, the vertical type semiconductor device illustrated in FIG. 51 may be manufactured.

Figure 53:
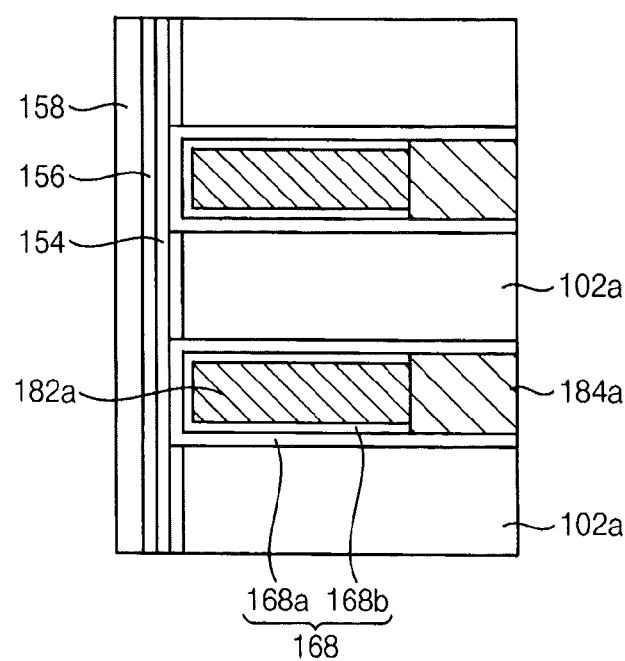
FIGS. 53 and 54 cross-sectional views illustrating a portion of a vertical type semiconductor device according to some embodiments of the present inventive concept.

FIG. 53 is a cross-sectional view illustrating a portion of a vertical type semiconductor device according to some embodiments of the present inventive concept. The vertical type semiconductor device illustrated in FIG. 53 may be the same or similar vertical type semiconductor device illustrated in FIG. 51 except for the shape of a gate pattern included in a gate structure.

Referring to FIG. 53, a plurality of gate structures on the side portion of the pillar structure may be provided. The gate structure may have a stacked structure of a blocking dielectric layer 168, and first and second gate patterns 182a and 184a stacked one by one on the side of the pillar structure. The material forming the blocking dielectric layer 168, and the first and second gate patterns 182a and 184a may be the same as that explained with reference to FIG. 51.

As illustrated in FIG. 52, one gate structure including the first and second gate patterns 182a and 184a may have a shape surrounding a plurality of rows of the pillar structures in the third direction. Particularly, one gate structure may have a shape surrounding four rows of the pillar structures arranged in the third direction.

The blocking dielectric layer 168 may be provided along the surface of the neighboring first insulating layer patterns 102a and the surface of the charge storing layer of the pillar structure. Thus, the blocking dielectric layer 168 may be conformally formed along the surface of a gap portion between the first insulating layer patterns 102a. Thus, the blocking dielectric layer 168 may have a shape surrounding the pillar structure. However, the blocking dielectric layer 168 may expose at least a portion of the surface of a gap portion between the first insulating layer patterns 102a.

The first gate pattern 182a may have a shape filling up a gap portion between four rows of the pillar structures. Similar to the second gate pattern 184 in FIG. 52, the second gate pattern 184a may be positioned at both edge portions of one gate structure. The second gate pattern 184a may be disposed with a distance from at least one pillar structure positioned at both edge portions in the third direction. The second gate pattern 184a may have an extended line shape in the second direction. The second gate pattern 184a may be wider than the width of the first gate pattern 182a in the first direction.

The vertical type semiconductor device illustrated in FIG. 53 may be manufactured by the following method. That is, the same or similar processes as explained with reference to FIGS. 39 and 40 may be performed to form the structure illustrated in FIG. 40.

Then, a blocking dielectric layer 168 may be formed along the surface of the first recessed portion 166. A first conductive layer completely filling up the inner portion of the first recessed portion 166 may be formed. The first conductive layer and the blocking dielectric layer 168 may be partially etched to form a first gate pattern 182a partially filling up the inner portion of the first recessed portion 166. Through the etching process, the blocking dielectric layer may be partially removed. In addition, a second recessed portion may be formed at the side portion of the first gate pattern 182a. Through partially removing the blocking dielectric layer, a first width of the second recessed portion in the first direction may become greater than a second width of the first gate pattern 182a in the first direction.

Then, a second conductive layer filling up the second recessed portion may be formed on the first gate pattern 182a. The second conductive layer formed in the first opening portion 164 may be etched so as to leave the second conductive layer only in the second recessed portion. Thus, a second gate pattern 184a may be formed at the side portion of the first gate pattern 182a.

Through performing the above-described processes, the vertical type semiconductor device illustrated in FIG. 53 may be manufactured.

Figure 54:
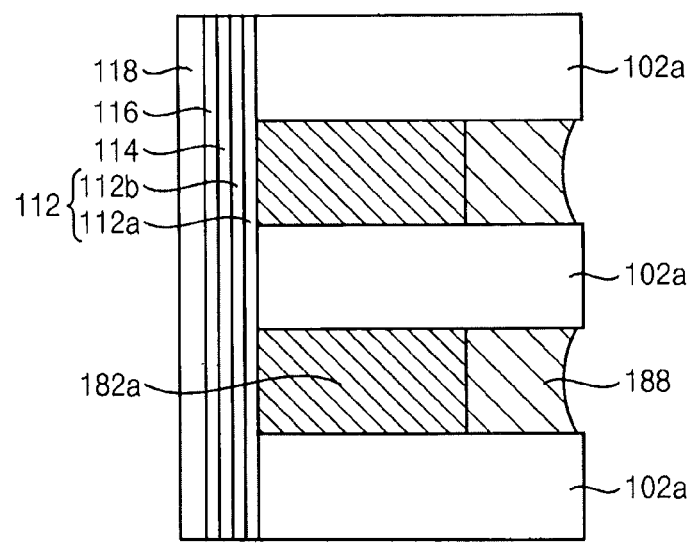

FIG. 54 is a cross-sectional view illustrating a portion of a vertical type semiconductor device according to some embodiments of the present inventive concept. The vertical type semiconductor device illustrated in FIG. 54 may be the same or similar vertical type semiconductor device illustrated in FIG. 26 except for the shape and the stacked structure of a gate structure.

Referring to FIG. 54, a plurality of gate structures on the side of the pillar structure may be provided. The pillar structure may include a channel pattern 118, a tunnel insulating layer 116, a charge storing layer 114 and a blocking dielectric layer 112. The pillar structure may be the same as or similar to the pillar structure explained in FIG. 1.

The gate structure may have a stacked structure of first and second gate patterns 182a and 188 one by one on the side of the pillar structure.

In some embodiments, one gate structure including the first and second gate patterns 182a and 188 may have a shape surrounding a plurality of rows of the pillar structures in the third direction. Particularly, one gate structure may have a shape surrounding four rows of the pillar structures arranged in the third direction.

The first gate pattern 182a may have a shape filling up a gap portion between four rows of the pillar structures. The first gate pattern 182a may include a metal element such as titanium, tantalum, ruthenium, or tungsten. In addition, the first gate pattern 182a may include a product obtained from the reaction of the metal element with oxygen, carbon or nitrogen.

The second gate pattern 188 may be positioned at both edge portions of one gate structure. The second gate pattern 188 may be disposed with a distance from at least one pillar structure positioned at both edge portions in the third direction. The second gate pattern 188 may have an extended line shape in the second direction.

The second gate pattern 188 may include a metal silicide material having a resistance lower than a resistance of the first gate pattern 182a. Examples of the materials that may be used for the second gate pattern 188 may include tungsten silicide, cobalt silicide, and nickel silicide. These compounds may be used alone or as a stacked structure of two or more.

Figure 55:
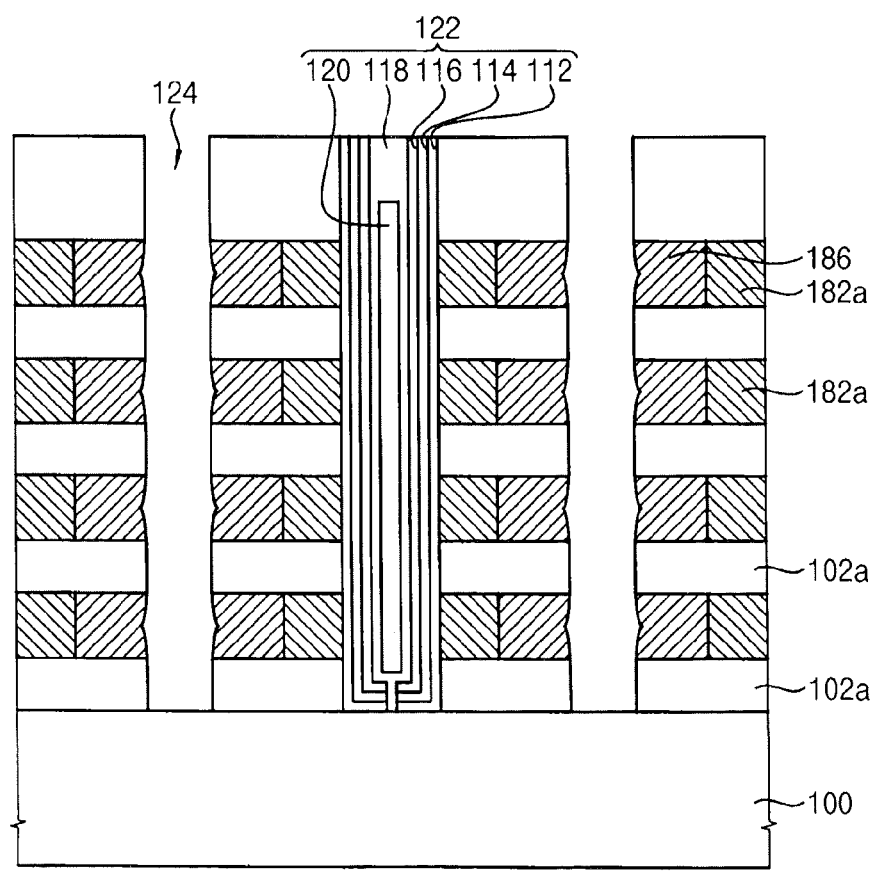
FIGS. 55 and 56 are cross-sectional views illustrating intermediate structures provided in operations of forming the vertical type semiconductor device illustrated in FIG. 54 according to some embodiments of the present inventive concept.
Figure 56:
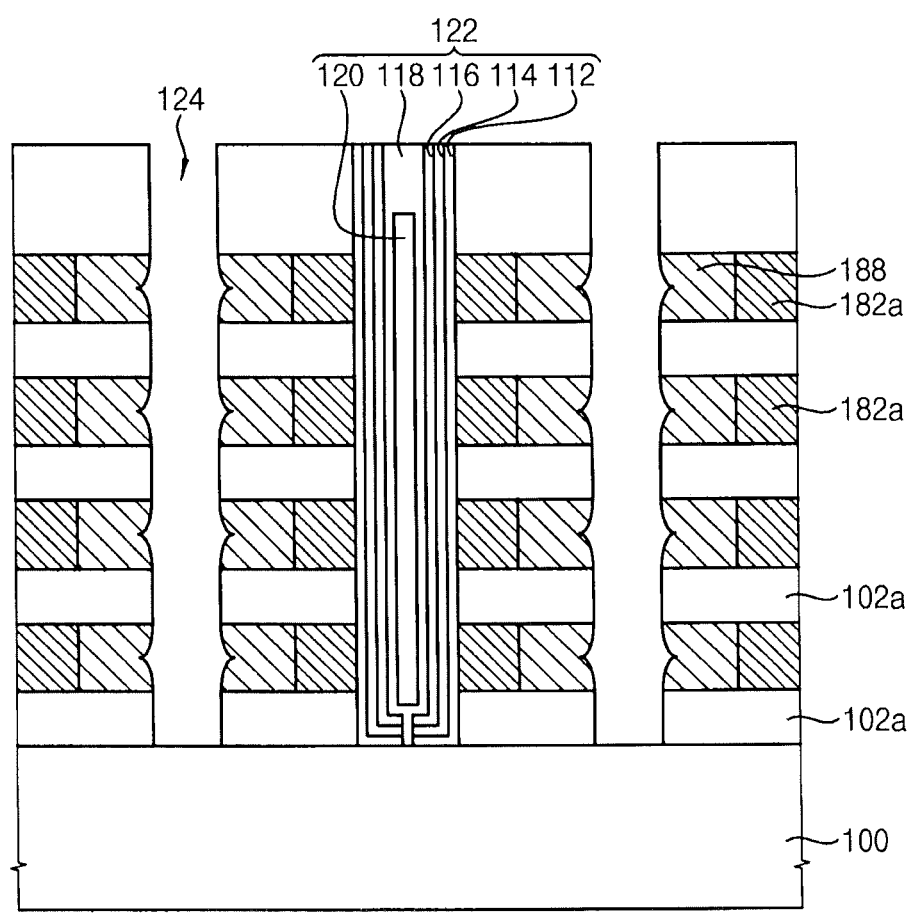

FIGS. 55 and 56 are cross-sectional views illustrating intermediate structures provided in operations of forming the vertical type semiconductor device illustrated in FIG. 54 according to some embodiments of the present inventive concept.

The same or similar processes explained with reference to FIGS. 31 and 32 may be performed to form the structure illustrated in FIG. 32. Then, a first conductive layer may be formed in the first recessed portion 127. The first conductive layer may be partially etched to form a first gate pattern 182a. Through performing the above-described processes, the structure illustrated in FIG. 29 may be formed.

Referring to FIG. 55, a second conductive layer filling up the inner portion of the first recessed portion may be formed on the first gate pattern 182a. The second conductive layer may include a polysilicon material. Then, the second conductive layer formed in the first opening portion may be removed to form a second conductive layer pattern 186.

Referring to FIG. 56, a metal material may be formed on the surface of the second conductive layer pattern 186, and a silicidation process may be performed to form a metal silicide pattern. In this case, the entire second conductive layer pattern 186 may become the metal silicide pattern. Thus, a second gate pattern 188 including the metal silicide may be formed on the first gate pattern 182a.

Figure 57:
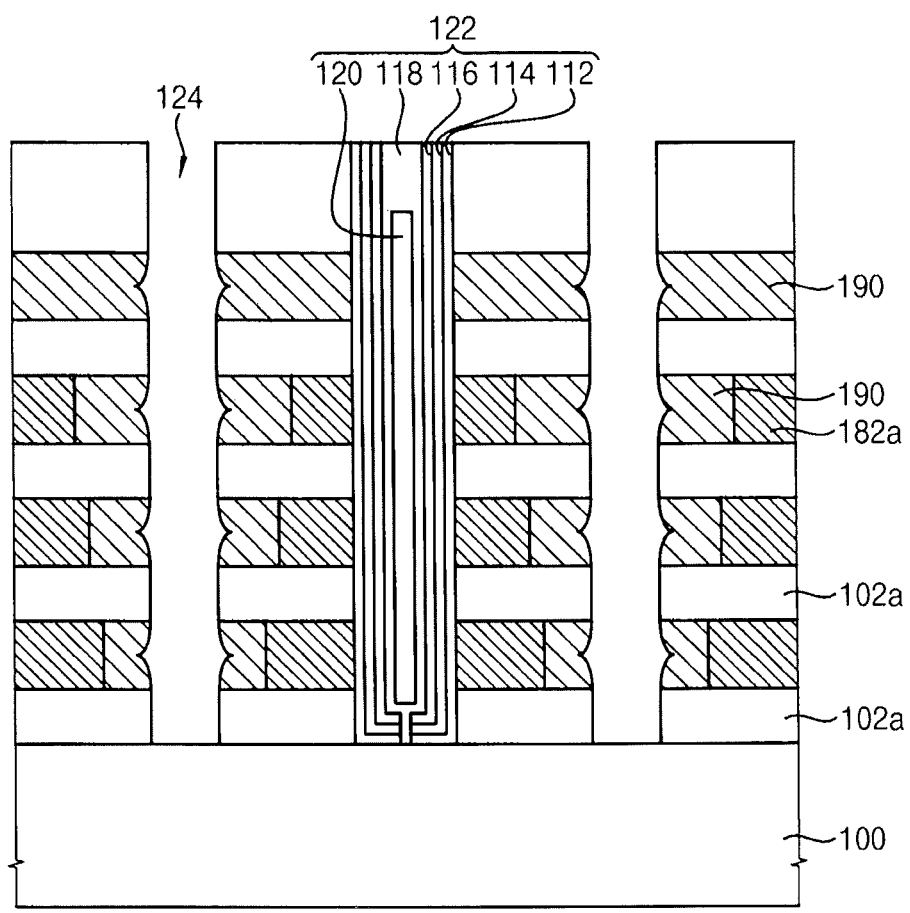
FIG. 57 is a cross-sectional view illustrating a vertical type semiconductor device according to some embodiments of the present inventive concept.

FIG. 57 is a cross-sectional view illustrating a vertical type semiconductor device according to some embodiments of the present inventive concept. The vertical type semiconductor device illustrated in FIG. 57 may be the same or similar vertical type semiconductor device illustrated in FIG. 55 except for the shape and the stacked structure of a gate structure.

Referring to FIG. 57, a plurality of gate structures on the side of the pillar structure may be provided. The pillar structure may include a channel pattern, a tunnel insulating layer, a charge storing layer and a blocking dielectric layer.

The gate structure may have a stacked structure of first and second gate patterns 182a and 190 stacked one by one on the side of the pillar structure. The first gate pattern 182a may include a metal element such as titanium, tantalum, ruthenium, or tungsten. The first gate pattern 182a may include a product obtained from the reaction of the metal element with oxygen, carbon or nitrogen.

The second gate pattern 190 may be positioned at both edge portions of one gate structure. The second gate pattern 190 may include a metal material having a resistance lower than a resistance of the first gate pattern 182a. Examples of the materials that may be used for the second gate pattern 190 may include tungsten, cobalt, and nickel. These compounds may be used alone or as a stacked structure of two or more.

The gate structure stacked from the substrate in the first direction may be called as first to n-th gate structures. First to fourth gate structures are illustrated in FIG. 57. Hereinafter, the gate structure including the first to fourth gate structures will be explained.

Each of the first and second gate patterns 182a and 190 included in the first to fourth gate structures may not have the same length in the third direction.

Lengths of the first gate patterns 182a may decrease from the substrate to the upper portion. That is, the length of the first gate pattern 182a included in the first gate structure may be the greatest, and the length of the first gate pattern 182a included in the fourth gate structure may be the smallest.

As illustrated in FIG. 57, the first gate pattern may not be provided in the uppermost fourth gate structure. In some embodiments, the first gate pattern may be also provided in the uppermost gate structure.

In addition, lengths of the second gate patterns 190 may increase from the substrate to the upper portion. That is, the length of the second gate pattern 182a included in the first gate structure may be the smallest, and the length of the second gate pattern 182a included in the fourth gate structure may be the greatest. As illustrated in FIG. 57, only the second gate pattern 190 may be provided in the uppermost fourth gate structure.

The vertical type semiconductor device illustrated in FIG. 57 may be manufactured by a similar method of manufacturing the vertical type semiconductor device illustrated in FIG. 54.

When the first gate pattern 182a is formed by etching the first conductive layer, the first conductive layer positioned at the upper portion may be etched faster than the first conductive layer positioned at the lower portion. Thus, first gate patterns 182a having different lengths in the third direction according to the position may be formed.

Then, a second gate pattern 190 including a metal material may be formed on the first gate pattern.

Figure 58:
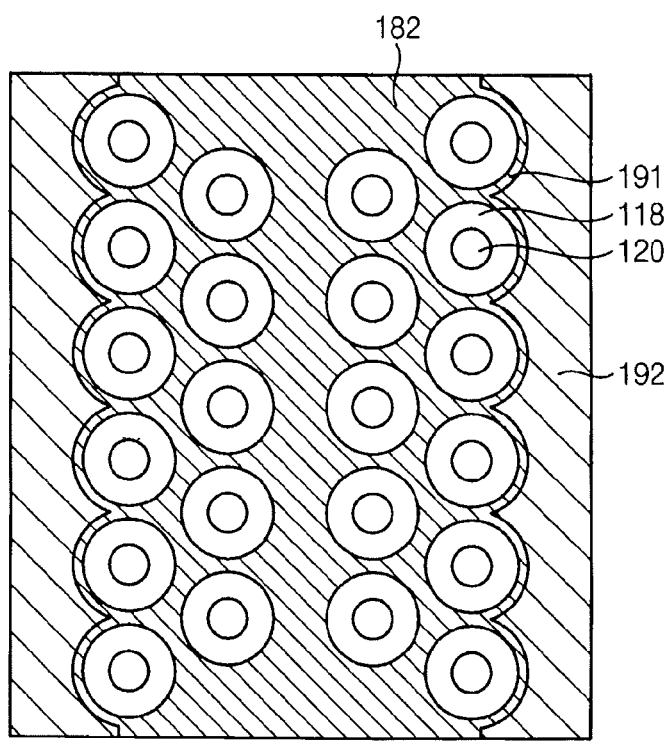
FIGS. 58 to 60 are plan views of a vertical type semiconductor according to some embodiments of the present inventive concept.
Figure 59:
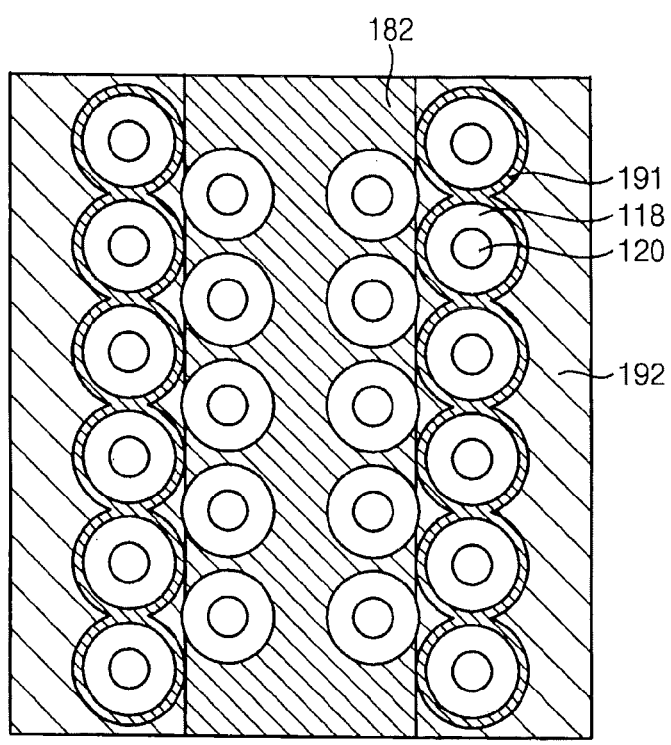
Figure 60:
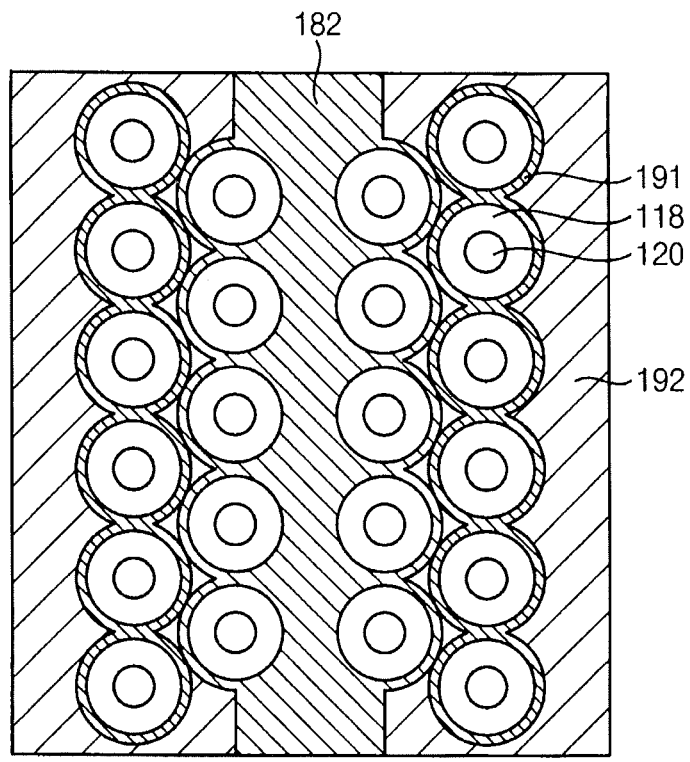

FIGS. 58 to 60 are plan views of a vertical type semiconductor according to some embodiments of the present inventive concept. The vertical type semiconductor device illustrated in FIGS. 58 to 60 may be the same or similar vertical type semiconductor device illustrated in FIG. 26 except for the shape and the stacked structure of a gate structure.

Each of FIGS. 58 to 60 illustrates a vertical type semiconductor device including second gate patterns having different lengths in the third direction. Referring to FIGS. 58 to 60, a plurality of gate structures on the side portion of the pillar structure may be provided. The pillar structure may include a channel pattern, a tunnel insulating layer, a charge storing layer and a blocking dielectric layer.

The gate structure may have a stacked structure of first gate patterns 182 and 191, and a second gate pattern 192 stacked one by one from the side portion of the pillar structure. The materials forming the first and second gate patterns 182, 191 and 192 may be the same as those explained with reference to FIG. 57.

The first gate patterns 182 and 191 may have a shape filling up a gap portion between the pillar structures. In addition, both edge portions of the first gate pattern 182 and 191 may have a shape surrounding at least the side wall of the pillar structure positioned at both edge portions in the third direction.

The second gate pattern 192 may be positioned at both edge portions of one gate structure. The second gate pattern 192 may have a shape surrounding a portion of at least the side wall of the pillar structure positioned at both edge portions in the third direction. That is, one side wall of the second gate pattern 192 may be positioned in the pillar structure positioned at both edge portions in the third direction.

In the semiconductor device illustrated in FIG. 58, both edge portions of the first gate pattern 182 and 191 may have a shape surrounding a portion of the side wall of a row of the pillar structures positioned at both edge portions in the third direction.

With respect to the semiconductor device illustrated in FIG. 59, both edge portions of the first gate pattern 182 and 191 may have a shape surrounding the entire side wall of a row of the pillar structures positioned at both edge portions in the third direction. The first gate pattern formed on the pillar structures positioned at both edge portions in the third direction may have a hollow shape. Thus, the length of the second gate pattern 192 in the third direction may be increased when compared with that in the semiconductor device illustrated in FIG. 52.

With respect to the semiconductor device illustrated in FIG. 60, both edge portions of the first gate pattern 182 and 191 may have a shape completely surrounding the side wall of a row of the pillar structures positioned at both edge portions in the third direction, and surrounding a portion of the side wall of the pillar structures positioned at second rows from both edge portions. Thus, the length of the second gate pattern 192 in the third direction may be increased when compared with that of the semiconductor device illustrated in FIG. 58.

The vertical type semiconductor device illustrated in FIGS. 58 to 60 may be manufactured by a similar method of manufacturing the vertical type semiconductor device illustrated in FIG. 54.

When the first gate pattern 182 and 191 is formed through etching the first conductive layer, the first conductive layer may be etched so as to expose a portion of the blocking dielectric layer of the pillar structure adjacent to the opening portion to form a first recessed portion.

Then, the same conductive material as the first conductive layer may be conformally deposited on the blocking dielectric layer exposed at the first recessed portion to form a second conductive layer. The first and second conductive layers may be used as the first gate patterns 182 and 191.

Then, a second gate pattern 192 including a metal material may be formed on the first gate patterns 182 and 191.

Figure 61:
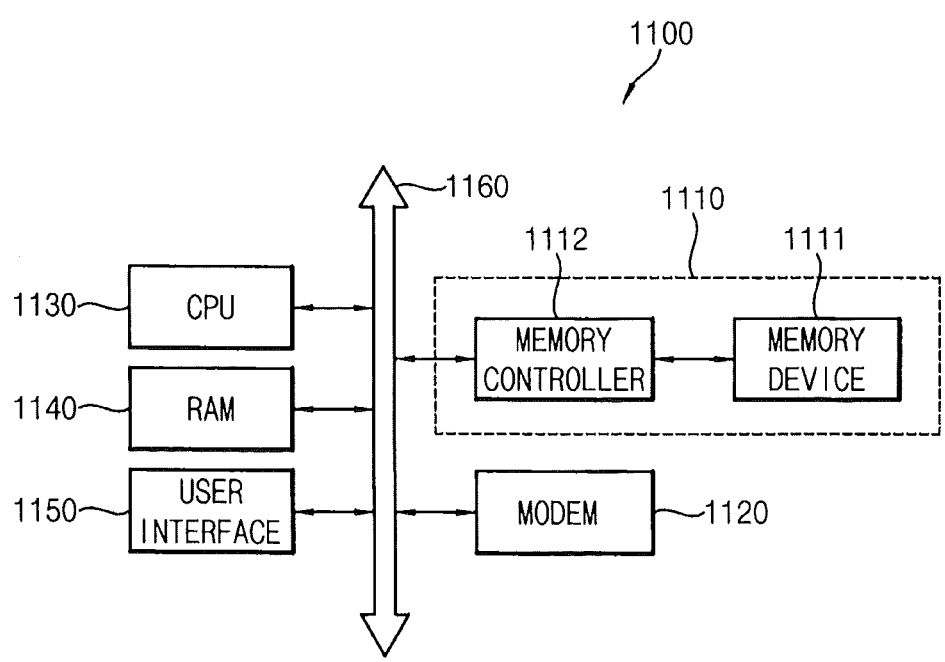
FIG. 61 is a block diagram of an information processing system according to some embodiments of the present inventive concept.

FIG. 61 is a block diagram of an information processing system according to some embodiments of the present inventive concept. Referring to FIG. 61, an information processing system 1100 may include a vertical type nonvolatile memory device 1111 according to some embodiments of the present inventive concept.

The information processing system 1100 may include a memory system 1110, and a modem 1120, a central processing unit 1130, a RAM 1140 and a user interface 1150, respectively connected to a system bus 1160. The memory system 1110 may store processed data by the central processing unit 1130 or input data from exterior. The memory system 1110 may include a vertical type nonvolatile memory device 1111 according to some embodiments of the present inventive concept, and so, the information processing system 1100 may store a large capacity of data stably.

The information processing system 1100 according to some embodiments may further include an application chipset, a camera image processor (CIS), a mobile DRAM, an input/output apparatus, etc.

Some embodiments may be used in a vertical type nonvolatile memory device. Particularly, a vertical type nonvolatile memory device having a low resistance may be manufactured.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description

What is claimed is:

1. A vertical type semiconductor device, comprising:
   a channel pattern extending in a first direction that is perpendicular to an upper surface of a substrate;
   a tunnel insulating layer, a charge storing layer and a blocking dielectric layer sequentially stacked on a sidewall of the channel pattern;
   a first gate pattern stacked on the blocking dielectric layer, the first gate pattern comprising a first metal and having a first resistance;
   a second gate pattern stacked on the first gate pattern, the second gate pattern comprising a second metal and having a second resistance lower than the first resistance; and
   a third gate pattern comprising an impurity doped polysilicon between the first and second gate patterns.

2. The vertical type semiconductor device of claim 1, wherein the first gate pattern comprises a metal element selected from the group consisting of titanium, tantalum, ruthenium and tungsten, or comprises a material comprising at least one product obtained from a reaction of the metal element with oxygen, carbon and/or nitrogen.

3. The vertical type semiconductor device of claim 1, wherein the second gate pattern comprises at least one material selected from the group consisting of tungsten, tungsten silicide, cobalt, cobalt silicide, nickel and nickel silicide.

4. The vertical type semiconductor device of claim 1, wherein the first gate pattern has a first line width in the first direction and the second gate pattern has a second line width in the first direction that is greater than the first line width.

5. The vertical type semiconductor device of claim 1, wherein:

the first gate pattern is one of a plurality of first gate patterns and the second gate pattern is one of a plurality of second gate patterns; and the device further comprises:
a plurality of gate structures on a sidewall of the channel pattern arranged in the first direction, ones of the plurality of gate structures comprising respective ones of the plurality of first gate patterns and respective ones of the plurality of second gate patterns; and
a plurality of insulating layer patterns between two adjacent ones of the plurality of gate structures.

6. The vertical type semiconductor device of claim 5, wherein:
the channel pattern is one of a plurality of the channel patterns; and
ones of the plurality of the gate structures have a line shape extending in a second direction perpendicular to the first direction and surrounding ones of the plurality of channel patterns.

7. The vertical type semiconductor device of claim 6, wherein ones of the plurality of second gate patterns comprise at least two second gate patterns, ones of which are disposed adjacent respective edge portions of ones of the plurality of gate structures in a third direction that is perpendicular to the second direction.

8. The vertical type semiconductor device of claim 6, wherein ones of the plurality of first gate patterns have a hollow shape, when viewed from a plan perspective, surrounding respective ones of the plurality of channel patterns.

9. The vertical type semiconductor device of claim 6, wherein ones of the plurality of first gate patterns surround at least two of the plurality of the channel patterns while filling a space between the at least two of the plurality of the channel patterns.

10. The vertical type semiconductor device of claim 1, wherein the tunnel insulating layer has a first dielectric constant and the blocking dielectric layer comprises a metal oxide having a second dielectric constant higher than the first dielectric constant.

11. The vertical type semiconductor device of claim 1, wherein the first gate pattern contacts the blocking dielectric layer.

12. The vertical type semiconductor device of claim 1, wherein a stacked structure of the channel pattern, the tunnel insulating layer and the charge storing layer comprises a pillar shape.

13. The vertical type semiconductor device of claim 12, wherein the blocking dielectric layer extends on an upper surface, a lower surface and a sidewall of the first gate pattern.

14. The vertical type semiconductor device of claim 1, wherein a stacked structure of the channel pattern, the tunnel insulating layer, the charge storing layer and the blocking dielectric layer comprises a pillar shape.

15. A vertical integrated circuit device, comprising:
a channel pattern extending in a first direction on a substrate;
a first electrode pattern enclosing the channel pattern, the first electrode pattern comprising a first metal and having a first resistance;
a second electrode pattern on and electrically connected to the first electrode pattern, the second electrode pattern comprising a second metal and having a second resistance lower than the first resistance; and
a third electrode pattern between the first and second electrode patterns, the third electrode pattern comprising doped silicon.

16. The vertical integrated circuit device of claim 15, wherein:
the channel pattern is one of a plurality of channel patterns arranged in a second direction perpendicular to the first direction;
the first electrode pattern is one of a plurality of first electrode patterns enclosing respective ones of the plurality of channel patterns; and
the third electrode pattern contacts at least two of the plurality of first electrode patterns.

17. The vertical integrated circuit device of claim 16, wherein the second electrode pattern extends in the second direction and overlaps the at least two of the plurality of first electrode patterns.

18. The vertical integrated circuit device of claim 15, wherein:
the channel pattern is one of a plurality of channel patterns arranged in a second direction perpendicular to the first direction; and
the second electrode pattern extends in the second direction and overlaps at least two of the plurality of channel patterns.

* * * * *